United States Patent
Lue

(10) Patent No.: US 9,520,485 B2
(45) Date of Patent: *Dec. 13, 2016

(54) 3D INDEPENDENT DOUBLE GATE FLASH MEMORY ON BOUNDED CONDUCTOR LAYER

(71) Applicant: MACRONIX INTERNATIONAL CO., LTD., Hsinchu (TW)

(72) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/460,328

(22) Filed: Aug. 14, 2014

(65) Prior Publication Data

US 2015/0340371 A1 Nov. 26, 2015

Related U.S. Application Data

(63) Continuation-in-part of application No. 14/284,306, filed on May 21, 2014, now Pat. No. 9,397,110.

(51) Int. Cl.
*H01L 27/115* (2006.01)
*H01L 29/66* (2006.01)
(Continued)

(52) U.S. Cl.
CPC ......... *H01L 29/66833* (2013.01); *G11C 16/10* (2013.01); *H01L 21/28282* (2013.01);
(Continued)

(58) Field of Classification Search
CPC .............. H01L 29/66833; H01L 29/66666; H01L 29/792; H01L 29/7926; H01L 27/11563; H01L 27/11514; H01L 27/11551; H01L 27/11578
See application file for complete search history.

(56) References Cited

U.S. PATENT DOCUMENTS 7,714,377 B2  5/2010  Specht et al.
7,906,818 B2  3/2011  Pekny
(Continued)

FOREIGN PATENT DOCUMENTS

JP    2011060991 A    3/2011
JP    2011514013 A    4/2011
(Continued)

OTHER PUBLICATIONS

Arya, Pranav, "3D Nand Flash Memory," IEE5008 Memory Systems,—Autumn 2012, 43 pages. In accordance with MPEP 609.04 (a), the year of this publication is sufficiently earlier than the effective U.S. filing date, Sep. 24, 2010, so that the particular month oh publication is not an issue. See MPEP 609.04 (a).

(Continued)

*Primary Examiner* — Phat X Cao
(74) *Attorney, Agent, or Firm* — Yiding Wu; Haynes Beffel & Wolfeld LLP

(57) ABSTRACT

A memory device configurable for independent double gate cells, storing multiple bits per cell, includes multilayer stacks of conductive strips configured as word lines. Active pillars are disposed between pairs of first and second stacks, each active pillar comprising a vertical channel structure extending from an underlying bounded conductor layer, a charge storage layer and an insulating layer. The insulating layer in a frustum of an active pillar contacts a first arcuate edge of a first conductive strip in a layer of the first stack and a second arcuate edge of a second conductive strip in a same layer of the second stack. The conductive strips can comprise a metal. The active pillar can be generally elliptical with a major axis parallel with the first and second conductive strips.

18 Claims, 42 Drawing Sheets

(51) Int. Cl.
*H01L 29/423* (2006.01)
*H01L 21/28* (2006.01)
*H01L 27/02* (2006.01)
*G11C 16/10* (2006.01)
*G11C 11/56* (2006.01)
*G11C 16/04* (2006.01)

(52) U.S. Cl.
CPC .... *H01L 27/0207* (2013.01); *H01L 27/11514* (2013.01); *H01L 27/11551* (2013.01); *H01L 27/11578* (2013.01); *H01L 27/11582* (2013.01); *H01L 29/42392* (2013.01); *H01L 29/66* (2013.01); *G11C 11/5671* (2013.01); *G11C 16/0466* (2013.01); *G11C 16/0483* (2013.01)

(56) References Cited

U.S. PATENT DOCUMENTS

| | | | |
|---|---|---|---|
| 8,013,383 | B2 | 9/2011 | Kidoh et al. |
| 8,163,616 | B2 * | 4/2012 | Kang .................. H01L 27/115 257/326 |
| 8,203,187 | B2 * | 6/2012 | Lung .................. G11C 16/0458 257/197 |
| 8,208,279 | B2 | 6/2012 | Lue |
| 8,363,476 | B2 | 1/2013 | Lue et al. |
| 8,437,192 | B2 | 5/2013 | Lung et al. |
| 8,467,219 | B2 | 6/2013 | Lue |
| 8,625,322 | B2 | 1/2014 | Samachisa et al. |
| 8,644,077 | B2 | 2/2014 | Lue et al. |
| 8,674,426 | B2 | 3/2014 | Higuchi et al. |
| 8,681,555 | B2 | 3/2014 | Liu |
| 8,853,818 | B2 | 10/2014 | Lue |
| 8,900,984 | B2 | 12/2014 | Nakao et al. |
| 8,917,557 | B2 | 12/2014 | Sakaguchi et al. |
| 9,147,468 | B1 * | 9/2015 | Lue .................... G11C 11/5671 |
| 2009/0184360 | A1 | 7/2009 | Jin et al. |
| 2010/0020617 | A1 | 1/2010 | Oh et al. |
| 2010/0155818 | A1 * | 6/2010 | Cho .................. H01L 27/11578 257/324 |
| 2011/0175157 | A1 * | 7/2011 | Sekine .............. H01L 21/28282 257/324 |
| 2011/0298037 | A1 | 12/2011 | Choe et al. |
| 2012/0068241 | A1 | 3/2012 | Sakuma et al. |
| 2012/0182806 | A1 | 7/2012 | Chen et al. |
| 2012/0299086 | A1 | 11/2012 | Lee |
| 2013/0313627 | A1 | 11/2013 | Lee et al. |
| 2014/0001530 | A1 | 1/2014 | Song |
| 2014/0198570 | A1 | 7/2014 | Hsieh et al. |
| 2014/0231954 | A1 | 8/2014 | Lue |
| 2014/0239376 | A1 * | 8/2014 | Zhang ................ H01L 29/7827 257/324 |
| 2016/0197093 | A1 | 7/2016 | Omura |

FOREIGN PATENT DOCUMENTS

| | | |
|---|---|---|
| JP | 2011165815 A | 8/2011 |
| JP | 2013008712 A | 1/2013 |
| KR | 1020100074543 | 7/2010 |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.

Choi et al., "3D approaches for non-volatile memory", 2011 Symposium on VLSI Technology, Digest of Technical Papers, pp. 178-179, Jun. 14-16, 2011.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf, 29 pages.

JP Office Action in family member Application No. 2015-044848 dated Jul. 26, 2016, 10 pages.

* cited by examiner

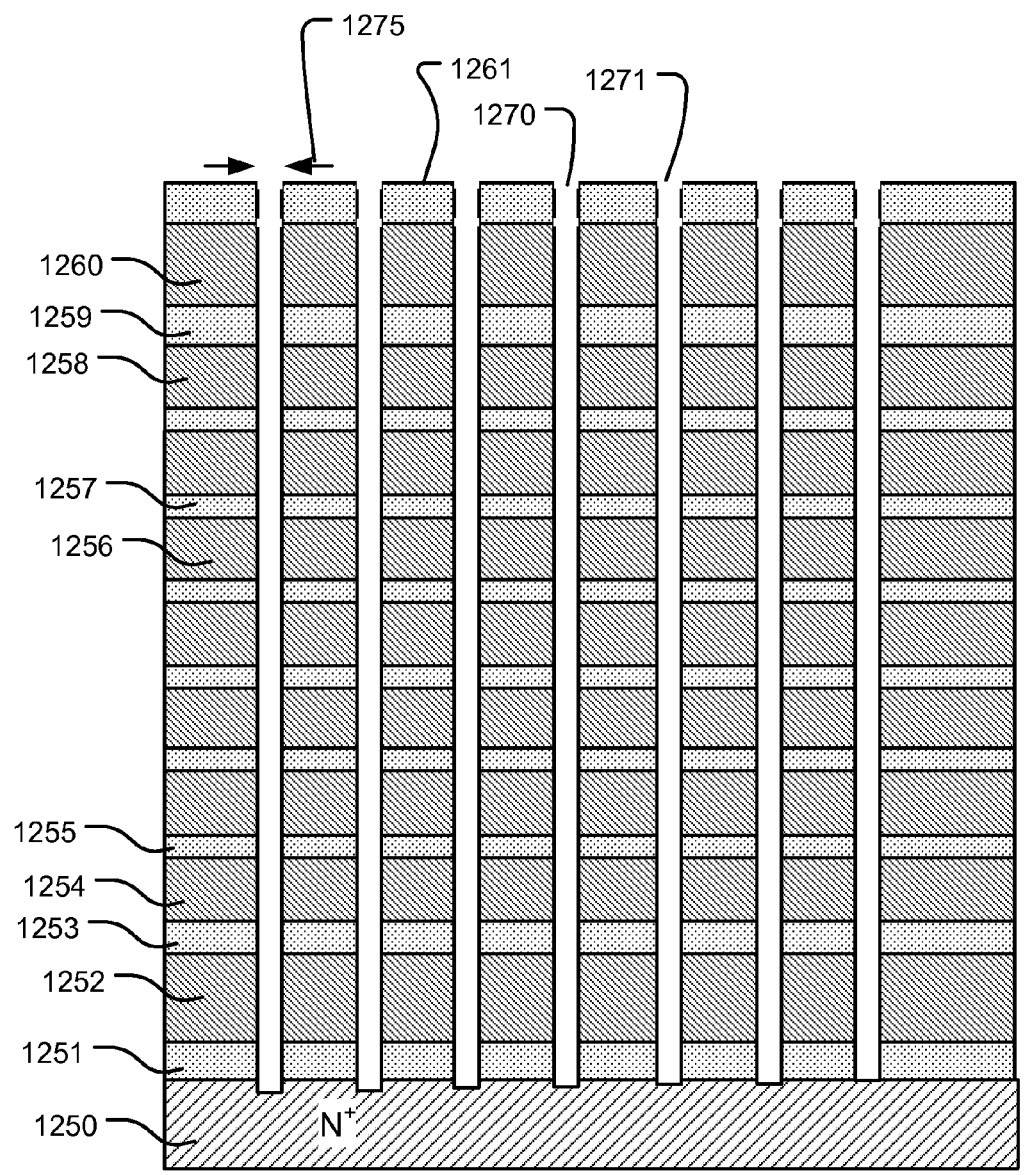
FIG. 25A
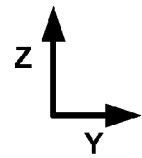

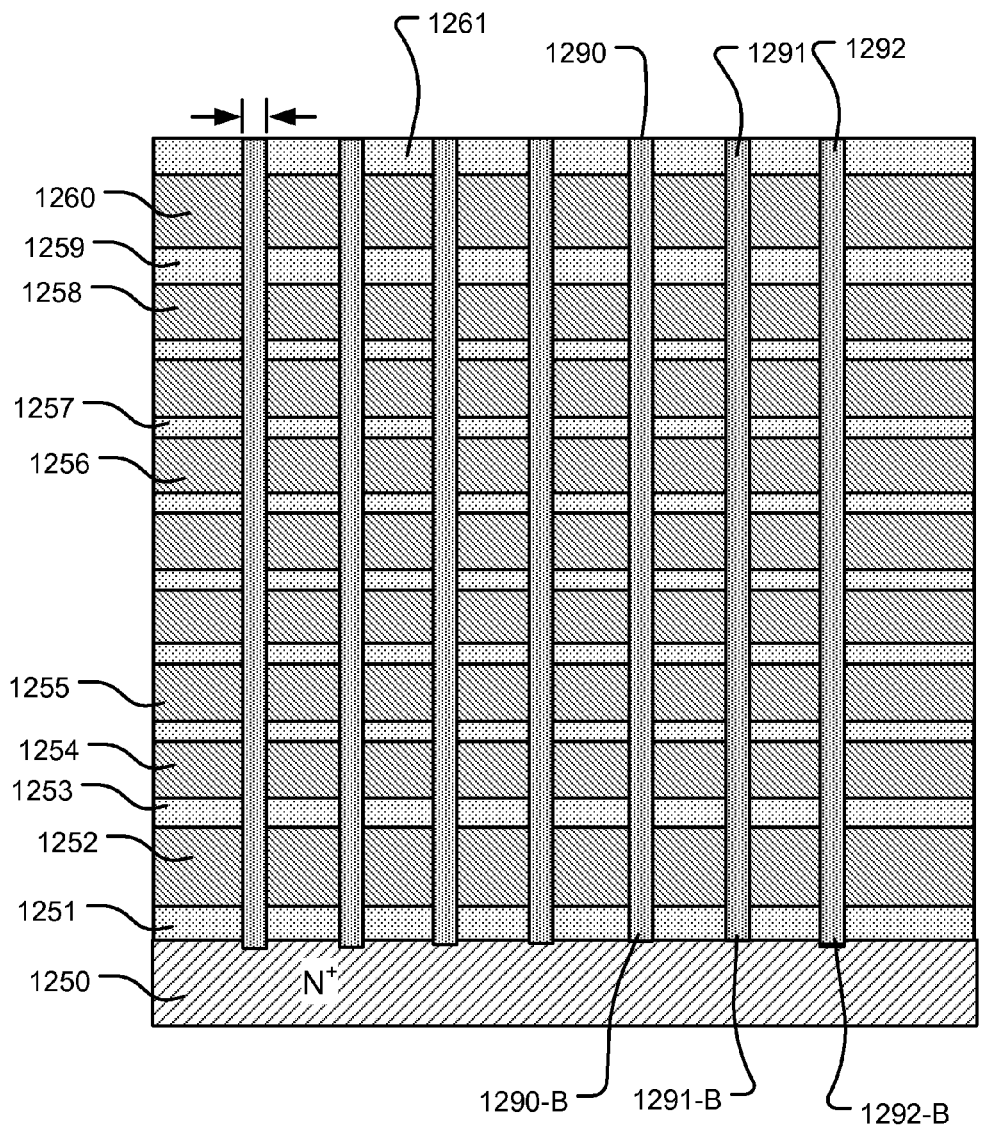
FIG. 26A
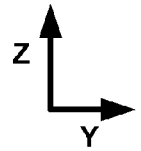

3D INDEPENDENT DOUBLE GATE FLASH MEMORY ON BOUNDED CONDUCTOR LAYER

RELATED APPLICATIONS

This application is a continuation-in-part of co-pending application Ser. No. 14/284,306, filed on 21 May 2014, which application is incorporated by reference as if fully set forth herein.

This Application is related to co-pending application Ser. No. 14/471,788, filed on Aug. 28, 2014, which application is incorporated by reference as if fully set forth herein.

BACKGROUND

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around cell at each layer, as illustrated by FIG. 1.

FIG. 1 is a horizontal cross-section of a column of a pipe-shaped BiCS flash cell, such as described in the Katsumata et al. publication, at the level of a word line. The structure includes a pillar 10 of semiconductor material which extends vertically through a stack of word line layers. The pillar 10 may have a seam 11 through the middle that arises from the deposition technique. A dielectric charge trapping structure comprising for example a first layer 12 of silicon oxide, a layer 13 of silicon nitride and a second layer 14 of silicon oxide (referred to as ONO), or another multi-layer dielectric charge trapping structure surrounds the pillar 10. A gate all-around word line is intersected by the pillar. A frustum of the pillar at each layer combines with the gate all-around word line structure at that layer, to form a memory cell.

For the purposes of high density memory devices, it is desirable to have the channel diameter of the pillar 10 as small as possible. However, as the channel diameter shrinks, approaching for example 40 nm or less, the field enhancement factor by which the electric field between the word line 15 and the pillar 10 is intensified at the channel surface, can lead to problems with disturbance of charge trapped in the memory cells during read operations and program operations. As a result, the reliability of the structure degrades.

Katsumata et al. has suggested that the structure can be implemented using multiple-bit-per-cell programming technologies. These multiple-bit-per-cell programming technologies require fine control over threshold voltages, making read and program disturb characteristics even more critical. Therefore, even with high density three-dimensional flash technologies, the density of data storage can be limited.

Because of the relatively large cross-section of the column and dielectric charge trapping structure used to limit disturbance, the density of the three-dimensional memory structure is limited.

It is desirable to provide a structure for three-dimensional integrated circuit memory with a low manufacturing cost, including reliable, very small memory elements, and high data densities.

SUMMARY

A 3D memory device configurable for independent double gate, multiple-bit per cell operation is described. Very high density data storage can be achieved.

A vertical channel 3D NAND array is described, configured for independent double gate operation. Word lines in the each layer of the stack can be shared horizontally and are split into even and odd sides. As a result, a row of independent double gate cells is disposed between each pair of even and odd word lines. String select structures can also be implemented using independent double gate structures at a top layer of the stack, all separated and independently decoded.

The structure can be made using hole-shaped etching, forming holes in which to form the vertical channel structures, and in which to form isolation pillars that divide the word line structures in each layer into the even and odd sides. As can be achieved using the hole-shaped etching, memory cells at each frustum of each active pillar have a first arcuate edge contacting and even word line, and a second arcuate edge contacting and odd word line.

An operating method is described which involves separately programming each side of the memory cell at each frustum of the active pillars in the array. This results in two charge storage sites in each memory cell, each of which can be programmed to hold more than one bit. The structure therefore enables storage of 4 bits per cell or more to achieve very high data density.

A row of a memory array as described herein includes first and second multilayer stacks of conductive strips, such that each layer can include an even and an odd word line. A plurality of active pillars is disposed between the first and second stacks. Each active pillar comprises a vertical channel structure, a charge storage layer and an insulating layer. The insulating layer in a frustum of an active pillar contacts the first arcuate edge of a first conductive strip in the first stack at the layer of the frustum, and contacts the second arcuate edge of a second conductive strip in the second stack at the layer of the frustum. Inter-stack insulating columns are interleaved among the plurality of active pillars between the first and second stacks, separating the even and odd word lines.

The active pillars can have an elliptical or elongated cross-section, with a major axis generally parallel to the conductive strips. As a result, a cross-section of the active pillar in a particular frustum is arranged so the average radius of curvature of the first and second arcuate edges is greater than an average radius of curvature of the frustum adjacent insulating columns in the same layer. This reduces field enhancement in the charge storage structure that could result from a smaller radius of curvature, and improves immunity to disturbance in the memory cells.

Examples are described in which this basic structure is extended into an array forming a very dense memory structure.

Methods for manufacturing memory devices as described herein are also provided.

Other aspects and advantages of the present invention can be seen on review of the drawings, the detailed description and the claims, which follow.

BRIEF DESCRIPTION OF THE DRAWINGS

FIGS. 24, 25A, 25B, 26A, 26B, 27A, 27B, 28, 29A, 29B, 30, 31, 32A, and 32B illustrate stages of the manufacturing process for a structure as illustrated in FIG. 23, modified for a twisted layout.

DETAILED DESCRIPTION

A detailed description of embodiments of the present invention is provided with reference to the FIGS. 2-35.

Figure 1:
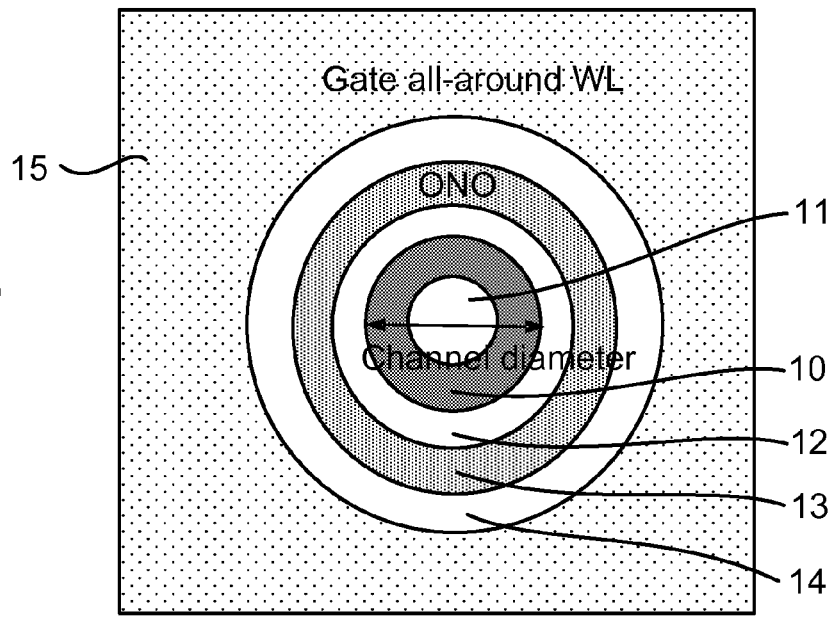
FIG. 1 is a cross-section of a prior art gate all-around memory cell.
Figure 2:
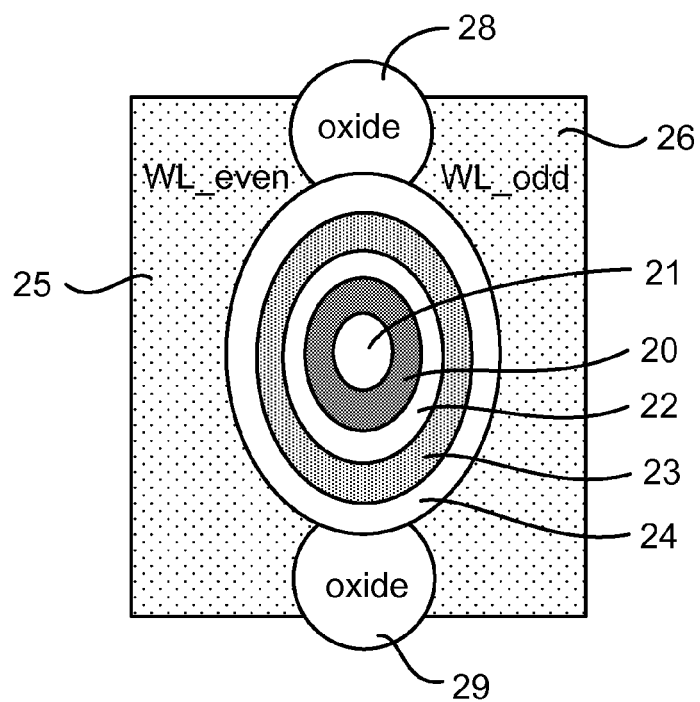
FIG. 2 is a cross-section of an independent double gate flash memory cell for a 3D array as described herein.

FIG. 2 is a horizontal cross-section taken through a column of flash memory cells in a 3D array at a word line level. As illustrated, a vertical channel structure 20 of semiconductor material extends vertically through a stack of word line layers. The vertical channel structure 20 may have a seam 21 through the middle. A multilayer dielectric charge trapping structure comprising for example a first layer 22 of silicon oxide, the layer 13 as silicon nitride, and a second layer 24 of silicon oxide, surrounds the vertical channel structure 20. The columnar structure including the vertical channel structure 20 of semiconductor material, and the multilayer dielectric charge trapping structure surrounding the vertical channel structure 20, can be referred to as an active pillar herein.

An even word line 25 and an odd word line 26 are disposed on opposing sides of the active pillar. Isolation pillars 28 and 29, which can comprise silicon dioxide or other insulating material, are disposed on either side of the active pillar along the word line direction, and separate the even word line 25 from the odd word line 26 as can be seen more clearly in following drawings. The even word line 25 and the odd word line 26 can be coupled to word line driver circuits which are configured to independently operate the word lines.

At a particular word line layer, in combination a frustum of the active pillar, the even word line and the odd word line form an independent, double gate flash memory cell.

The word lines can comprise a variety materials including doped semiconductors, metals, and conductive compounds like Si, Ge, SiGe, SiC, TiN, TaN, W, and Pt. The vertical semiconductor channel is a part of the active pillar in the memory device, and can comprise semiconductor materials adapted to act as channels for the memory cells, including such materials as Si, Ge, SiGE, GaAs, SiC, and graphene. Charge storage structures in the memory device, can comprise multilayer dielectric charge trapping structures known from flash memory technologies, such as SONOS, BE-SONOS, TANOS, and MA BE-SONOS and so on.

Figure 3:
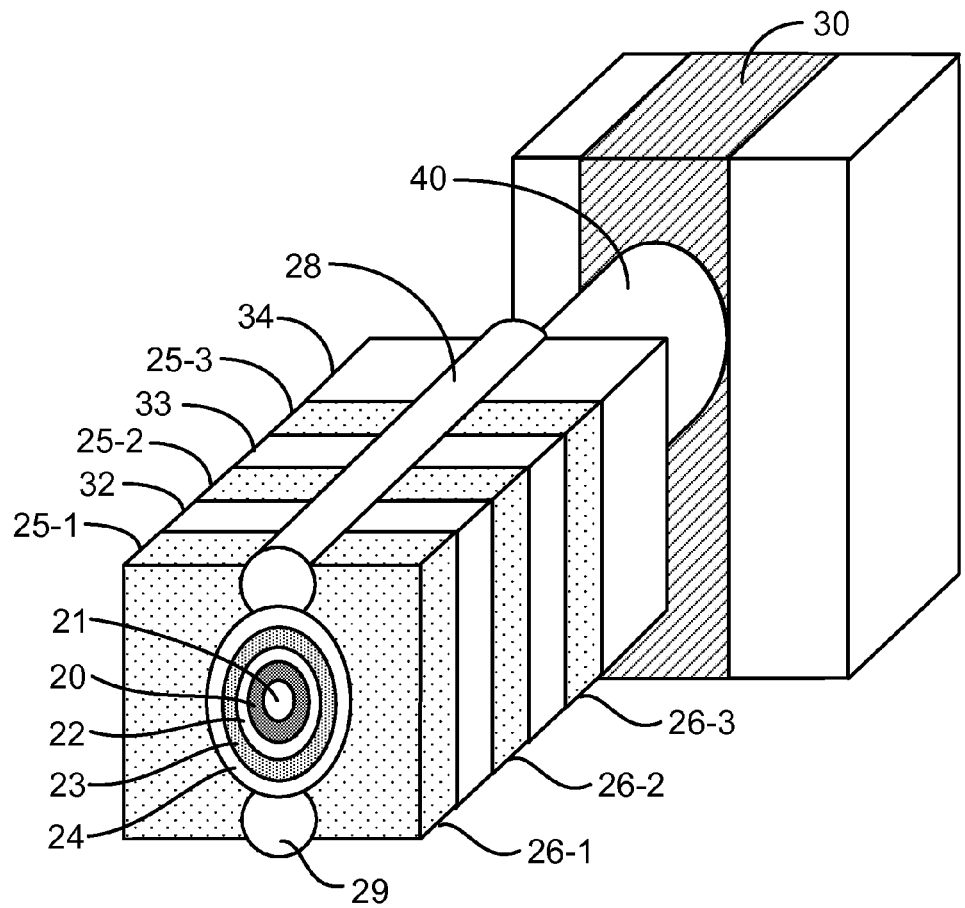
FIG. 3 is a perspective view of a single column of independent double gate flash memory cells as described herein.

FIG. 3 provides a perspective view of a single active pillar 40, with other elements of the array removed. As can be seen, the active pillar 40 extends out of a source line conductor structure 30, through the word line layers. The source line conductor structure 30 can be implemented in a variety of ways, and may include a switch such as a ground select line GSL switch. The source line conductor structure 30 provides a current path to a source side bias voltage circuit for the string of memory cells in the active pillar.

Each of the word line layers is separated from overlying layers by insulators 33, 32. An insulating layer 34 isolates the lowest word line layer from the underlying source line conductor structure 30. Each of the word line layers adjacent the vertical channel structure 40 includes an even word line 25-1, 25-2, 25-3 and odd word line 26-1, 26-2, 26-3. The isolation pillars 28, 29 are disposed along the sides of the active pillar 40 and divide the even and odd word lines.

Figure 4:
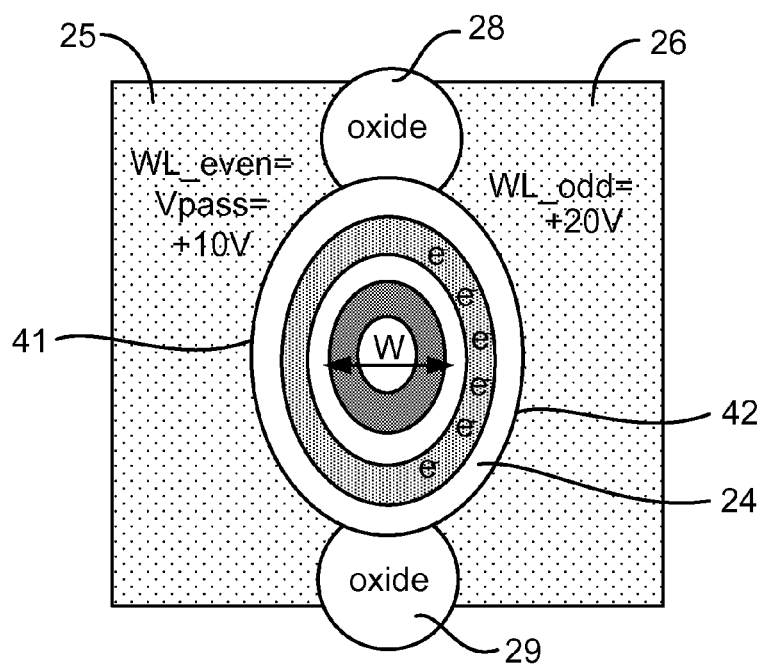
FIG. 4 illustrates an independent double gate flash memory cell with charge storage on one side.

FIG. 4 is a horizontal cross-section taken through a column of a flash memory cell, like FIG. 2. Reference is made to FIG. 4 to describe various features of the independent, double gate memory cell described herein. Reference numerals used in FIG. 2 are applied in FIG. 4 and not described again. The active pillar, including the pipe-shaped vertical channel structure 20, and the surrounding dielectric charge storage layers 22, 23, 24, in cross-section form an elliptical shape in the illustrated embodiment, such that the shape can be considered to have a major axis and a minor axis, without necessarily forming an ellipse as strictly defined. The major axis in some embodiments is substantially longer than the minor axis. In this context, "substantially longer" means longer enough, such as about 7/6 times as long in illustrated examples, that the field enhancement between the vertical channel structure in an active pillar and the conductive word line strip is reduced relative to a circular cross-section by an amount that can appreciably reduce read disturbance.

In the embodiment shown in FIG. 4, an outside surface of the active pillar, which is the outside surface of silicon oxide layer 24 in this example, contacts the even word line 25 along a first arcuate edge 41, and contacts the odd word line 26 along a second arcuate edge 42. The average radius of curvature of the first and second arcuate edges 41, 42 can be greater than the average radius of curvature of the active pillar 40 adjacent the insulating columns 28, 29. This increased average radius of curvature can substantially reduce field enhancement between the word lines and the column of semiconductor material, and improve read and program disturb performance significantly for the device.

As illustrated, the major axis of the elliptical shape cross-section of the active pillar is generally parallel to the even and odd word lines 25, 26. As a result, the width W of the cross-section of the vertical channel structure 20 taken on the minor axis of the elliptical shape can be less than the length of the cross-section of the vertical channel structure 20 taken along the major axis of the elliptical shape. This can result in a smaller pitch for the even and odd word line structures.

Embodiments of the independent double gate memory structure can comprise active pillars having cross-sections that are square, rectangular, circular and/or other shapes at one or more of the word line layers.

Figure 5A:
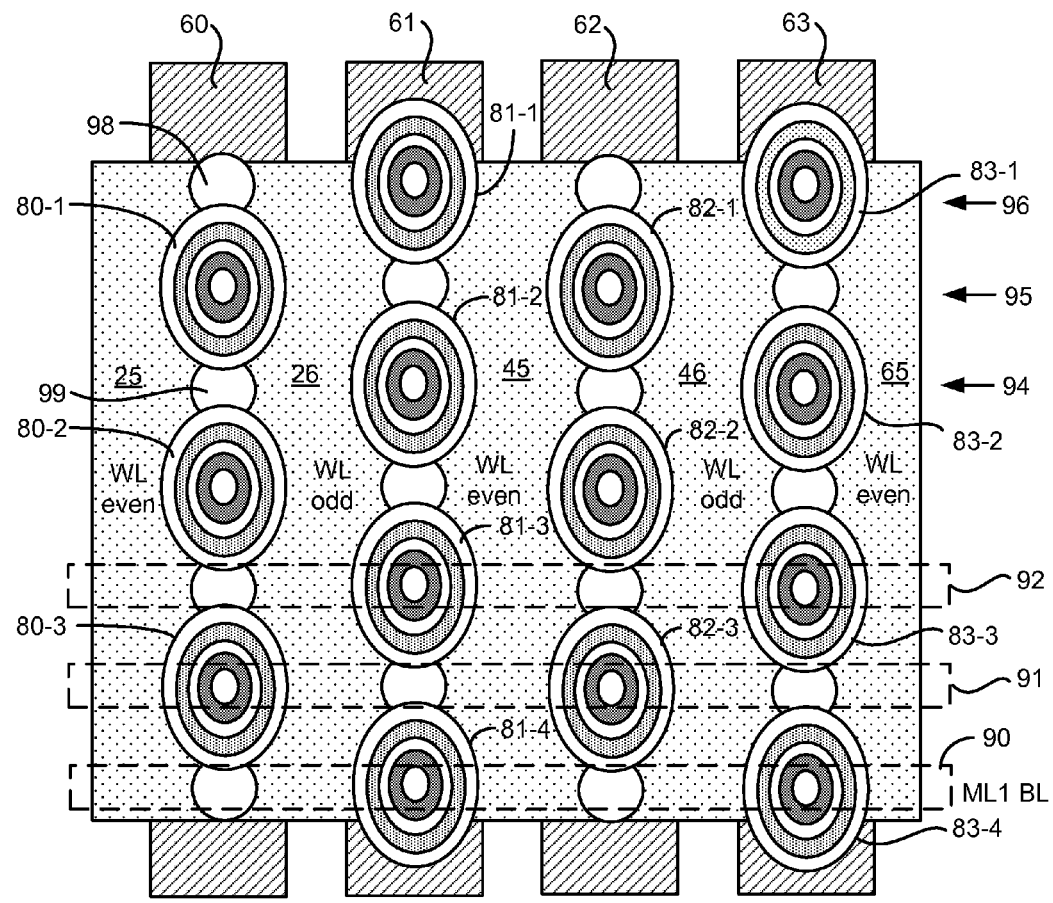
FIGS. 5A and 5B provide a layout and perspective view of an array of independent double gate flash memory cells as described herein.
Figure 5B:
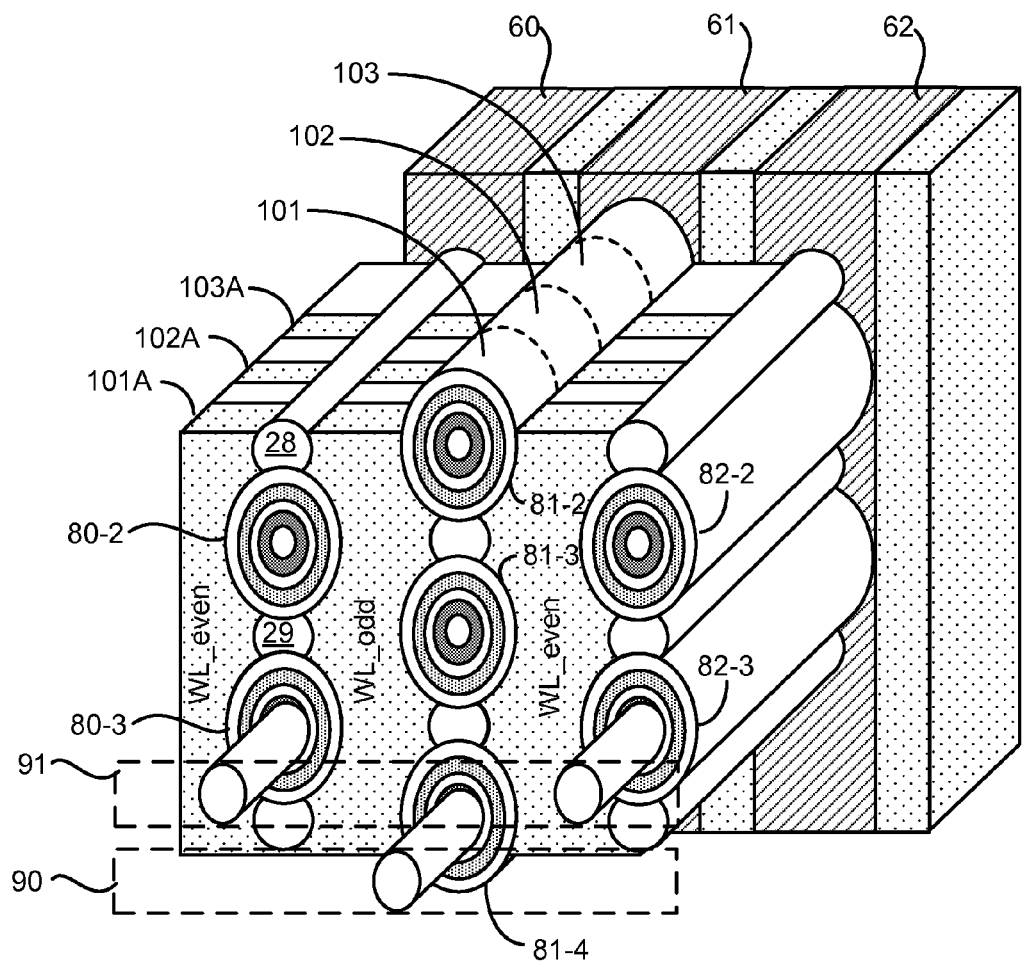

FIGS. 5A and 5B illustrate a layout and perspective view of a 3D block including a plurality of active pillars. In FIG. 5A, a layout view is provided that includes 4 rows (where a row is considered the word line direction for the purposes of array layout) and 7 columns (where a column is considered the global bit line direction for the purposes of array layout), of active pillars arranged in a honeycomb pattern which allows for dense packing of the active pillars. FIG. 5B provides a perspective view of a block including 3 rows and 5 columns of active pillars. Referring to FIG. 5A, each of the rows of active pillars overlies a source line conductor structure 60, 61, 62, 63, examples of which are described below. The source line conductor structures can be disposed on a substrate such as on an insulated layer over a semiconductor chip. Thus, a first row of active pillars includes columns 80-1, 80-2, and 80-3. A second row includes active pillars 81-1, 81-2, 81-3, and 81-4. A third row includes active pillars 82-1, 82-2 and 82-3. A fourth row includes active pillars 83-1, 83-2, 83-3 and 83-4. The active pillars in the rows are offset as illustrated to form a honeycomb pattern. Conductive strips configured as even and odd word lines 25, 26, 45, 46, 65, in each layer are disposed between the rows as illustrated.

The array columns of active pillars are interconnected by overlying metal bit lines 90, 91, 92 as illustrated. Overlying metal bit lines also would be disposed along the array columns 94, 95 and 96, but are not illustrated in the diagram. As illustrated, even and odd word lines are isolated from one another by the active pillars and the isolation pillars (e.g. isolation pillars 98 and 99), allowing for independent double gate operation.

Referring to FIG. 5B, the perspective view of an array structure is illustrated. The array overlies a set of source line conductor structures 60, 61, 62. The array includes active pillars 80-2 and 80-3 in a first row over the source line conductor structure 60, active pillars 81-2, 81-3 and 81-4 in a second row over the source line conductor structure 61, and active pillars 82-2 and 82-3 in a third row over the source line conductor structure 62. Overlying metal bit lines 90 and 91 are connected to the active pillars 81-4 and 80-3 and 82-3 as illustrated in corresponding array columns. For the purposes of illustration, the active pillar 81-2 is schematically divided into a frustum 101 at which it intersects with the top word line layer 101A, a frustum 102 at which it intersects with even and odd word lines in the intermediate word line layer 102A, and a frustum 103 at which it intersects with even and odd word lines in the lower word line layer 103A. As discussed above, an independent double gate memory cell is established by the structure at each of the frustums 101, 102, 103 along the active pillar 81-2. Each of the active pillars can be described with respect to the frustums of the pillar in which memory cells are established.

Active pillars described above can be configured as NAND strings, with string select switches and ground select switches disposed on each end of the active pillars. The string select switches and ground select switches are not discussed above for the purposes of simplifying the description.

FIGS. 6-12 illustrate stages in the manufacturing process for a memory block and are described with reference to FIGS. 5A and 5B.

Figure 6:
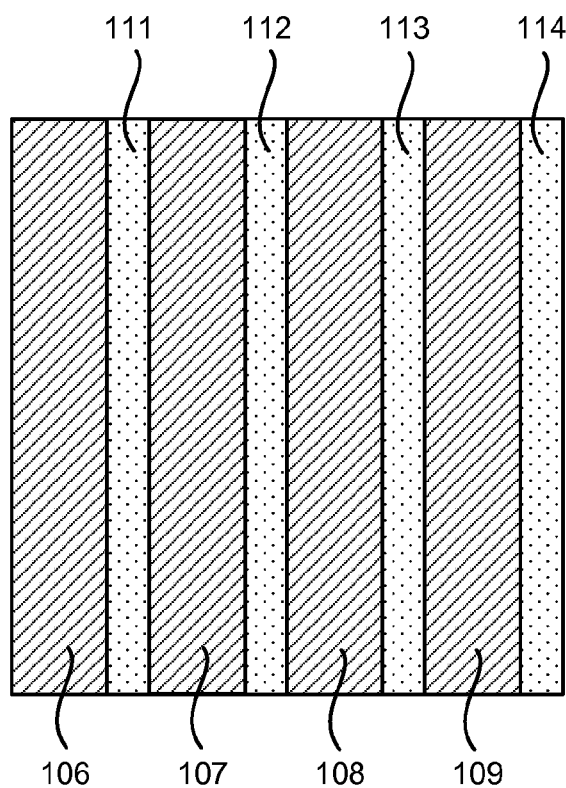
FIGS. 6, 7, 8A, 8B, 9A, 9B, 10, 11A, 11B, 11C, and 12 illustrate stages of the manufacturing process for a structure as illustrated in FIGS. 5A-5B.
Figure 7:
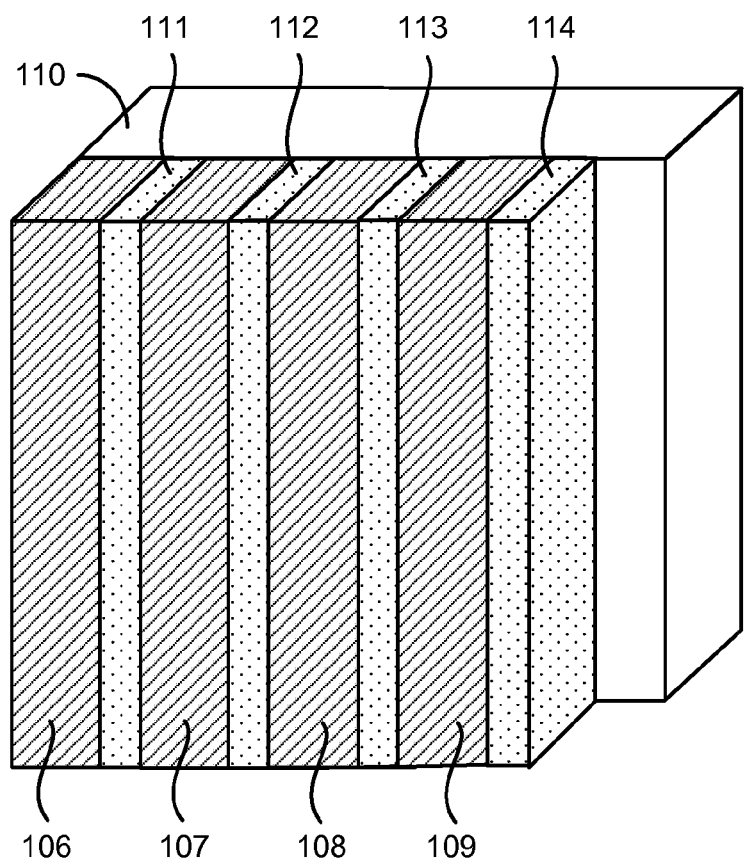

FIGS. 6 and 7 illustrate a pattern for a source line structure formed on an insulating layer 110 (FIG. 7) on a substrate, not shown. The process of manufacturing can begin by forming an insulating layer on a substrate, and then depositing a layer of conductive material such as polysilicon or other conductor which is suitable for use as a ground select line GSL on a NAND string in the 3D structure. The layer is then patterned to define ground select lines 111, 112, 113, 114 on the insulating substrate 110. Trenches between the ground select lines are filled with a sacrificial material such as silicon nitride, or other material which can be removed in subsequent process steps described below. This sacrificial material provides forms 106, 107, 108, 109 between the ground select lines, in which conductive elements of the source line structures are formed along the rows of the array.

Figure 8A:
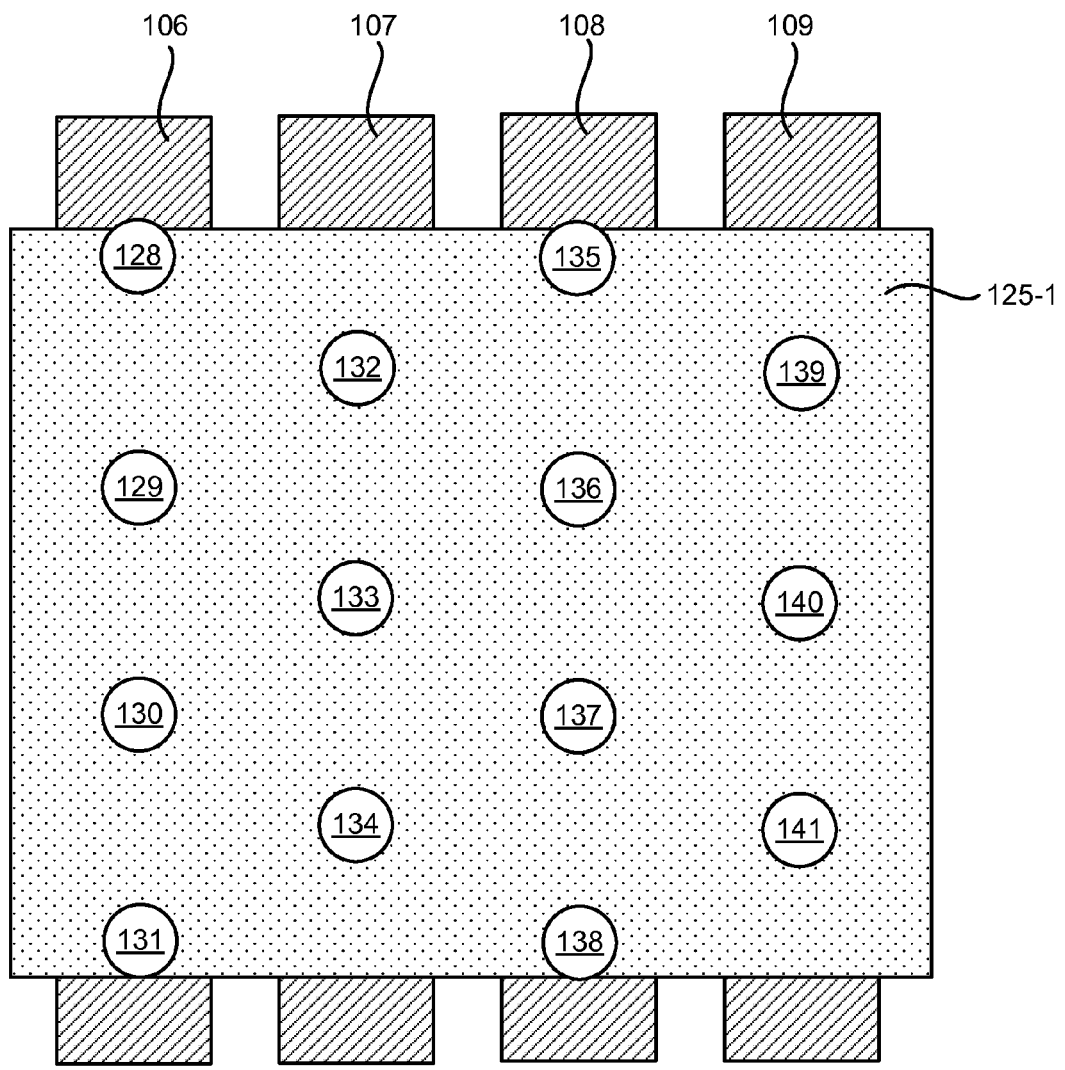
Figure 8B:
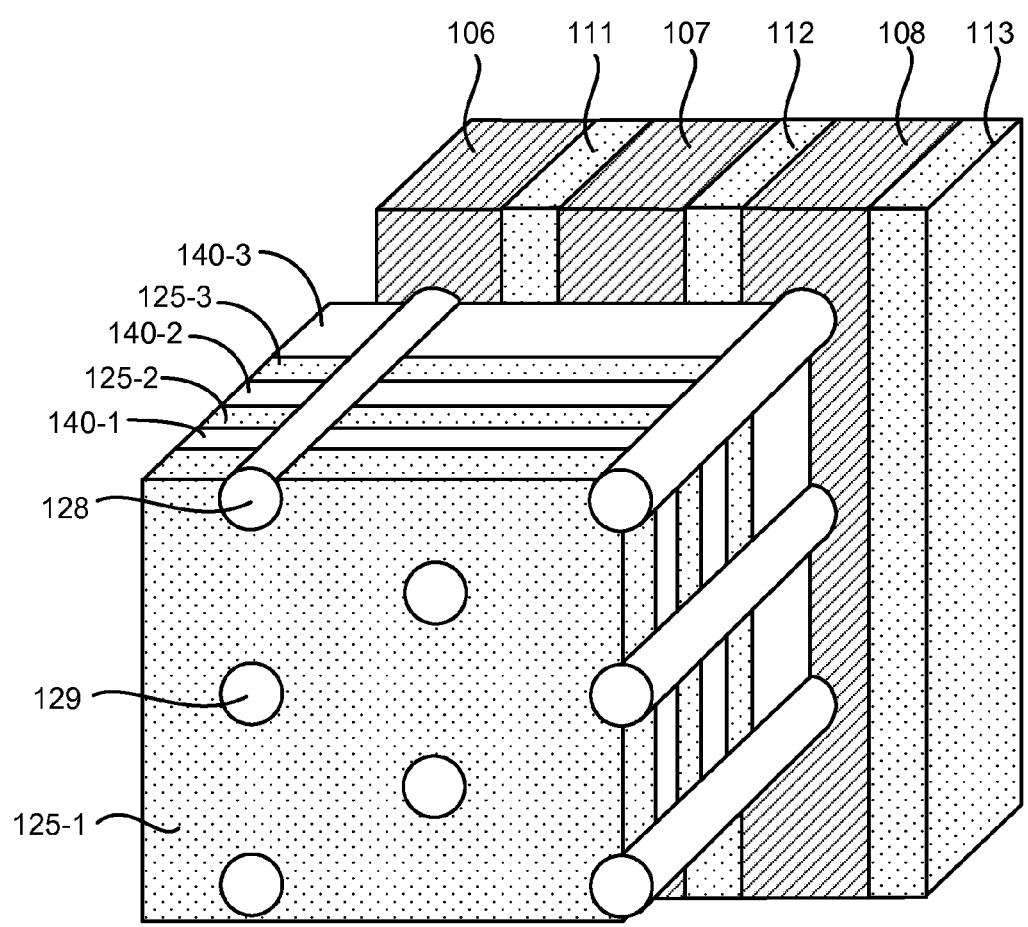

FIGS. 8A and 8B illustrate the structure after another set of manufacturing steps. Manufacturing steps include forming a stack of alternating word line material and insulating material over the ground select lines 111-114 and forms 106-109, and then etching holes, and filling the holes with insulation material to form isolation pillars 128-141 which are arranged in array rows along the forms 106, 107, 108, 109 and along the array columns. FIG. 8A is a layout view of a portion of the array block, without showing connections of the word lines. In NAND string embodiments, a top word line layer can be used to form string select lines. More complete word line layer and string select line layouts are illustrated below with respect to FIGS. 13 and 14.

As can be seen in FIG. 8B, the stack of word line layers includes the top layer 125-1, an intermediate layer 125-2, and a bottom layer 125-3. Insulating layers 140-1, 140-2, 140-3 separate the word line layers. In a representative embodiment, there may be many more word line layers. The isolation pillars (e.g. 128, 129) extend through the stack of word line layers to or partially into the sacrificial forms 106, 107, 108. Insulating holes are etched, and then filled with an insulator such as silicon dioxide or other suitable insulator, which serves, along with active pillars in the array, to separate the word line layers into independent word lines.

The hole etching process can be conducted using a hard mask process. For example, the hole pattern can be created using a photoresist and photo exposure using immersion 193 nm lithography tools, over a dielectric film overlying the carbon hard mask film. The photoresist pattern is then transferred onto the dielectric film by etching. The dielectric film will serve as the hard mask for opening the sacrificial carbon hard mask, and the sacrificial carbon hard mask will be used to open the holes in the stack both in the region.

The etching can be done using a plasma etch recipe, which has equal etching rate (or close to equal) for the memory material, such as the silicon oxide and silicon nitride of the dielectric charge trapping structure in this example, and for conductor material (polysilicon in this example). This can be done for example by using the combination of NF3, CH2F2, HBr, O2, CH4, and He.

Figure 9A:
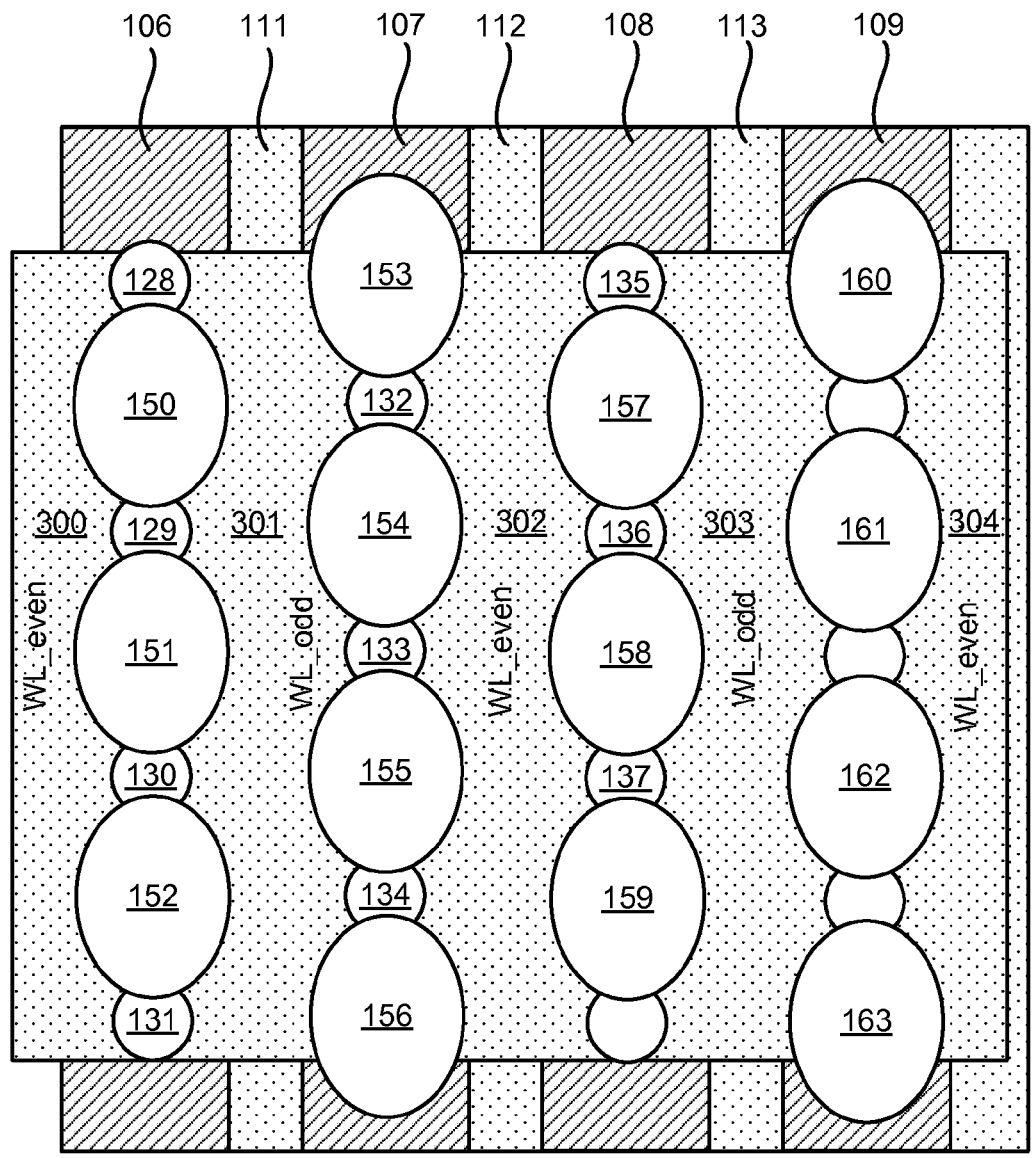
Figure 9B:
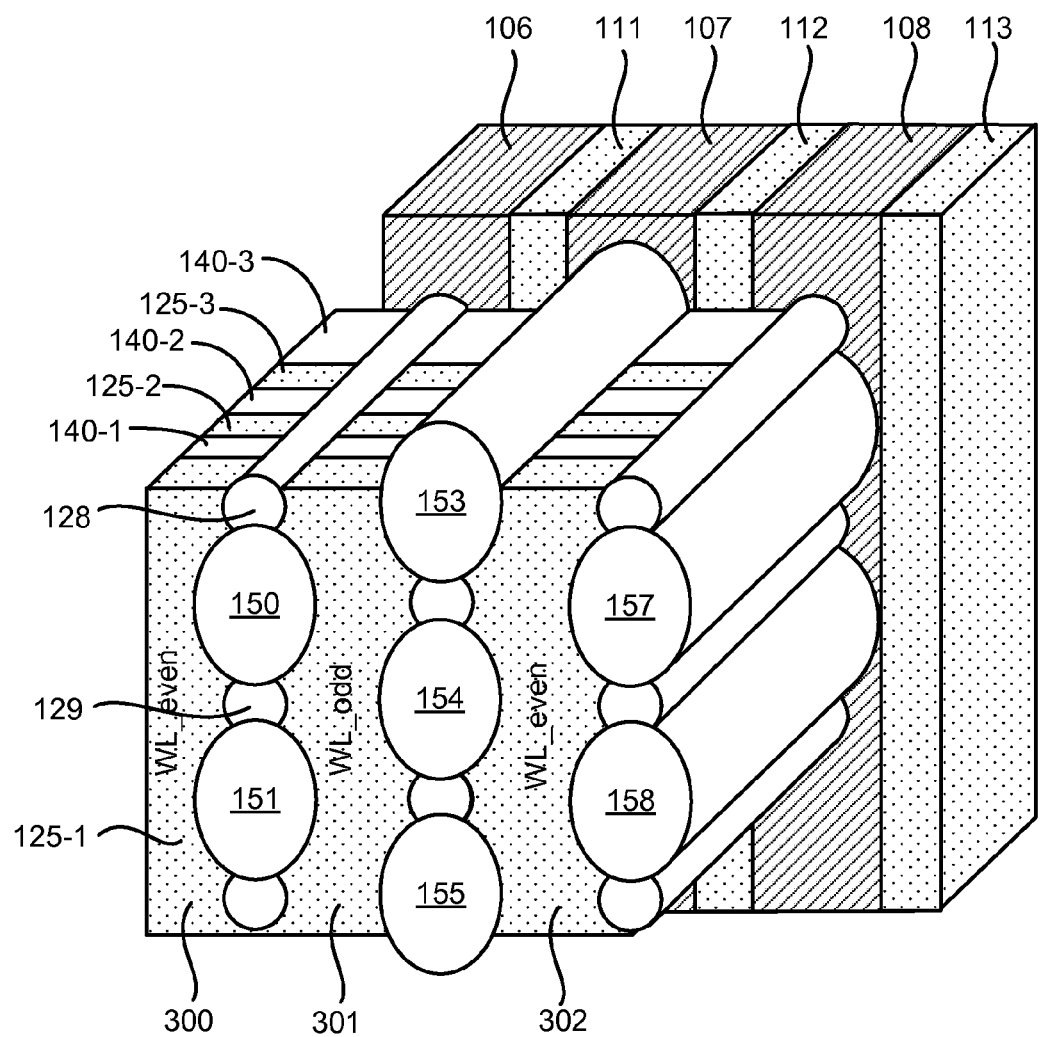

FIGS. 9A and 9B illustrate the structure after yet another set of manufacturing steps. The manufacturing steps include forming an array of elliptical holes 150-163 interleaved with the isolation pillars 128-141 along the array rows and array columns as shown. After forming the elliptical holes 150-163, the word line layers in the stack are separated into even word lines 300, 302, 304, . . . , and odd word lines 301, 303 . . . . As can be seen in FIG. 9B, the elliptical holes extend through the word line layers to or partially into the sacrificial forms 106, 107, 108. The hole etching can be executed using a process as mentioned above. Using an elliptical shape provides a larger process window for the hole etching process, and results in a structure as discussed above which can have improved characteristics. The elliptical shape holes overlap with the isolation pillars so that the word line layers are separated. The etching process can stop inside the sacrificial forms 106, 107, 108. To reduce the likelihood of bridges between the even and odd word lines, such as may result if the hole taper causes the elliptical shape hole not to overlap with the isolation pillar in lower layers of the stack, the length of the elliptical shape can be increased. Also, before filling the isolation pillars with insulation material, one could perform an oxidation step that can consume silicon in the layers around the periphery of the isolation pillars.

Also, as can be seen, the layout is "twisted" so that it is arranged in a honeycomb structure, in order to give a high density, and a small pitch for the overlying bit lines along the array columns as described below.

Figure 10:
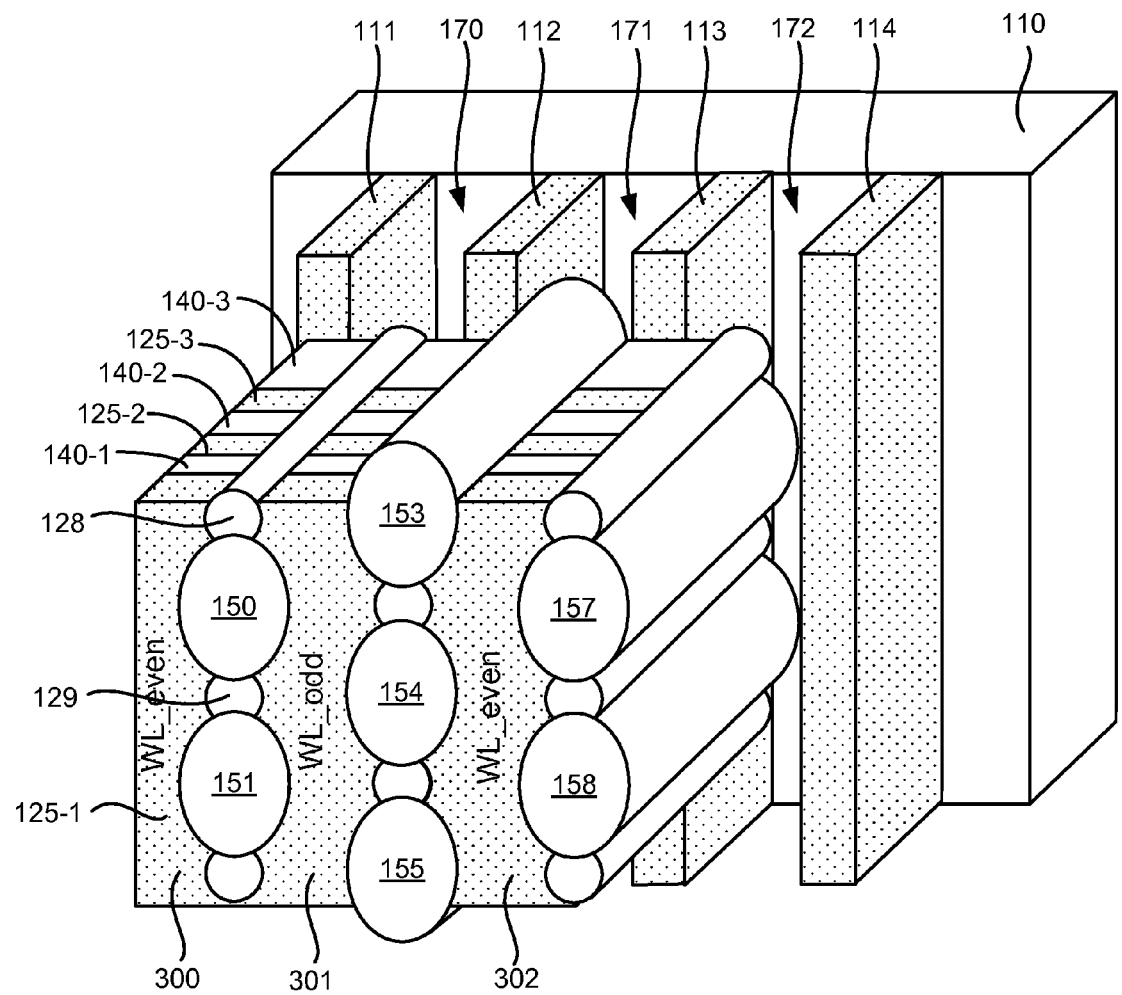

FIG. 10 is a perspective view of the structure after an etching process used to remove the sacrificial forms 106, 107, 108, 109. This results in formation of trench-like voids 170, 171, 172 between the ground select line conductors 111, 112, 113, 114. The etching can be executed using a hot phosphoric acid solution when the sacrificial material as silicon nitride, or other etch recipe which can effectively remove the sacrificial material from within the voids. The holes for the active pillars are now suspended in the structure. However, the structures are easily supported by the surrounding word line structures and isolation pillars. Also, the bottom gate select line structures help sustain the hole structure.

Figure 11A:
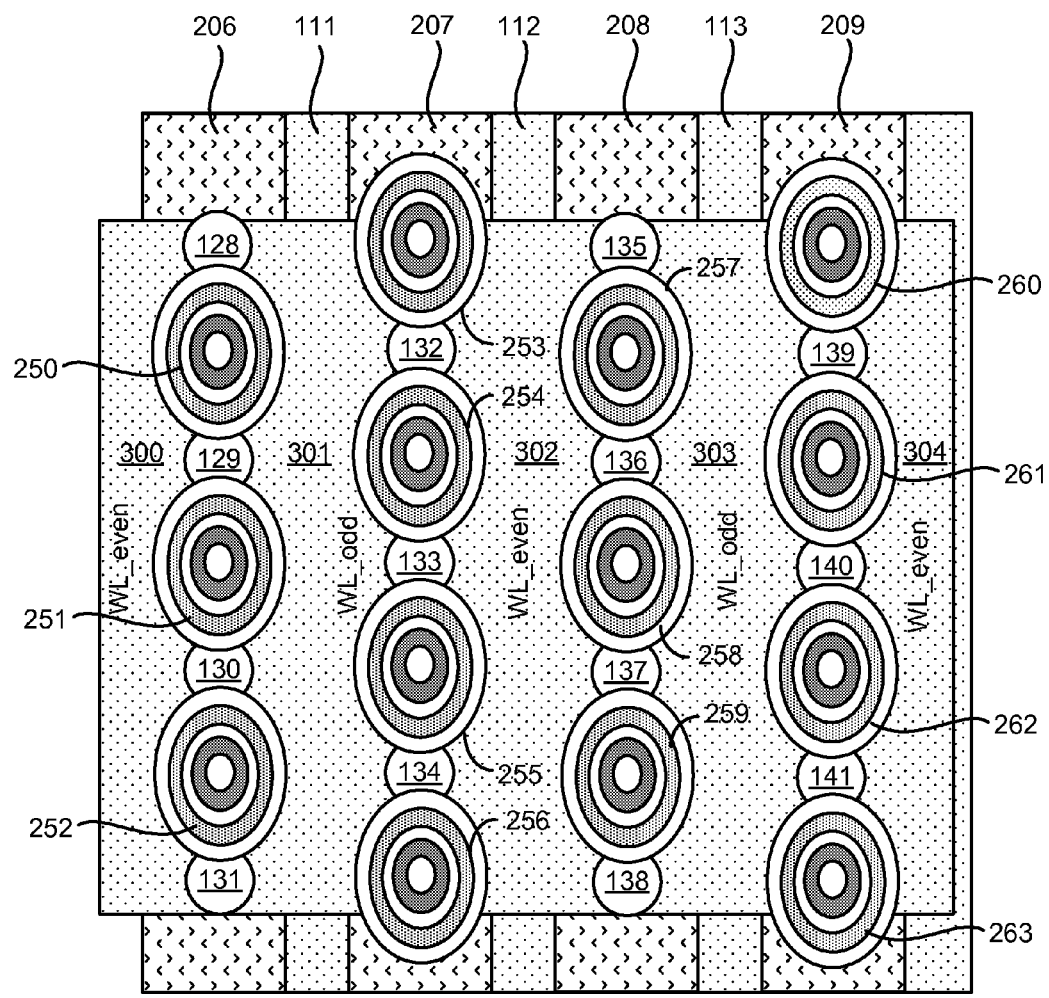
Figure 11B:
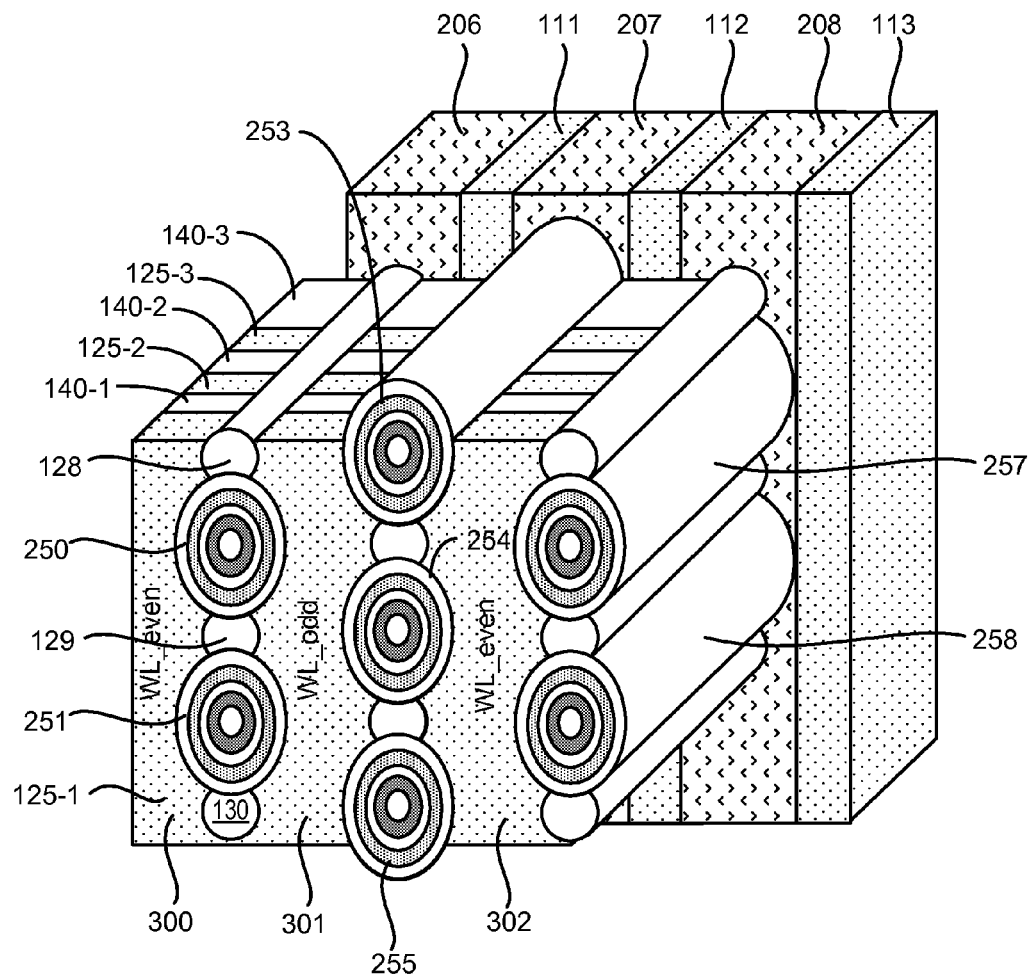
Figure 11C:
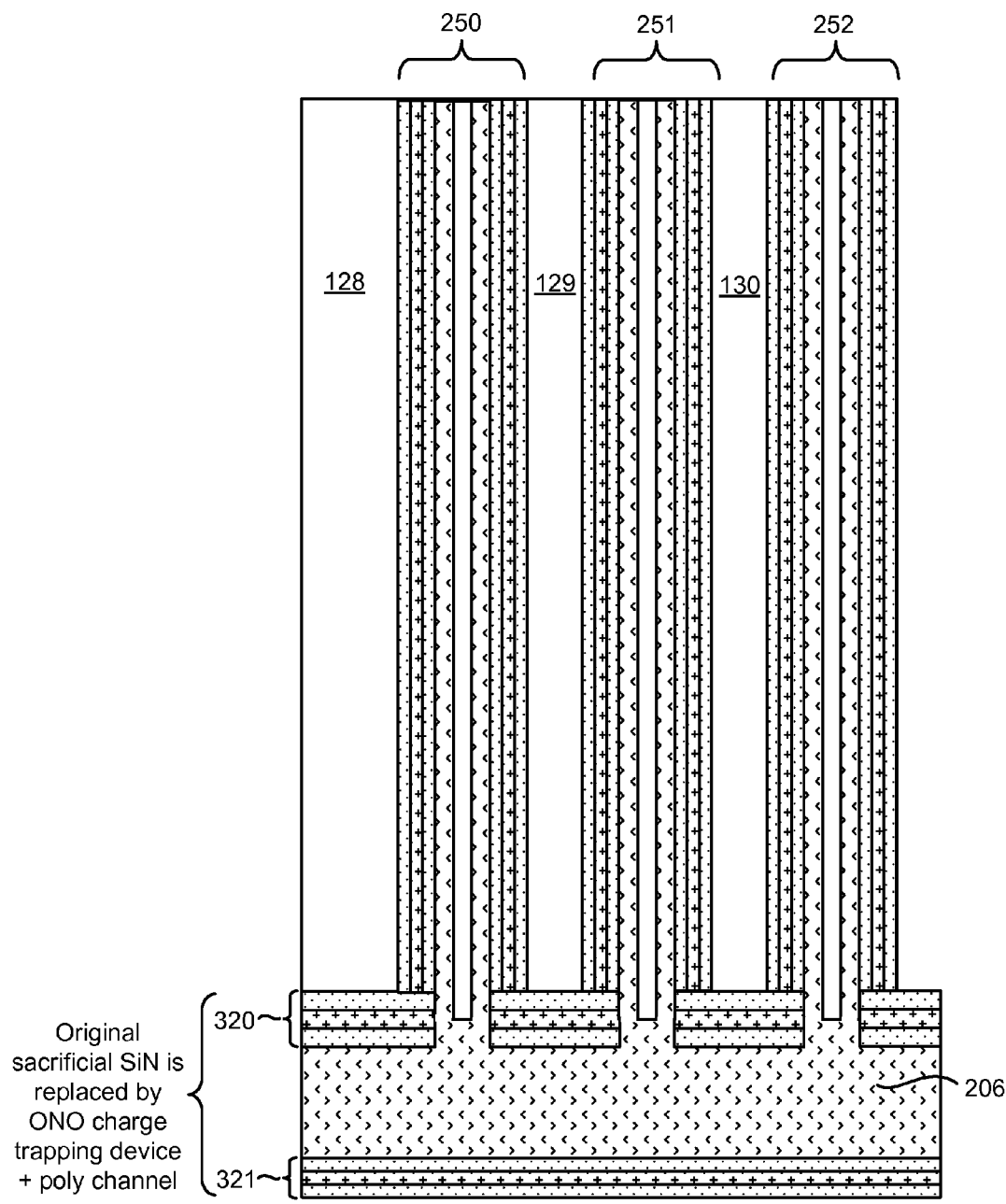

FIGS. 11A-11C illustrate the structure after further manufacturing steps. In particular, manufacturing steps are applied on the structure of FIG. 10 that include conformal deposition of the silicon oxide, silicon nitride, silicon oxide layers which form the dielectric charge trapping structure, followed by conformal deposition of the vertical channel structure using material such as silicon, which in combination result in a "macaroni" style active pillars 250-263, or an active pillars including a vertical channel structure with a seam which results from the conformal deposition of materials. In a representative device, the layer of memory material can include a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields. These layers can be conformally deposited using for example LPCVD A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, and can be formed by LPCVD or other wet conversion from the nitride by a wet furnace oxidation process. Other blocking dielectrics can include high-κ materials like aluminum oxide.

The deposition techniques applied to form these layers of BE-SONOS ONO films and channel material can be simply carried out by conventional LPCVD process, which provides excellent film quality and conformality required. On the other hand, tools such as atomic layer deposition ALD tools can be developed for these films.

In the deposition of the layers which form the dielectric charge trapping structure and the vertical channel structure, the voids 170, 171, 172 are also filled, resulting in a structure lining the voids with the dielectric layers of the dielectric charge trapping structure and filling them, or partially filling them, with a semiconductor layer that is also used to form a vertical channel structure. This results in a source line structure schematically represented by the regions 206, 207, 208, 209 which provides a current pathway from the top of active pillars through the source line structure and up an adjacent active pillar, or up an another active pillar that shares the source line conductor structure, for a "U-shaped" current path in the memory structure.

FIG. 11C illustrates a cross-sectional structure taken along the array row that includes active pillars 250, 251, 252, which are separated by isolation pillars 128, 129, 130. The source line structure 206 is lined by the dielectric charge trapping material 320, 321, and filled with the semiconductor material of the vertical channels. Each of the vertical channel structures includes a seam in this example which can provide for improved isolation between the independent double gate sides of each cell.

After deposition of these materials, the top of the block can be planarized, using chemical mechanical polishing for example, to isolate the vertical channel structures on the top of the stack.

Figure 12:
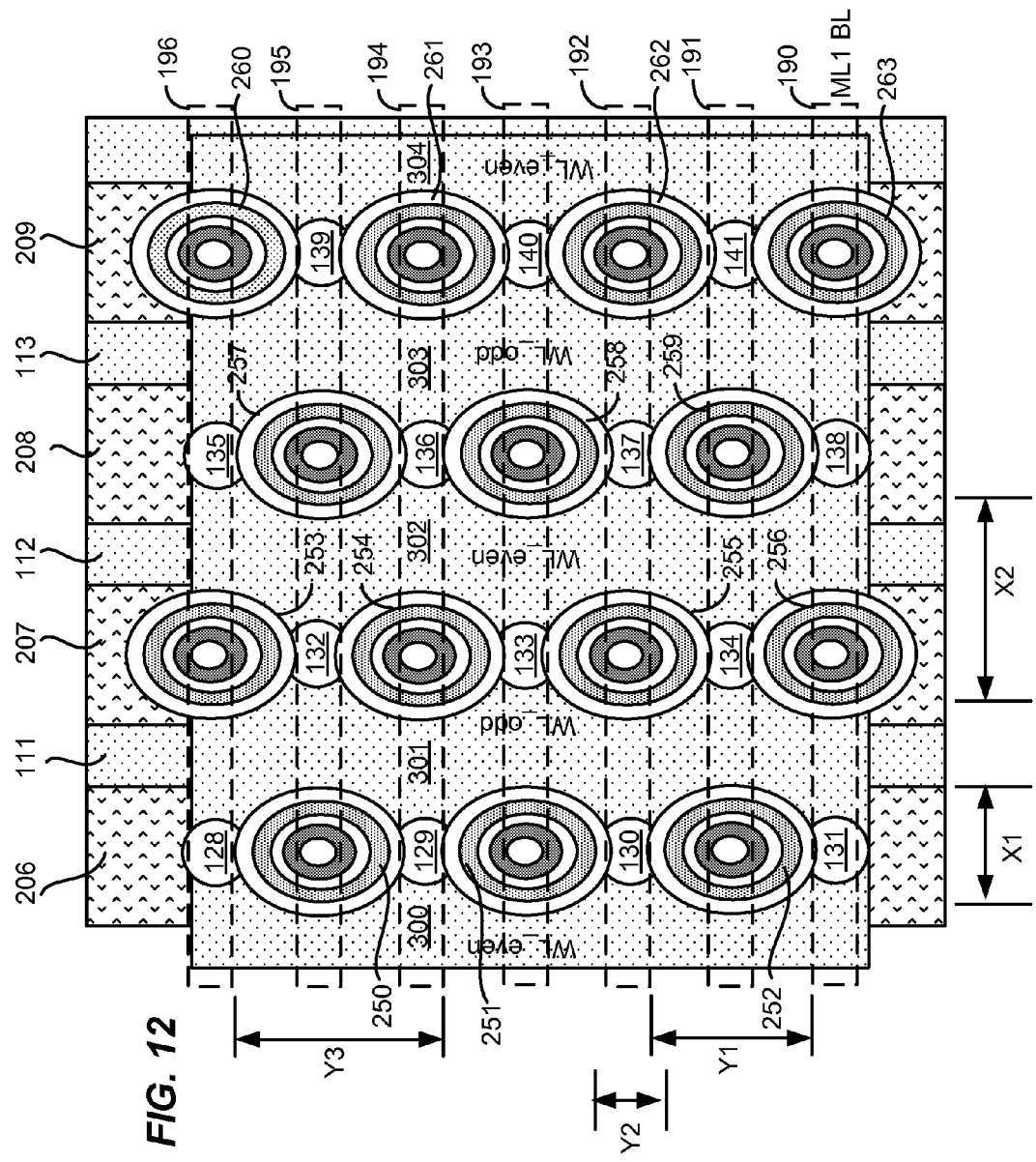

FIG. 12 illustrates the structure after following manufacturing steps, which include formation of an interlayer dielectric over the top of the stacks, interlayer connectors (not shown) and a patterned metal layer that includes bit lines 190-196 which contact the active pillars in each of the array columns.

Referring to FIG. 12, a representative design rule for the layout dimensions of a block of memory cells in the array area can be described. In the illustration, the major axis of the elliptical active pillars is considered the Y dimension, and the minor axis of the elliptical active pillars is considered the X dimension. Thus, the active pillars have a Y pitch, Y1, which can be on the order of 70 nm. Likewise, the isolation pillars have a Y pitch, Y2, which can also be on the order of 70 nm (drawing of the scale). The layout pitch of the active pillars and the isolation pillars can overlap at the patterned mask layer, because of the tapered structures, so that the Y pitch, Y3, active pillar/isolation pillar cells can be about 120 nm, for a half pitch of about 60 nm. As a result of a half pitch in the Y dimension of about 60 nm long in a single row, the pitch of the overlying metal bit lines can be about 30 nm in the honeycomb layout structure illustrated.

In the X dimension, the pitch X1 of the isolation pillar in the pitch X1 of the active pillar can be about 60 nm each. In other embodiments, these values may vary. The X pitch of the active/pillar, word line combination can be about 120 nm as well, for a half pitch of 60 nm.

The minimum X pitch on the minor axis of the elliptical active pillar needs to accommodate the thickness of the dielectric charge trapping layers, and a minimum diameter of the vertical channel structure. Assuming that the dielectric charge trapping structure has a maximum thickness of about 20 nm, and the vertical channel structure must have an outside diameter of at least 20 nm, the structure must accommodate at least 60 nm in the lowest layer. The pitch at the patterned layer must be large enough to accommodate that result. Because the X pitch of the active pillar can be smaller in an elliptical or elongated pattern, because of reduced field enhancement, the X pitch can be smaller than in prior designs.

Of course the sizes can be increased or decreased as suits the needs of a particular implementation.

Figure 13:
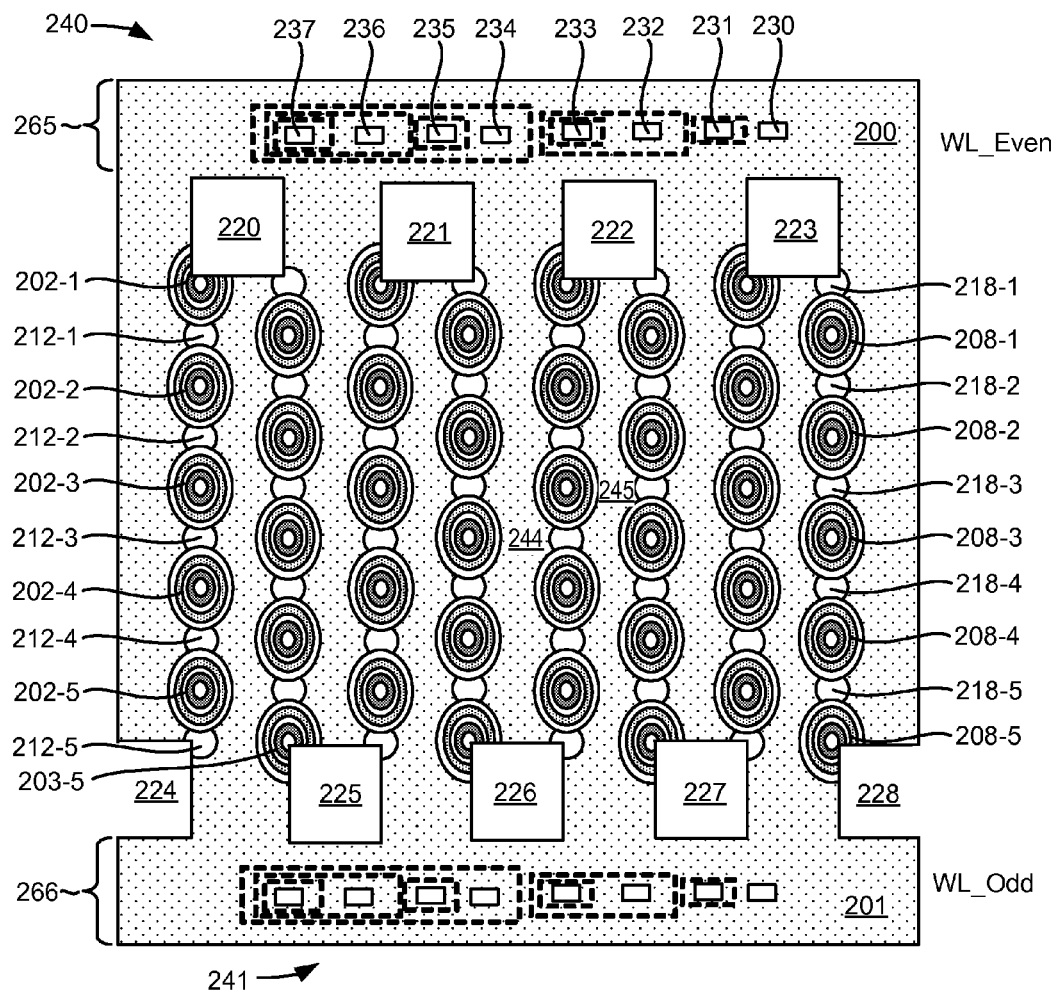
FIG. 13 is a layout view of a word line layer illustrating an embodiment for even and odd word lines.

FIG. 13 shows a layout view of a word line layer for a block of memory cells, including the interlayer connector structure, and even and odd word line structures. As illustrated, an even word line structure 200 and an odd word line structure 201 have word line extensions into the array of active pillars that are interdigitated. The array of active pillars includes a plurality of rows which are offset in a honeycomb arrangement. A first row includes active pillars 202-1, 202-2, 202-3, 202-4, and 202-5. Isolation pillars 212-1 through 212-5 are disposed between the active pillars as illustrated. A first active pillar in a next row includes pillar 203-5. On the right side of the layout, another row of active pillars includes active pillars 208-1 through 208-5, which are separated by isolation pillars 218-1 through 218-5. The even word line structure 200 is separated from the odd word line structure 201 by cutouts 220, 221, 222 and 223. Likewise, the odd word line structure 201 is separated from the even word line structure 200 by the cutouts 224 through 228. As a result, word lines extend between the rows of active pillars, so that for each row, there is an even word line (e.g. word line 244 terminating at cutout 226), and an odd word line (e.g. 245 terminating at cutout 222), adjacent opposing sides of each active pillar.

The active pillars at the end of each row (e.g. active pillar 202-1 and active pillar 203-5), may not be utilized in the memory operation, but are formed nonetheless as part of the process for separating the even and odd word lines.

The even word line structure 200 includes a landing pad area 265. Likewise, the odd word line structure 201 includes a landing pad area 266. Stairstep contact structures 240, 241 are used to access the individual layers. Referring to the stairstep contact structure 240 on the even word line structure 200, eight interlayer contacts 230 through 237 are formed, which contact landing pad areas on each of eight word line layers in this example. Interlayer contact 230 lands on the pad area 265 of the even word line structure 200 on the top layer. Interlayer contact 231 lands on the pad area of the even word line structure second from the top and so on, so that interlayer contact 237 lands on the even word line structure in the layer eighth from the top. These interlayer contacts can be disposed in vias as represented in the diagram, where the large dashed rectangle which encompasses word line contacts 234 through 237 is opened through four layers. The intermediate sized dashed rectangles, which enclose word line contacts 236 and 237 and contacts 232 and 233, open through two layers each. The smaller dashed rectangles, which enclose word line contacts 231, 233, 235 and 237, open through one layer each. Of course other arrangements for interlayer contacts among the word line layers can be utilized.

Figure 14:
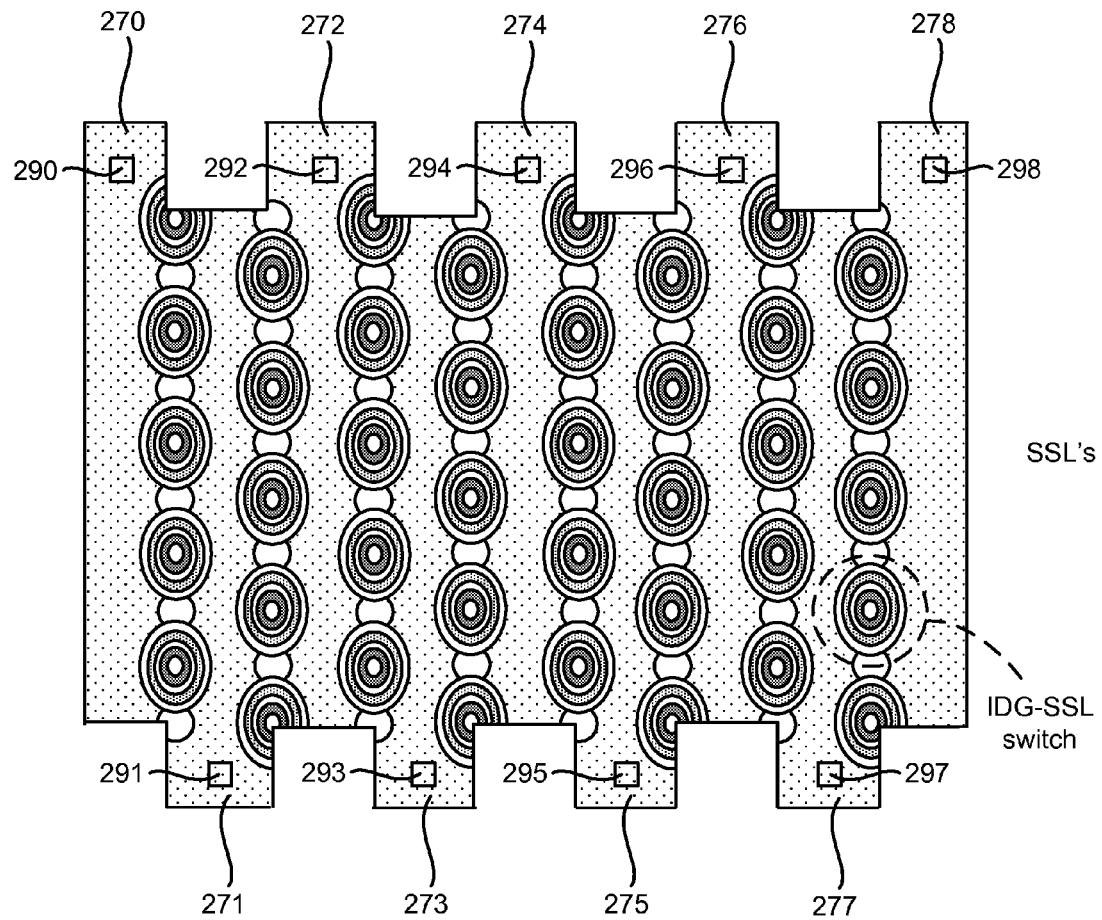
FIG. 14 is a layout view of a string select line layer, illustrating an embodiment for independent double gate SSL switches.

FIG. 14 shows a layout view of a string select line layer on top of the word line layers in a block of the memory array. The structures are formed by making a cut through an uppermost word line layer having the pattern shown in FIG. 13, along the line through the cutouts 220-223 and 224-228. This pattern results in formation of independent string select lines 270, 271, 272, 273, 274, . . . 278, between each row of active pillars. Interlayer contacts can be placed at the locations 290-298 on the even side, and 291-297 on the odd side of the structure. These interlayer contacts allow for making connection to overlying string select line structures as illustrated below.

The formation of the string select line layer as shown in FIG. 14 results in formation of independent double gate string select line switches, formed by the combination of an upper frustum of the active pillar and the adjacent independent string select lines, for each of the active columns in the array.

Figure 15:
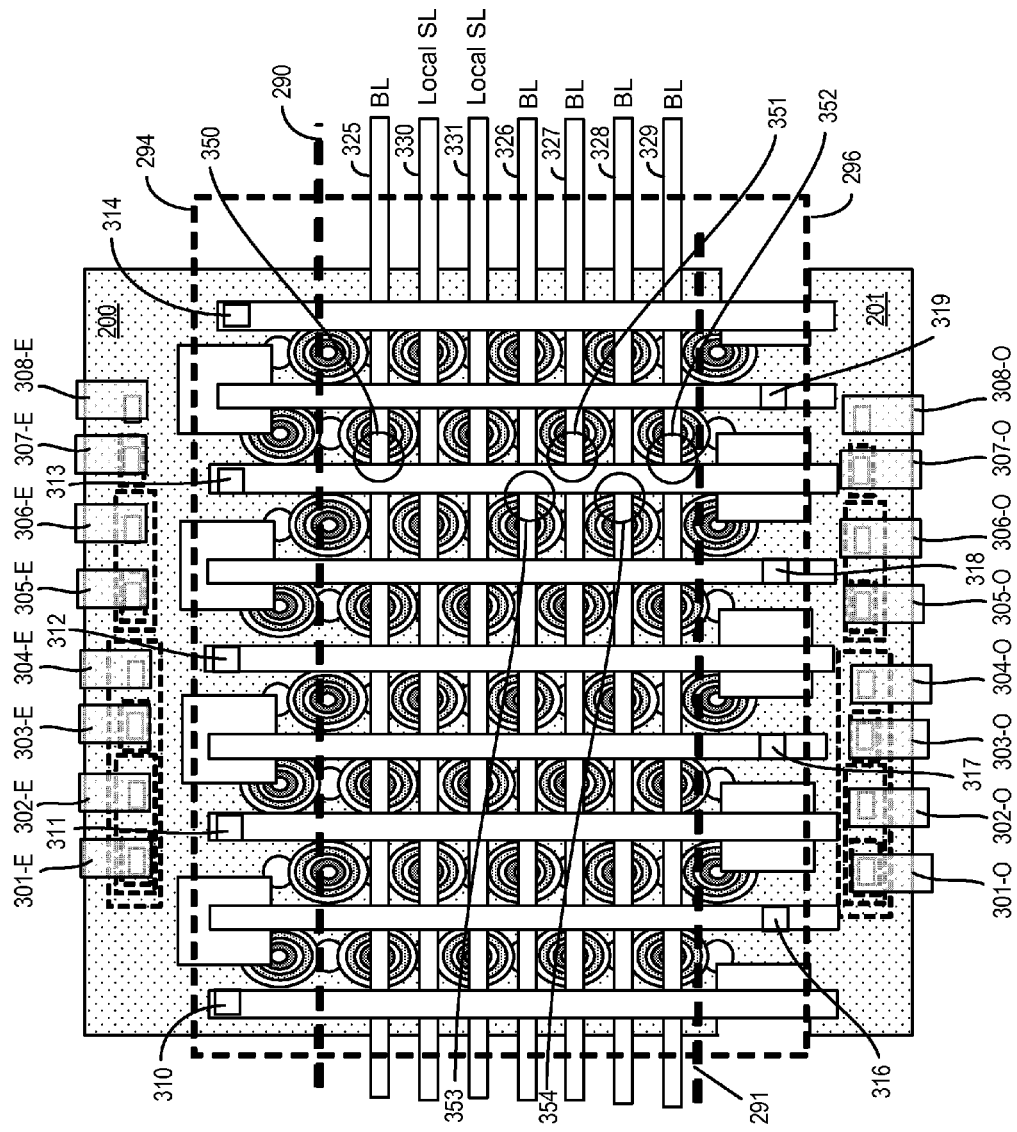
FIG. 15 illustrates a memory block as described herein.

FIG. 15 illustrates the layout of overlying patterned conductor layers, such as metal layers, which act as global bit lines, string select lines and word lines coupled to a block of the three-dimensional memory. The active array is disposed between the dashed lines 290 and 291 with unused active pillars on each end. The independent double gate string select cut is made on lines 294 and 296 resulting in a structure as shown in FIG. 14 on top of the block. The interlayer conductors on the stairstep conductor regions 240 and 241 of FIG. 13 are coupled to patterned word lines 301-E through 308-E on the even side, and 301-O through 308-O on the odd side. Likewise, overlying conductor lines configured as global bit lines, such as metal lines, are arranged in a tight pitch due to the honeycomb pattern of the active pillars. Thus conductor line 325 is disposed along one array column, conductor line 330 is disposed on an adjacent but offset column of the array. Conductor lines 331, 326, 327, 328 and 329 are disposed along respective columns of active pillars that are utilized in the memory.

In architectures using the source line conductor structure described in FIG. 11C, some of the active pillars can be dedicated as electrical local source lines coupled to other source lines in a single row by the source line conductor structure. The active pillars dedicated as electrical local source lines are maintained in the low threshold, or erased, state. In this embodiment, where the source line conductor structure provides for a U-shaped path, at least one of the columns of active pillars is used as a local source line. In this example, conductor line 330 and conductor line 331 are utilized as local source lines, so that each of the rows of active pillars includes at least one local source line. The number of local source lines implemented in this manner depends on the conductance of the structures and other factors. In one example, there can be at least one local source line for every four active pillars in a row.

A selected page (bits readable in parallel on global bit lines that can be coupled to a page buffer) is controlled by the two independent double-gate string select line switches and their corresponding even and odd string select lines (SSL(i) and SSL(i+1)). The string select lines are couple to overlying patterned conductor lines at contacts 310-314 on even side, and contacts 316-319 on the odd side. The unselected independent double gate string select line switches that are immediately adjacent opposing sides of the two selected SSL switches, can be turned off by applying a relatively high magnitude, negative voltage to the adjacent string select lines, sufficient to deplete the vertical channel structure in the active columns on the adjacent row, and thereby turn off the unselected strings. The other SSL lines (far side lines) can be set to an off voltage, such as about −0.5 V.

Using the conductor structures and block architecture shown in FIG. 15, a read bias arrangement can be understood for reading the even side 350, 351, 352 of a row of cells on a selected word line layer. According to the addressing scheme, a word line layer and an even or odd word line structure are selected using one of the word line conductors 301-E through 308-E, or 301-O through 308-O. A page is selected by the combination of the set of global bit lines coupled to the selected block and contacting the selected side of the active pillars, and the specific row selected by the string select lines on both sides of the active pillars of the selected row.

Table 1 illustrates a representative read bias arrangement.

TABLE 1

| READ BIAS | |
|---|---|
| SELECTED WL(N)_even: | Vread (set for threshold states) |
| OPPOSITE SIDE WL(N)_odd | Vinhibit (e.g. −3.3 V) |

TABLE 1-continued

| READ BIAS | |
|---|---|
| OTHER WLs: (other layers, even and odd) | Vpass, read (e.g. +6 to +7 V) |
| GSL: | Vpass, read (e.g. +6 to +7 V) |
| SELECTED BLs: (e.g. 325, 327, 329) | Vsense (e.g. +1 V) |
| UNSELECTED BLs: (e.g. 326, 328) | Vref (e.g. 0 V) |
| Local SLs: (e.g. 330, 331) | Vref (e.g. 0 V) |
| SELECTED SSL(i): (e.g. 313) | Von (e.g. +2.5 V) |
| SELECTED SSL(i + 1): (e.g. 319) | Von (e.g. +2.5 V) |
| ADJACENT SSL(i − 1): | Vdeplete (e.g. −5 to −8 V) |
| ADJACENT SSL(i + 2): | Vdeplete (e.g. −5 to −8 V) |
| FAR SSLs: | Voff (e.g. −0.5 V) |

Note that for each page, only half of the global bit lines are utilized. To sense the data in the other half of the global bit lines, the two adjacent pages on the same word line must be accessed sequentially using this bias arrangement. Since the even/odd word lines each contact one side of two the active pillars, the read method illustrated reads only the stored charge on one side of the selected word lines. In this way, each side of the cell in a selected active column can be accessed separately, establishing two charge storage sites per cell at each frustum of each pillar. Each of the two charge storage sites can store one bit per cell in some embodiments. In other embodiments, each of the two charge stored sites per cell can store more than one bit, such as two bits per side. In this manner, the cell at each frustum of each pillar stores four or more bits of data. This can result in a very high density memory array.

By opening two pages together, e.g. the page selected by SSL(i) and SSL(i+1) and the page selected by SSL(i) and SSL(i−1), all the global bit lines 325, 326, 327, 328, 329 can be used in parallel using a burst read bias such as illustrated in Table 2, to read the even word line side 350-352 of cells on one side (left side in this illustration) of a first row of active pillars, and the even word line side 353, 354 of cells on one side (right side in this illustration) of the active pillars in an adjacent row.

TABLE 2

| BURST READ BIAS | |
|---|---|
| SELECTED WL(N)_even (i): | Vread (set for threshold states) |
| 2 × OPPOSITE SIDE WL(N)_odd (i − 1) and (i + 1): | Vinhibit (e.g. −3.3 V) |
| OTHER WLs: (other layers, even and odd) | Vpass, read (e.g. +6 to +7 V) |
| GSL: | Vpass, read (e.g. +6 to +7 V) |
| SELECTED BLs: (e.g. 325, 326, 327, 328, 329) | Vsense (e.g. +1 V) |
| Local SLs: (e.g. 330, 331) | Vref (e.g. 0 V) |
| SELECTED SSL(i): (e.g. 313) | Von (e.g. +2.5 V) |
| SELECTED SSL(i − 1): (e.g. 318) | Von (e.g. +2.5 V) |
| SELECTED SSL(i + 1): (e.g. 319) | Von (e.g. +2.5 V) |
| ADJACENT SSL(i − 2): | Vsuppress (e.g. −5 to −8 V) |
| ADJACENT SSL(i + 2): | Vsuppress (e.g. −5 to −8 V) |
| FAR SSLs: | Voff (e.g. −0.5 V) |

Table 3 illustrates a representative program bias arrangement. The array with this architecture can be biased to program only one side of each active pillar at a time. This enables the use of both sides of each active pillar at each layer to store data, with either one bit per side or multiple bits per side depending on the desired implementation, and the programming algorithm utilized. In one example, the programming algorithm can be an incremental step pulsed programming sequence ISPP, with increasing pulse height and program verify steps being executed until desired threshold levels are satisfied.

In other systems, a single pass, multilevel program operation can be applied, such as described in co-pending and commonly owned U.S. patent application Ser. No. 14/153,934, entitled PROGRAMMING MULTIBIT MEMORY CELLS; by Hsieh et al., filed on 13 Jan. 2014; which application is incorporated by reference as if fully set forth herein. One example process executed by the controller to operate a multiple bits per cell memory, comprises storing a data set for programming a plurality of multi-level memory cells, the data set indicating one of a plurality of program states or an inhibit state for each memory cell in the plurality, where the plurality of program states correspond to a corresponding plurality of target program levels for the multi-level memory cells. For the data set, the method includes executing a plurality of program cycles for the plurality of multi-level memory cells, wherein a program cycle in the plurality of program cycles includes applying a program bias to multi-level memory cells in the plurality of program states, and after applying the program bias applying program verify steps for more than one of the plurality of program levels to change the data set program states to the inhibit state for the multi-level memory cells in the plurality which pass verify at the indicated target program level. The data set can be applied in each cycle in the one-pass, multiple-level operation to determine inhibit and program states for the selected cells.

TABLE 3

PROGRAM BIAS

| | |
|---|---|
| SELECTED WL(N)_even: | Vprog (ISPP, e.g. 18 to 22 V) |
| OPPOSITE SIDE WL(N)_odd | Vpass, pgm (e.g. +10 V) |
| OTHER WLs: (other layers, even and odd) | Vpass, pgm (e.g. +10 V) |
| GSL: | Vpass, pgm (e.g. +10 V) |
| SELECTED BLs: (e.g. 325, 327, 329) | Vsense (e.g. 0 V) |
| UNSELECTED BLs: (e.g. 326, 328) | Vref (e.g. 3.3 V) |
| Local SLs: (e.g. 330, 331) | Vref (e.g. 3.3 V) |
| SELECTED SSL(i): (e.g. 313) | Von (e.g. +2.5 V) |
| SELECTED SSL(i + 1): (e.g. 319) | Von (e.g. +2.5 V) |
| ADJACENT SSL(i − 1): | Vsuppress (e.g. −5 to −8 V) |
| ADJACENT SSL(i + 2): | Vsuppress (e.g. −5 to −8 V) |
| FAR SSLs: | Voff (e.g. −0.5 V) |

Table 4 illustrates a representative erase bias arrangement. A block erase bias can be applied in a periodic array that includes a plurality of cell blocks such as that illustrated in FIG. 15.

TABLE 4

ERASE BIAS

| | |
|---|---|
| ALL WLs selected block: | Vref (e.g. 0 V) |
| ALL WLs unselected blocks: | Floating |
| ALL BLs: (e.g. 325, 327, 329) | Verase (e.g. +20 V) |
| ALL Local SLs: (e.g. 330, 331) | Verase (e.g. +20 V) |
| ALL SSLs: | Vgidl (e.g. +6 V) |

Figure 16:
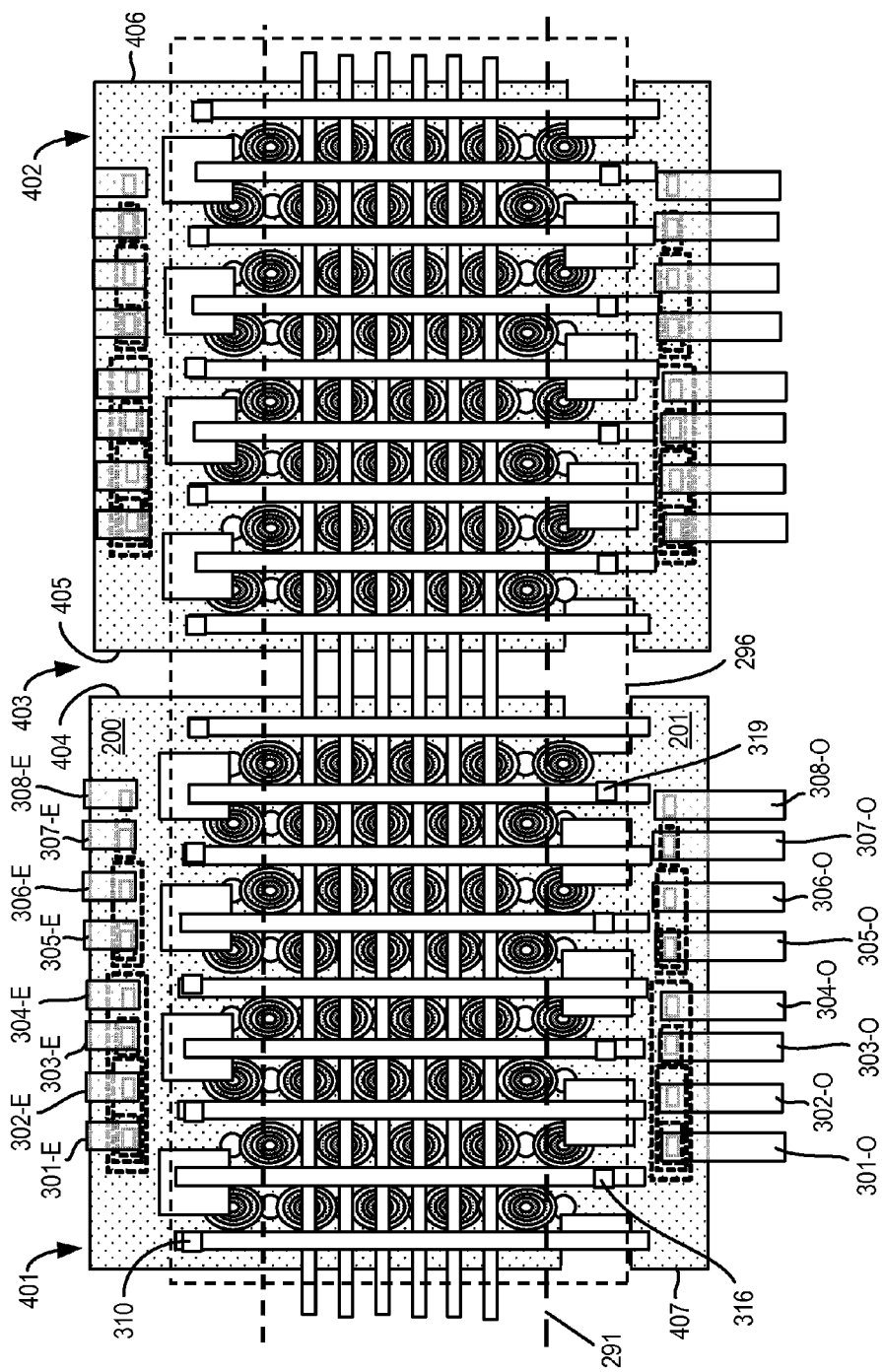
FIG. 16 is a multi-block layout illustration of a memory device as described herein.

FIG. 16 shows a layout embodiment for multiple blocks having the structure shown in FIG. 15. Reference numerals applied in FIG. 15 are used in FIG. 16 as well.

In FIG. 16, a first block 401 and a second block 402 are illustrated, and laid out along the array column direction, or the bit line direction. Thus, the global bit lines overlying block 401 are shared with block 402, and so on along the global bit lines. The number of blocks shared along a single set of global bit lines can be determined based on array characteristics.

The blocks are separated by forming an isolation region 403 between the word line layers. Also, in order to improve conductivity on the even and odd word line structures, the sides 404, 405, 406, 407 of the word line structures can be coated with a conductive material such as a silicide. A silicide can be formed using a self-aligned process known as SAlicide.

In this layout, the global bit lines can be implemented using a first metal layer of patterned conductors which extends to a page buffer shared by the blocks along the global bit lines. The word lines can also be implemented using the first metal layer of patterned conductors, which connect the even word line layers to even word line decoders, and the odd word line layers to odd word line decoders.

String select lines SSL can be implemented using a second metal layer overlying the first metal layer, to connect the SSL lines to string select decoders.

In other embodiments, other combinations of overlying patterned conductor layers can be used for interconnecting the blocks of memory cells.

Figure 17:
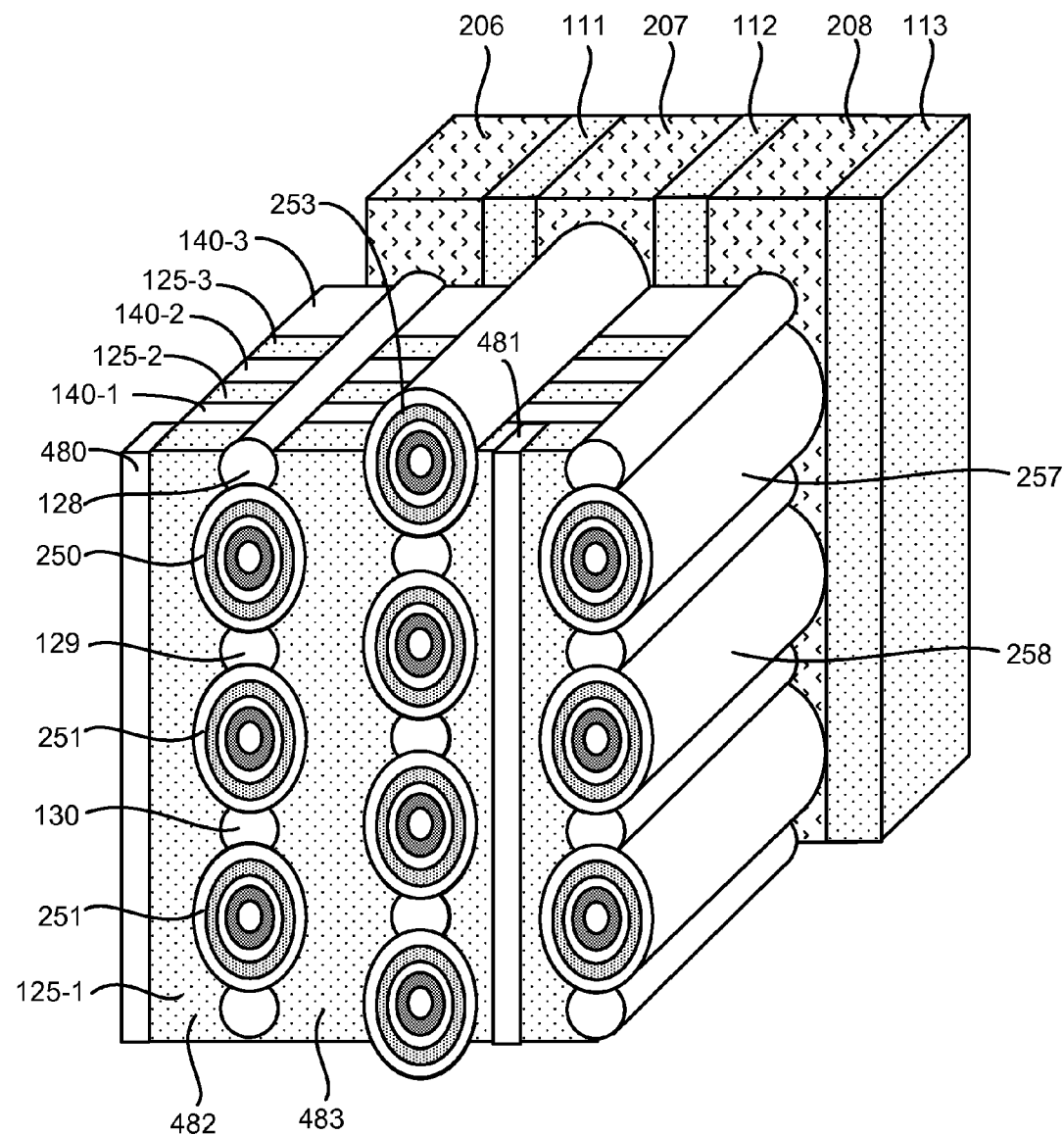
FIG. 17 illustrates a perspective view of an alternative implementation showing a double gate string select line structure.

FIG. 17 illustrates an alternative structure, in which the string select lines are implemented as double gate lines, instead of as independent double gate lines. In this example, the string select line layer of the word line material has a relaxed pitch, allowing space for isolation cuts 480, 481 in the SSL layer between pairs of rows of active pillars. The string select lines extend to a contact area 482 on one end of each row, with an interlayer contact 483 providing for a connection to an overlying patterned conductor line. The double gate string select line structure can simplify the decoding process for some operating modes of the memory device.

Figure 18:
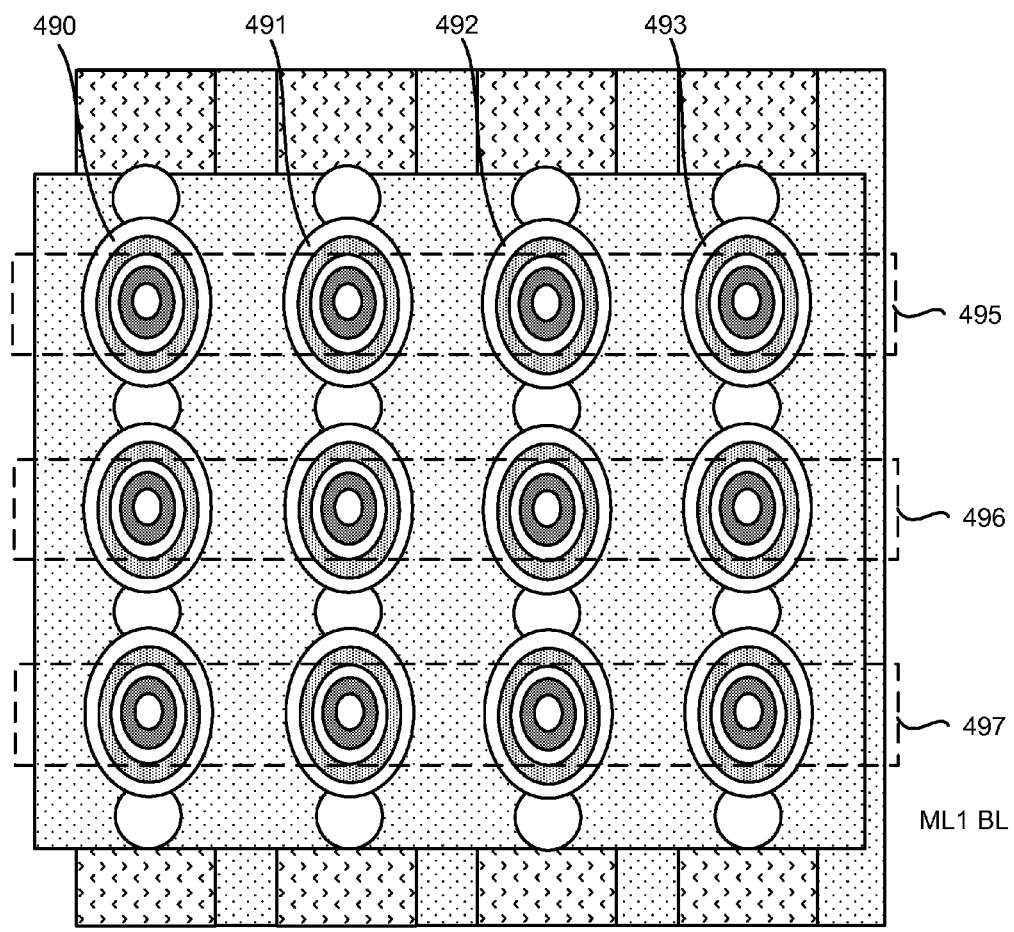
FIG. 18 illustrates an alternative layout view for a 3D block as described herein.

FIG. 18 illustrates yet another alternative for the array layout, in which the active pillars are laid out in a "square" arrangement as opposed to a "twisted" or "honeycomb" arrangement. Thus, the active pillar (e.g. 490) in the first column along a row is aligned in the array column direction with the active pillars in each row (e.g. 491, 492, 493) along the column. The overlying metal bit lines 495, 496, 497 contact an active pillar in each row, rather than in every other row as illustrated in the honeycomb layout. While this square layout is less complicated, it comes at the cost of greater bit line pitch, and less density.

Figure 19:
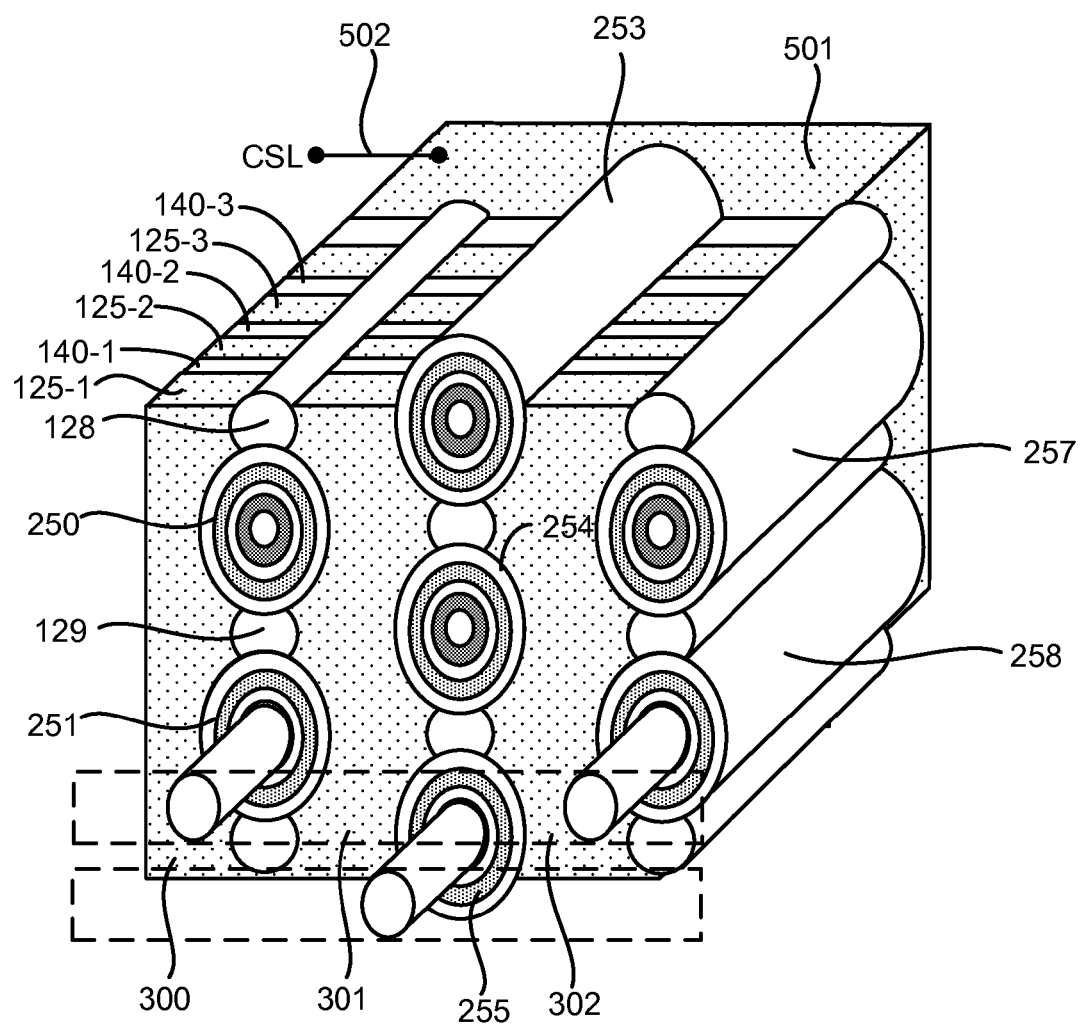
FIG. 19 illustrates an alternative implementation with a substrate source line for a 3D array as described herein.

FIG. 19 illustrates an alternative source line conductor structure, compared to that discussed above with respect to FIG. 11B. Reference numerals from FIG. 11B are used again where appropriate. In this example, a doped polysilicon or other conductive layer 501 (isolated from the substrate) is disposed at the bottom of the array of active pillars as a common source line CSL. An interlayer contact (schematically 502) is disposed on the array, such as between each block, or in a pattern around the blocks, for connecting the doped conductor region 501 to a source side reference voltage circuit or a bias voltage circuit for the common source line CSL.

Figure 20:
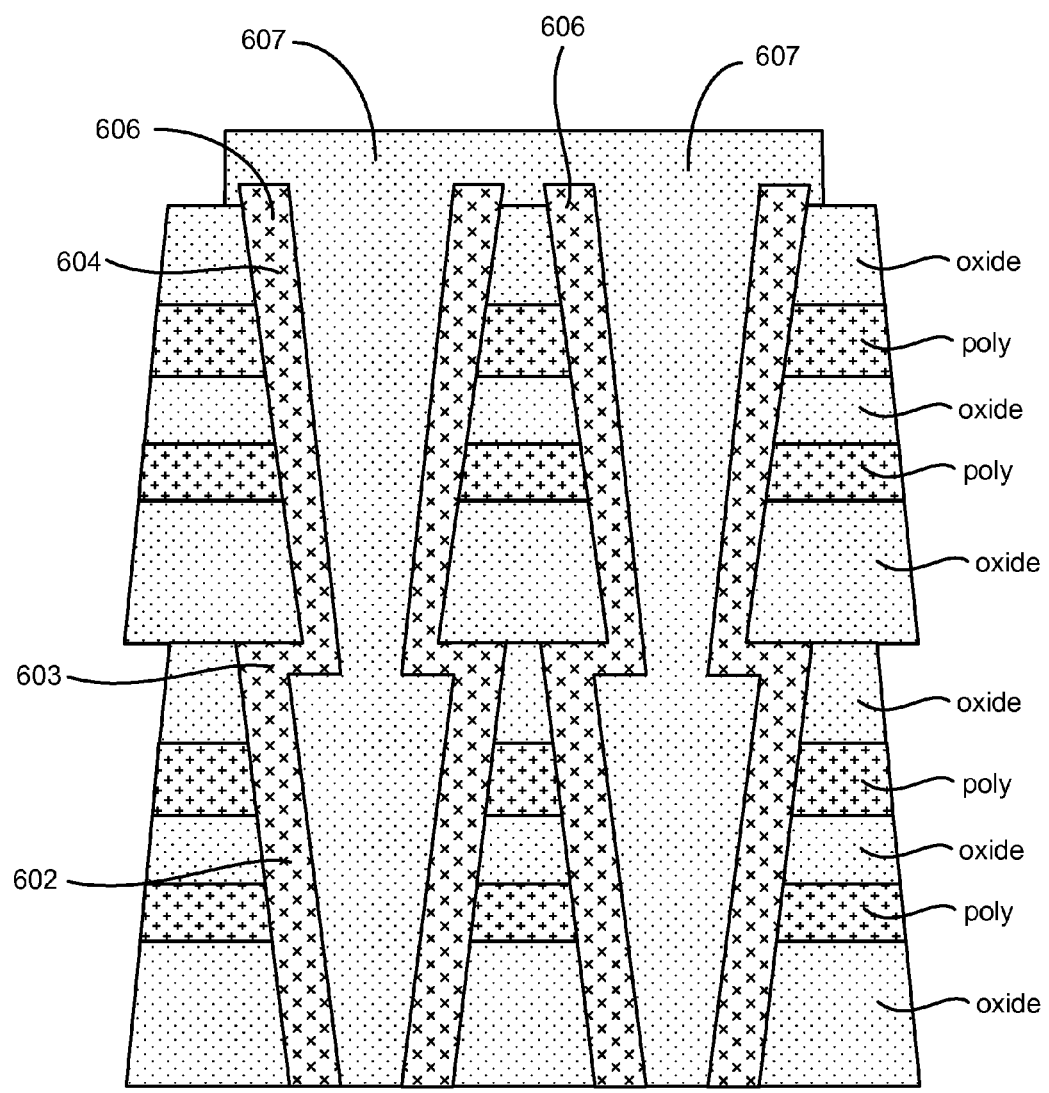
FIG. 20 illustrates a structure having an increased number of word line layers, for a vertical channel NAND structure.

FIG. 20 illustrates a technique for increasing the density of a block of memory cells, by increasing the number of word line layers. Because the etching processes have a slight taper angle, less than about 89.5°, for a structure with a large number of word line layers, the dimension of the hole at the bottom layer may be significantly less than that at the top layer, limiting the pitch of the array for a large stack. Also, mechanical bending of the structures can be another limiting factor to the depth of the etch. Thus, in the embodiment represented by FIG. 20, the hole etch process for at least the active pillars, and also for the isolation pillars if desired, can be divided into more than one etch step. The process involves forming a first stack of word line layers (there can be many more than the two in the illustration) separated by isolation layers, etching the word line layer patterns, including holes for the isolation material and for the active pillars. Next, the stack is planarized, and a second stack of word line layers is formed over the structure. Then the word line layer patterns are etched in the second stack in registration with the pattern applied in the first stack. As a result, the holes for the active pillars have a lower portion with a tapered wall 602, a transition region 603 between the lower portion in the upper portion, and an upper portion with a tapered wall 604. Then, after formation of the holes for the active pillars, the dielectric charge trapping layers are deposited followed by deposition of the material for the vertical channel structures. The dielectric charge trapping layers 606 and vertical channel structures 607 should be deposited after patterning of the upper stack, in order to guarantee that they are electrically connected.

Figure 21:
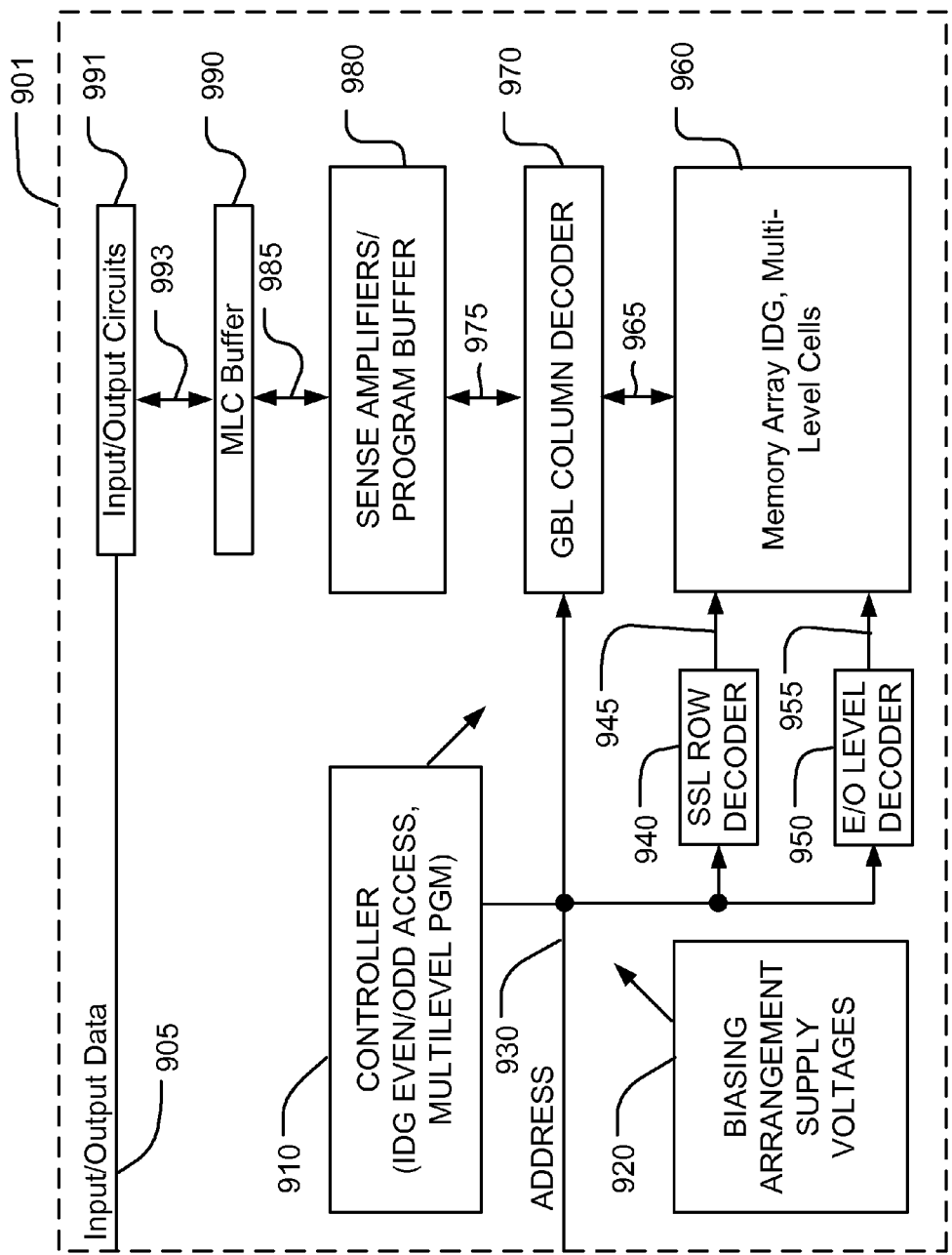
FIG. 21 is a simplified block diagram of an integrated circuit memory having an independent double gate vertical channel memory array, with multibit-per-side-of-the-cell programming technologies.

FIG. 21 is a simplified chip block diagram of an integrated circuit 901 including a 3D, independent double gate, vertical channel NAND array. The integrated circuit 901 includes a memory array 960 including one or more memory blocks as described herein with independent double gate, vertical channel cells, having multiple bits per cell on an integrated circuit substrate.

An SSL decoder 940 is coupled to a plurality of SSL lines 945, arranged in the memory array 960. An even/odd level decoder 950 is coupled to a plurality of even/odd word lines 955. A global bit line column decoder 970 is coupled to a plurality of global bit lines 965 arranged along columns in the memory array 960 for reading data from and writing data to the memory array 960. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 21, control logic 910, using a bias arrangement state machine, controls the application of supply voltages generated or provided through the voltage supply or supplies in block 920, such as read, erase, verify and program bias voltages. The control logic 910 is coupled to the multi-level buffer 990 and the memory array 960. The control logic 910 includes logic to control multiple-level program operations. In embodiments supporting the independent double gate vertical NAND structures described herein, the logic is configured to perform the method of:

selecting a layer of memory cells in the array, such as using a word line layer decoder;

selecting a side of the vertical channel structures in the selected layer such as by selecting an even or odd side word line structure;

selecting vertical channel structures in a selected row in the array such as by using SSL switches on the rows of vertical channel structures; and storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, so that a selected cell in a selected frustum of a vertical channel structure in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages $V_T$.

Figure 22:
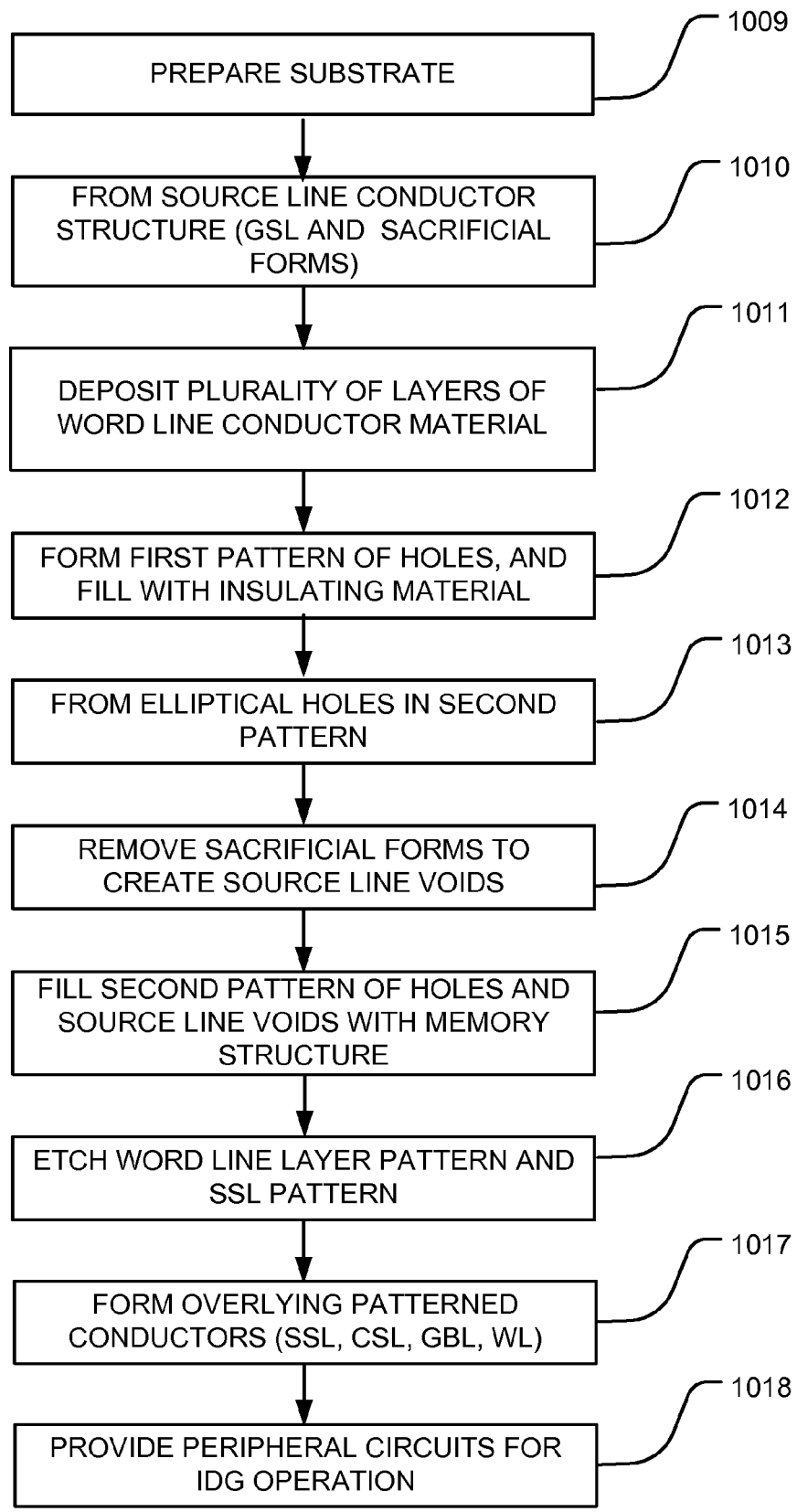
FIG. 22 is a simplified flow diagram of a manufacturing process is described herein.

FIG. 22 is a flow chart illustrating a method for manufacturing a memory device. The method includes identifying areas on a substrate for formation of 3D memory blocks having a structure like that of FIG. 15. The flowchart begins with preparing a substrate for formation of the three-dimensional vertical channel NAND array (1009). This process can include forming an insulating layer over a semiconductor substrate, or other isolation structure, in the region of the memory array. A source line conductor structure is then formed on the prepared substrate (1010). This process can include steps discussed above in connection with FIGS. 6 and 7, in which a pattern of ground select lines and sacrificial forms are formed in rows in the memory array area.

A plurality of layers of word line conductor material is then formed over the source line conductor structure (1011). The layers of word line conductor material are separated by layers of insulating material, and are used for formation of the word line conductor structures and string select line conductor structures. A first pattern of holes is etched through the stack of layers of word line conductor materials, and then the holes are filled with insulating material to form the insulating pillars utilized in the array, as shown in FIGS.

8A-8B (1012). A second pattern of holes is etched through the stack of layers of word line conductor materials, in the matter illustrated in FIGS. 9A-9B (1013).

Then, the sacrificial forms beneath the second pattern of holes are removed as illustrated in FIG. 10, to form source line voids (1014). The process then includes filling the holes in the second pattern, and the source line voids with memory structure and materials, including a dielectric charge trapping structure and vertical channel structure as illustrated in FIGS. 11A-11C (1015). The process also includes etching the word line layer pattern in the plurality of layers of word line conductor material, and etching a top layer of word line conductor material according to a string select line pattern, such as the patterns illustrated in FIGS. 13 and 14, respectively (1016). Connections can be made to the ground select line structure using interlayer connectors, adjacent to each block of the memory array.

Overlying patterned conductors are formed over the memory area on the substrate, including global bit lines, common source lines, word lines, and string select lines using one or more patterned conductor layers as shown in FIG. 12 (1017). Also, peripheral circuits are provided on the substrate, typically outside of the memory area, which include bit line circuitry, word line circuitry, page buffers, sense amplifiers and the like (1018). Back-end-of-line operations are completed to form a packaged integrated circuit.

A variant of three-dimensional, vertical gate memory can be manufactured using a "gate-replacement" process. This variant is described with reference to FIG. 23 through FIG. 34.

Figure 23:
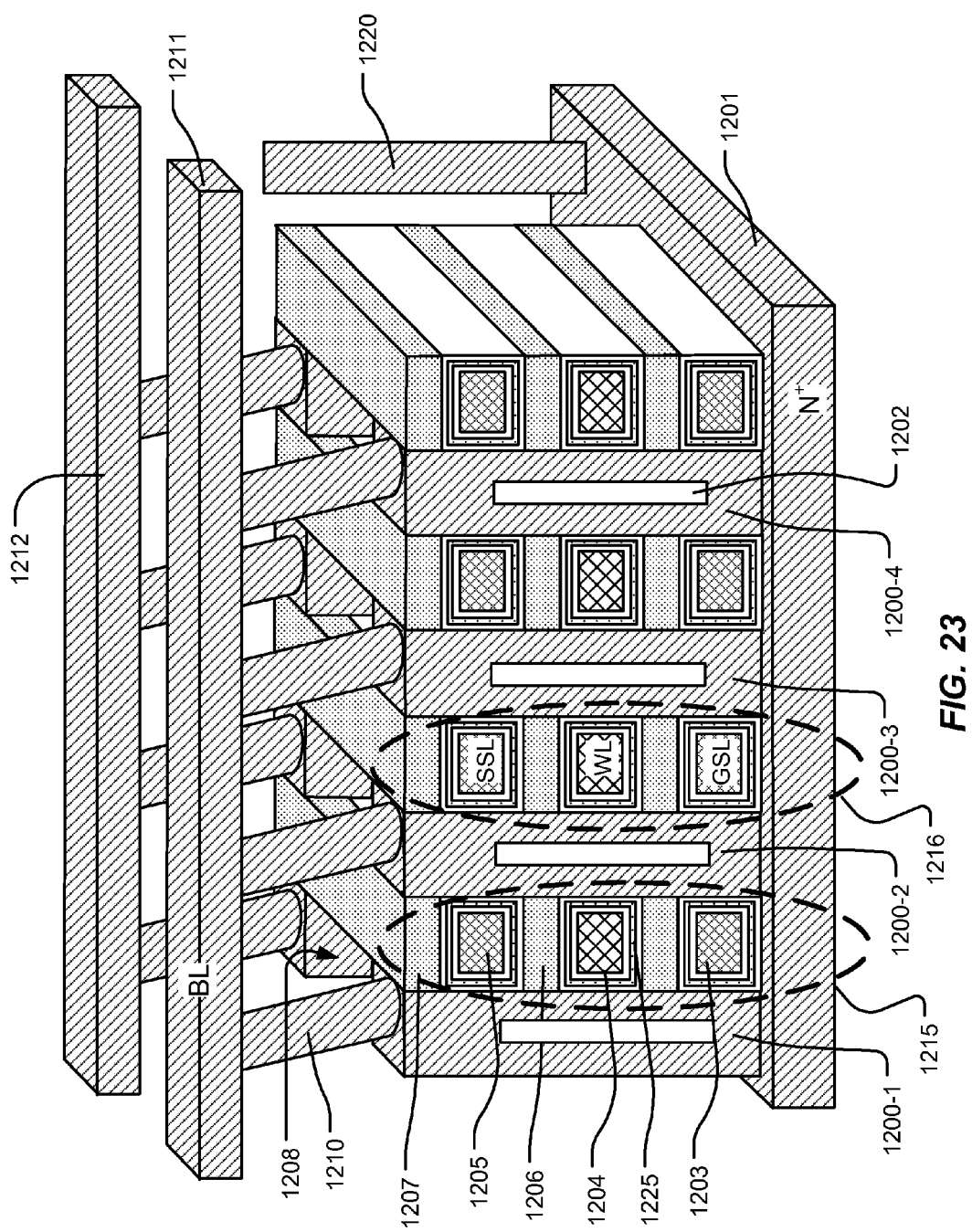
FIG. 23 is a perspective view of a variant architecture of an array of independent double gate flash memory cells as described herein.

FIG. 23 illustrates a basic structure of a 3D, vertical gate memory which can be made using the gate replacement process.

The illustrated memory block is formed on a bounded conductor layer 1201, such as a layer of doped polysilicon or other conductor. Also the bounded conductor layer 1201 can be implemented using an isolated conductive well, sometimes referred to as a triple well structure in a semiconductor substrate.

The bounded conductor layer 1201 is coupled in this example by an interlayer contact 1220 to an overlying source reference conductor (not shown). This interlayer contact 1220 can be disposed around the block in a suitable pattern as suits the particular layout chosen. The source reference conductor connects the bounded conductor layer to bias circuitry to apply bias arrangements using the bounded conductor layer 1201 as used in operating the memory array.

The structure includes a plurality of multilayer stacks (e.g. 1215, 1216) which comprise conductive strips made using word line material. In the illustration, the structure is simplified to show three layers, although there will be more layers in a practical NAND memory structure. A top strip (e.g. 1205) can be configured as a string select line for SSL vertical NAND strings in the array. The bottom strip 1203 can be configured as a ground select line. The intermediate strips (e.g. 1204) are configured as word lines. The conductive strips are separated by insulating lines (e.g. 1206). In a gate replacement process, it is possible to utilize a metal, for instance tungsten, as all or some of the word line material used to form the conductive strips 1203, 1204, 1205.

The array includes a plurality of active pillars between the stacks, each including vertical channel structures (1200-1 through 1200-4) including the channel structure 1200-2 for the active pillar between first and second multilayer stacks 1215 and 1216. In the illustrated embodiment each of the vertical channel structures (1200-1 through 1200-4) includes a central seam (e.g. 1202).

The active pillars include dielectric charge trapping structures (e.g. 1225) between the word line strips and the vertical channel structures. The dielectric charge trapping structures can be implemented as described in detail above. The dielectric charge trapping structures can include a charge storage layer, and an insulating layer between the conductive strips and the vertical channel structures, on both sides of the vertical channel.

The active pillars are connected by interlayer conductors 1210 to overlying patterned metal bit lines 1211, 1212.

In the region between the active pillars, such as the region 1208, an insulating material can be used as a fill. Alternatively, the regions, such as the region 1208, can be left as voids filled with insulating air.

In the structure, the source terminal of each of the active pillars is connected at the bottom to the bounded conductor layer 1201 on the substrate. Thus, the current path through a NAND string proceeds through a single active pillar and need not take the U-shaped path described above in connection with the alternative embodiments. Also, the layout need not accommodate the extra pillars to provide source lines that are connected at intervals within the array of active pillars. In addition, the structure can be operated as two physical multibit cells at the frustum of an active pillar between two conductive strips configured as word lines in one layer of the block. For example, in order to store four bits at a single frustum, a first word line can be used to define a cell storing two bits, and the second word line on the opposing side of the active pillar can be used to define a cell storing two additional bits.

FIGS. 24 through 34 are referred to in the description of a manufacturing process applying the gate-replacement approach to the formation of a 3D vertical channel independent double gate structure.

Figure 24:
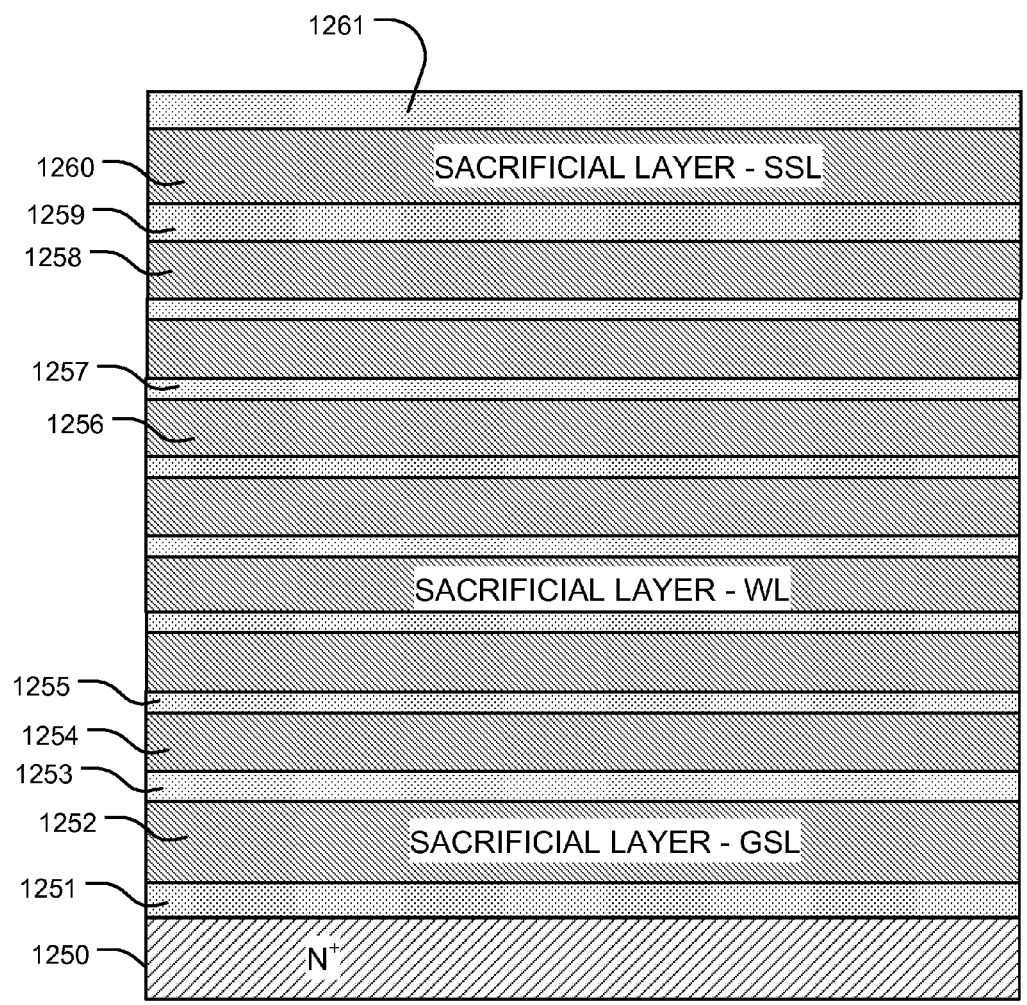

FIG. 24 illustrates a stage in the manufacturing after formation of a bounded conductor layer 1250 on a substrate, and a stack of alternating layers of insulator material and sacrificial material. In the illustrated stack of layers, the layers of insulator material including 1251, 1253, 1255, 1257, 1259 and 1261 can comprise a silicon dioxide or other interlayer insulating material. The layers of sacrificial material, including layers 1252, 1254, 1206, 1258, and 1260 can comprise a silicon nitride material or other material that can be selectively etched without etching the insulating material in the amount that would cause the structure to fail. The thicknesses of the layers can be determined based on a variety of factors including the operational characteristics of the corresponding materials used in the finished structure. In this example, sacrificial layers 1252 and 1260 are used to create the voids in which the string select lines and ground select lines are implemented. Sacrificial layers between layers 1252 and 1216, are used to form voids in which the word lines are implemented. Thus, the thicknesses of the sacrificial layers can be chosen based on the operational characteristics of the corresponding finished structure. In this example, the layer 1252 used in formation of the ground select line, can have a thickness on the order of 2000 Å for example. The layer 1260 used in formation of the string select line can likewise have a thickness on the order of 2000 Å. The sacrificial layers (1258, 1256, 1254) utilized in the formation of word lines, can have thicknesses for example on the order of 750 Å. The insulating layers can also have varying thicknesses. The insulating layer 1251 between the bounded conductor layer 1250 and the sacrificial layer 1252, used in formation of the ground select line, can have a thickness on the order 500 Å. Likewise, the insulating layer 1253 between sacrificial layer 1252 and sacrificial layer 1254, which is utilized in the formation of a word line, can have a thickness on the order of 500 Å. Also, the insulating layer 1259 between the sacrificial layer 1260 and the sacrificial layer 1258, which is utilized in the formation of a word line, can have a thickness on the order 500 Å. Insulating layers between the sacrificial layers (e.g. 1254, 1256, 1258) utilized in the formation of word lines, can have thicknesses on the order of 200 Å.

Insulating layer 1261, above the sacrificial layer 1260, can have a thickness on the order 500 Å, for example, or other amount which is suitable for providing a margin for planarization processes used in the manufacturing sequence.

The thicknesses of these layers described herein are representative of one possible design. These thicknesses can be different in different embodiments.

Figure 25B:
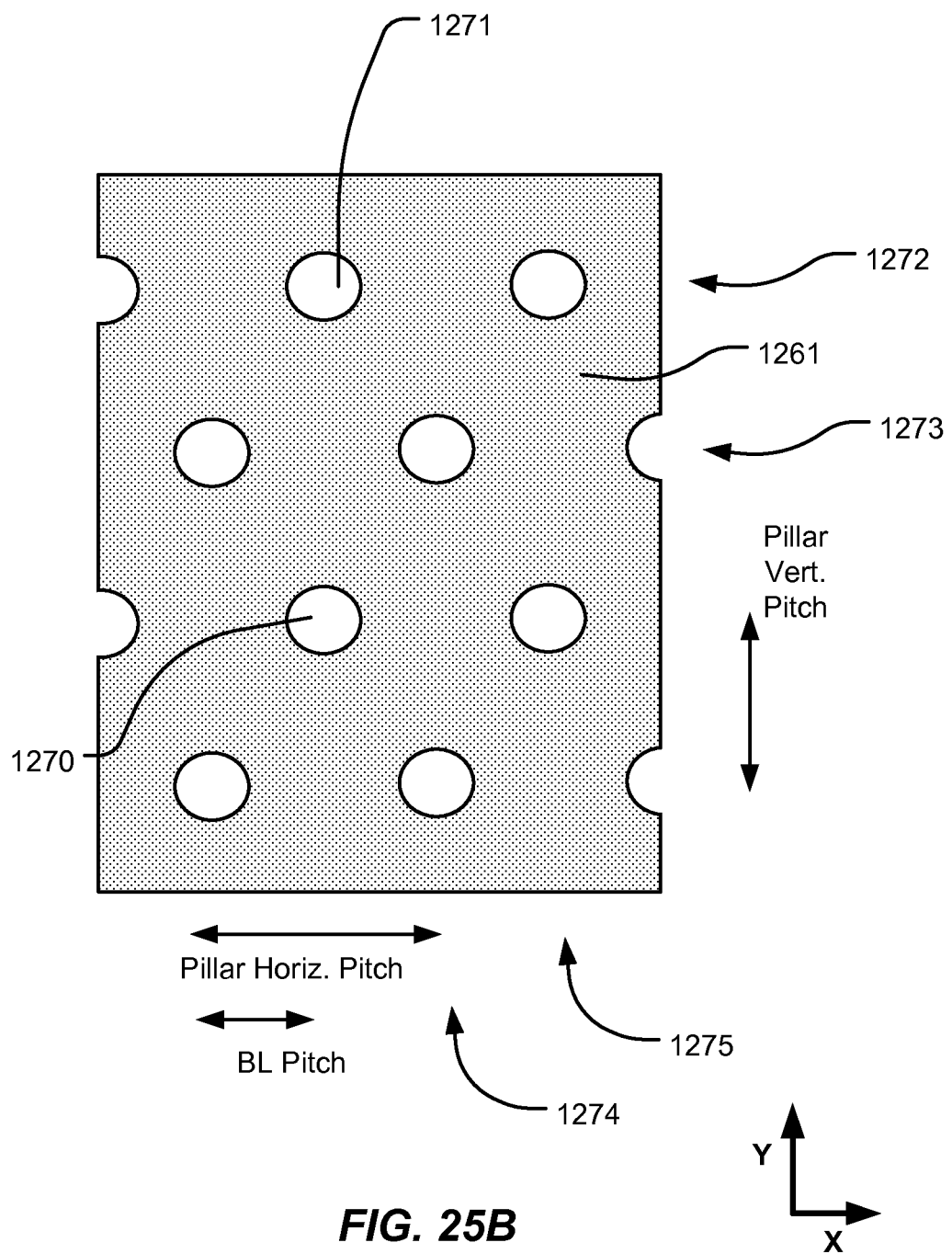

FIGS. 25A and 25B illustrate a stage in the process after a first patterned hole etch is applied to the plurality of layers. Referring to FIG. 25A, the first patterned hole etch forms an array of holes (e.g. 1270, 1271) through the plurality of stacks reaching to the bounded conductor layer 1250 to be used for formation of the vertical channel structures. The width 1275 of the holes can be on the order of 40 nm or so. The first patterned hole etch can be executed using a hole etching process as described above.

FIG. 25B illustrates a layout looking through a portion of the top insulating layer 1261, which can be utilized in which the holes (e.g. 1271) are laid out in a honeycomb pattern. The layout includes rows (e.g. 1272, 1273) of holes having a vertical pitch and columns (e.g. 1274, 1275) which are spaced horizontally to match the bit line pitch as described below. The horizontal pitch along a given row can be twice as great as the bit line pitch as illustrated. The holes (e.g. 1271) can have an elliptical shape as discussed above.

Figure 26B:
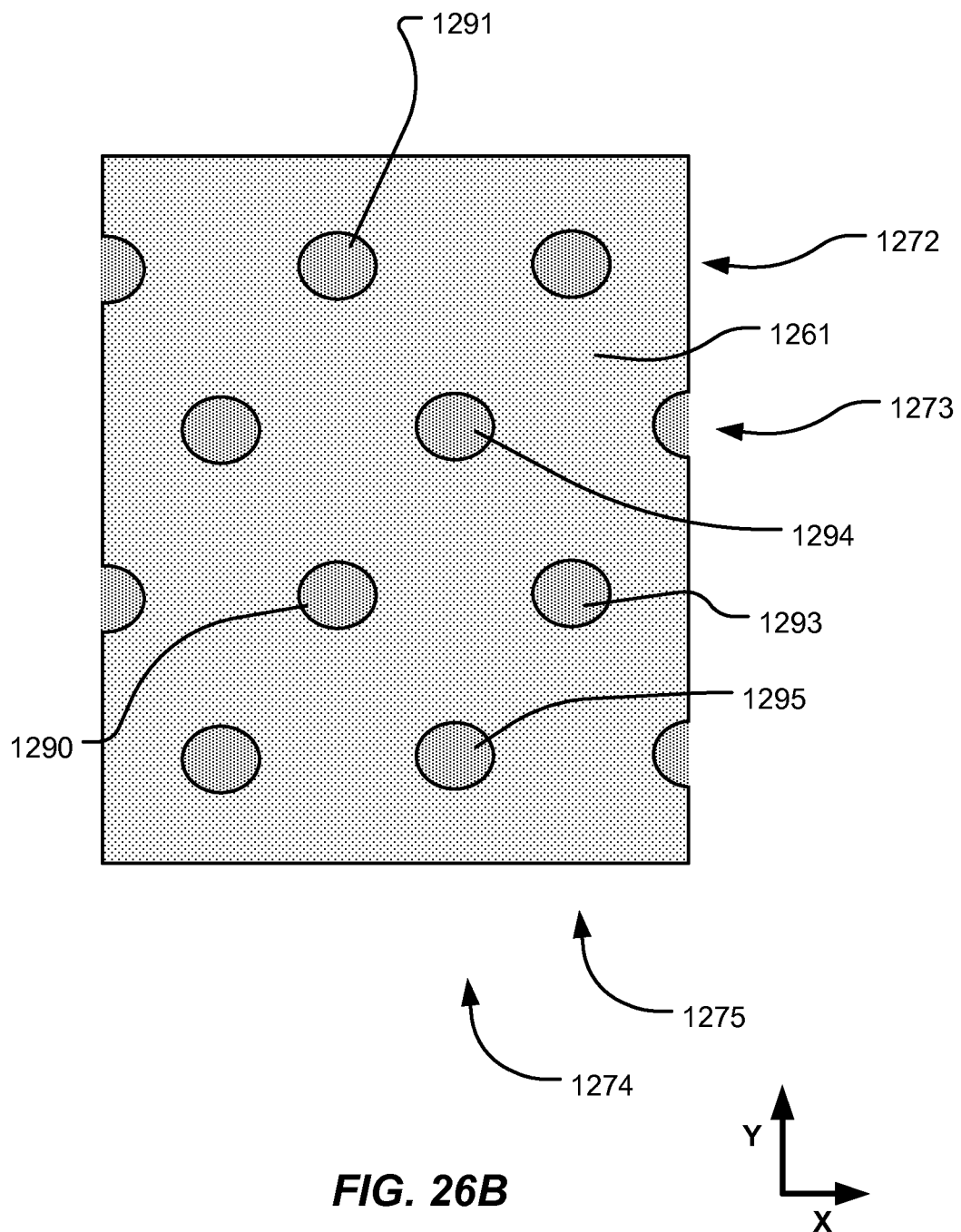

FIGS. 26A and 26B illustrate a later stage in the process, after filling the holes with a suitable semiconductor channel material, such as polysilicon. Although not shown, the polysilicon channel can have a central seam. After filling the holes, vertical channel structures (e.g. 1290, 1291, 1292) extend through the plurality of stacks to the underlying bounded conductor layer 1250. Thus for example, the bottoms 1290-B, 1291-B, 1292-B of the vertical channel structures 1290, 1291, 1292 are in physical and electrical contact with the bounded conductor layer 1250.

Referring to FIG. 26B, it can be seen that the holes are filled with vertical channel structures 1290, 1291, 1294, 1295. The rows 1272, 1273 and the columns 1274 and 1275 remain the same.

Figure 27A:
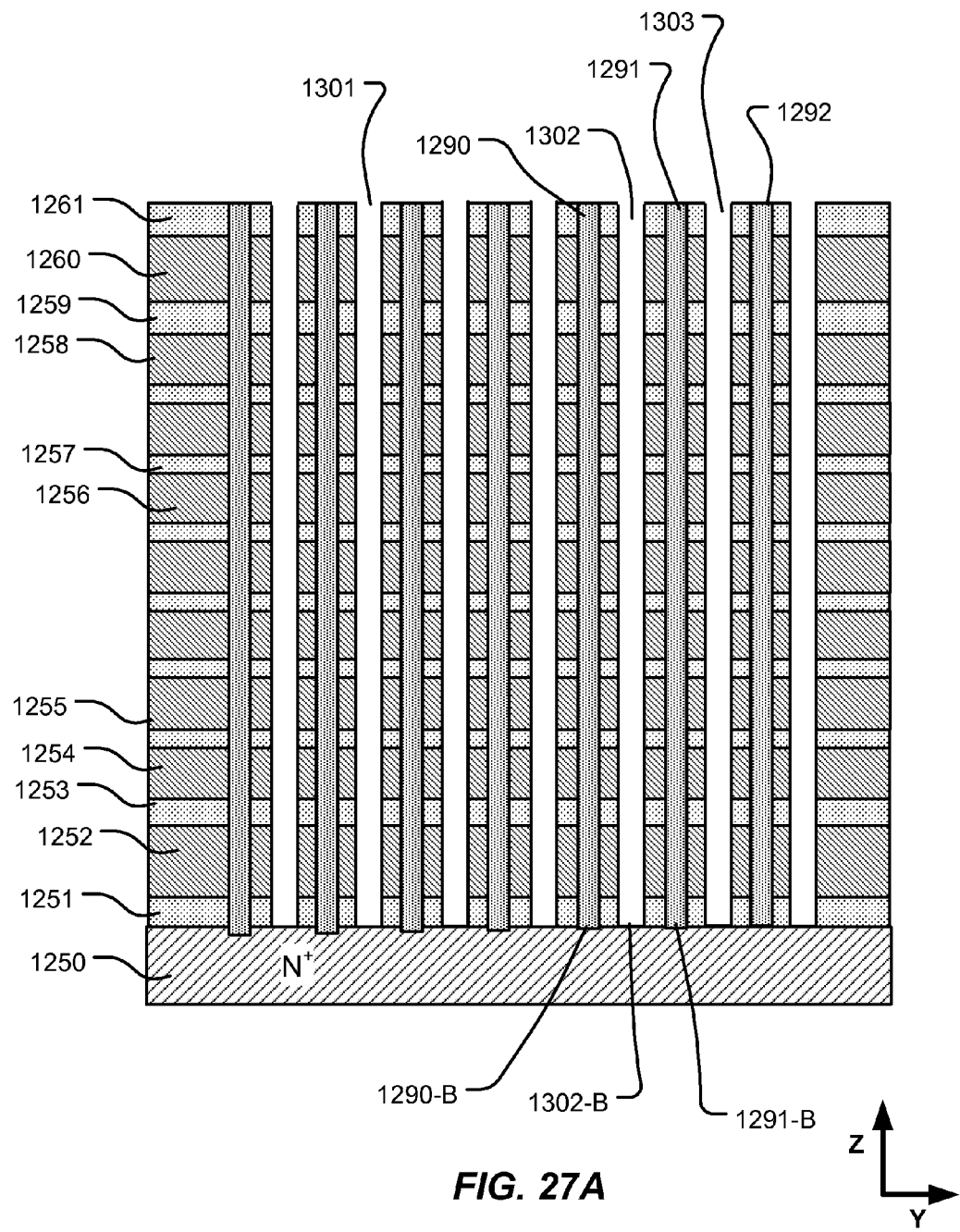
Figure 27B:
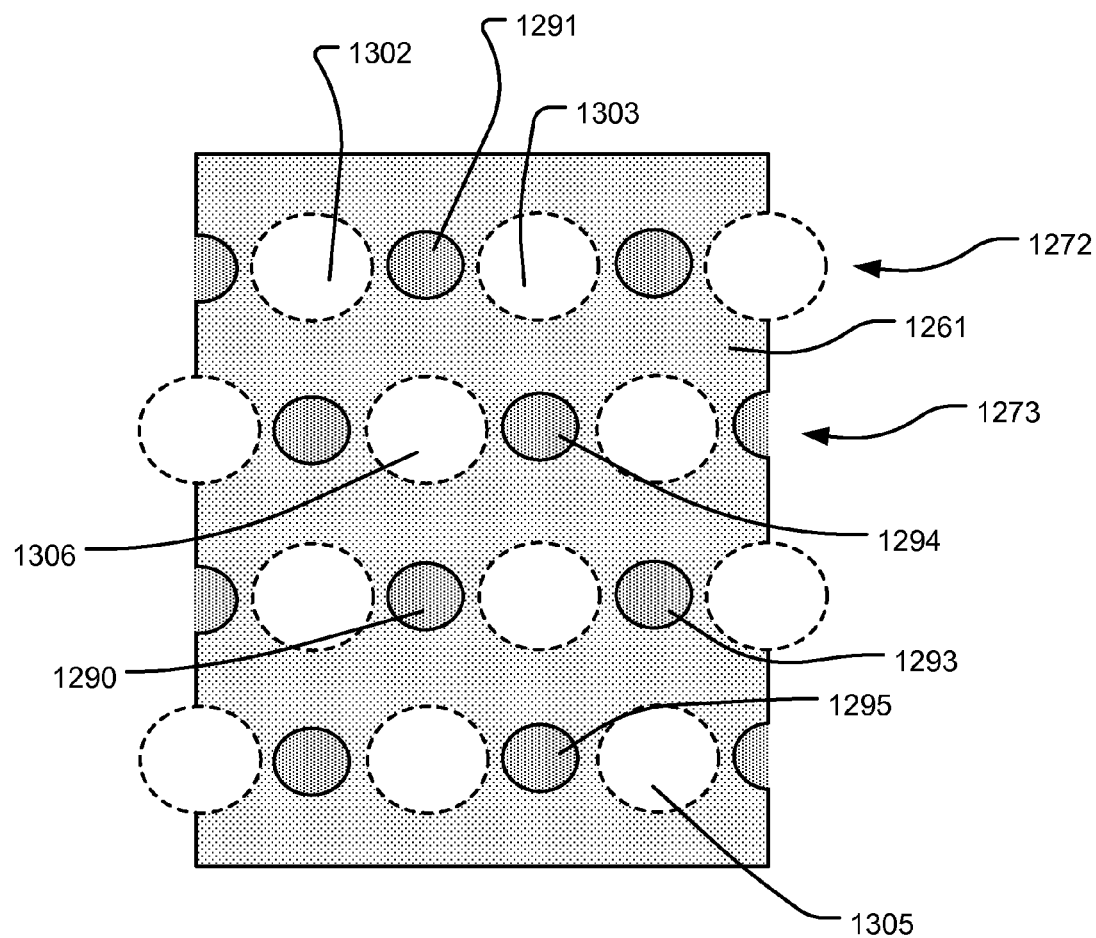

FIGS. 27A and 27B illustrate a later stage in the process, after a second patterned hole etch is applied to the plurality of layers. The second patterned hole etch forms holes between the vertical channel structures 1290, 1291, 1292, including the holes 1301, 1302, 1303. The holes 1301, 1302, 1303 extend through the plurality of layers to the bounded conductor layer 1250, so that the bottom 1302-B of the hole 1302 exposes the bounded conductor layer 1250. Alternatively, the holes could stop at the layer 1251, so long as they completely pass through all of the sacrificial layers, including the bottom sacrificial layer 1252.

As illustrated in FIG. 27B, the holes (e.g. 1302, 1303, 3005, 1306) in the second pattern are disposed between the vertical channel structures (e.g. 1290, 1291, 1293, 1294, 1295). As result of this arrangement, the columns 1274, 1275 including the vertical channel structures and the holes in the second pattern, approach formation of continuous lines through the stack. Again, the second pattern of holes can be formed using a hole etching process like that disclosed above. Also, the holes can have an elliptical shape.

Figure 28:
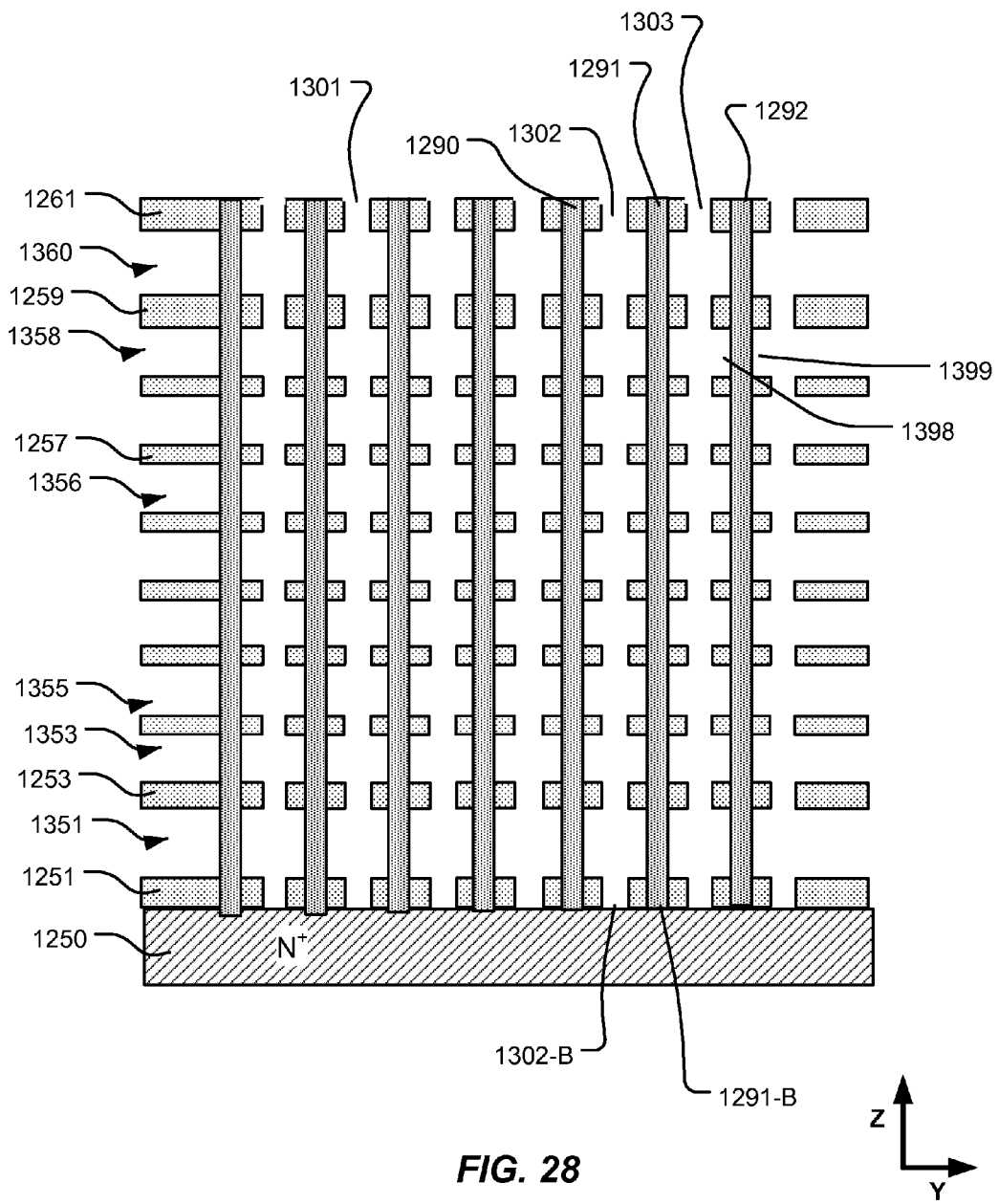

FIG. 28 illustrates yet a later stage in the process after removing the sacrificial material by etch process through the second pattern of holes. When the sacrificial material is silicon nitride, a hot phosphoric acid process can be utilized. As a result of the removal a sacrificial material, layer voids (e.g. 1351, 1353, 1355, 1356, 1358, 1360) are formed between the insulating layers (e.g. 1251, 1253, 1257, 1259, 1261). The insulating layers remain structurally supported by the vertical channel structures 1290, 1291, 1292. Also the voids expose the sides of the vertical channel structures, such as the sides 1398, 1399 of the vertical channel structure 1292 in the layer void 1358.

Figure 29A:
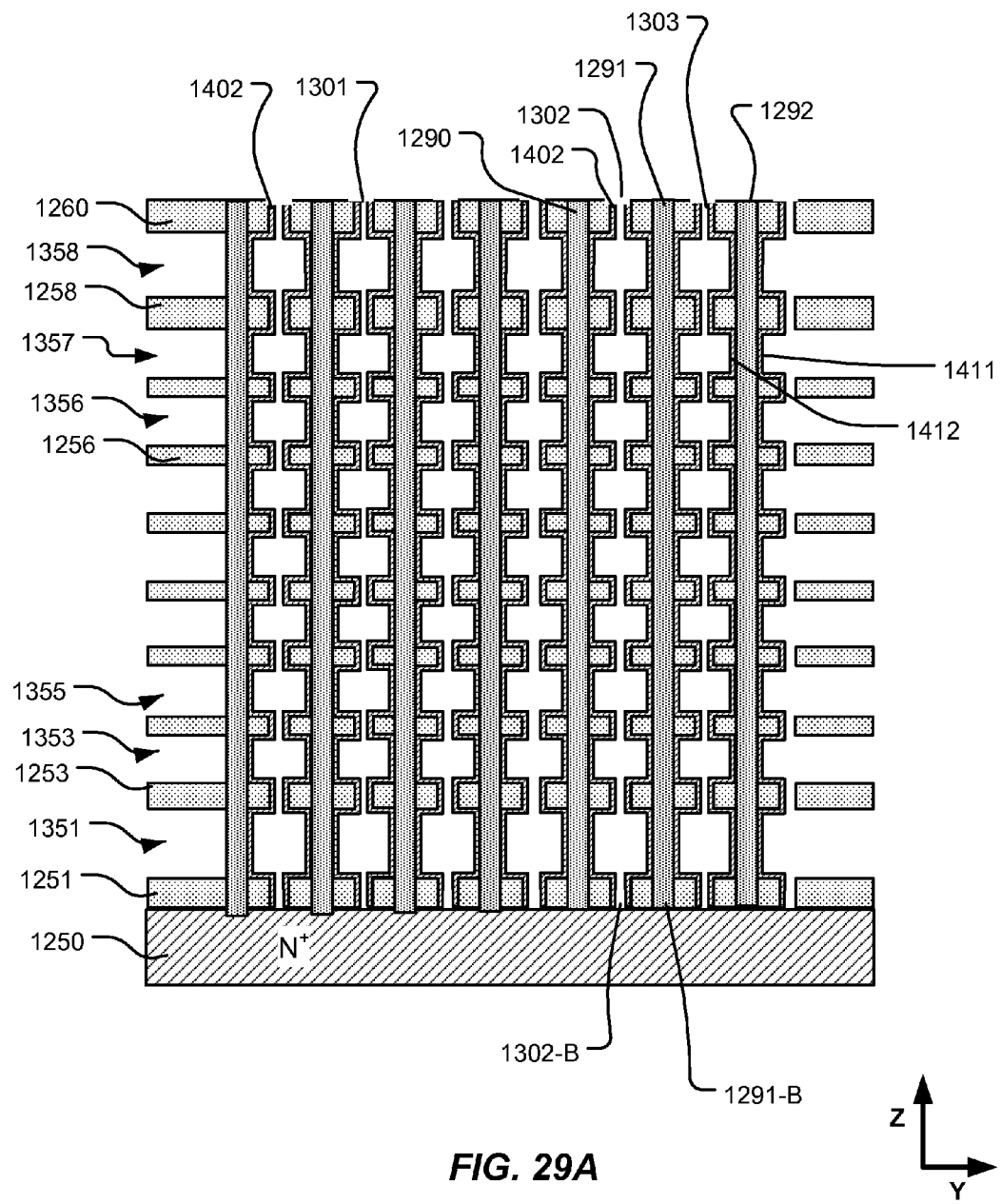
Figure 29B:
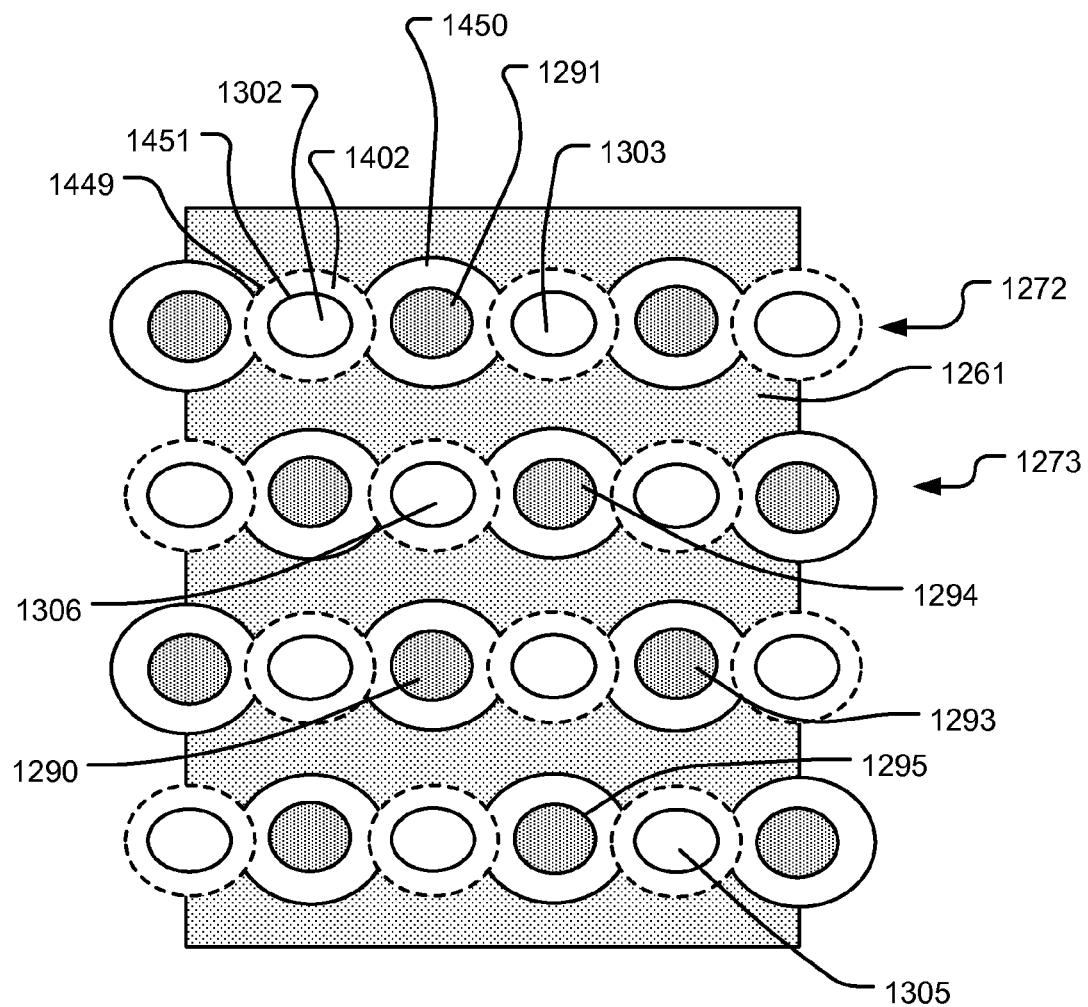

FIGS. 29A and 29B illustrate the structure in yet another stage in the process. At this stage, a multilayer dielectric charge trapping structure 1402 is formed inside the voids through the holes (e.g. 1301, 1302, 1303). The multilayer charge trapping structure 1402 includes a charge trapping layer, such as silicon nitride, a tunneling layer and a blocking layer in a variety of forms as discussed above. The blocking layer is an insulating layer that is in contact with the sidewalls of the vertical channel structures in each layer. For example, in the frustum of the vertical channel structure 1292 defined by the layer void 1357, the dielectric charge trapping structure 1402 includes dielectric charge trapping layers 1411 and 1412 on opposing sides of the vertical channel structure 1292. Thus, insulating layer acting as the blocking layer is in contact with the arcuate edge of the vertical channel structure on each side.

With reference to FIG. 29B, a top view of the layout through the top insulating layer 1261 can be seen. The layout includes an array of vertical channel structures (e.g. 1290, 1291, 1293, 1294, 1295) and a corresponding array of vertical holes (e.g. 1302, 3003, 1305, 1306). The layer 1402 of dielectric charge trapping material lines the holes and coats the vertical channel structures. Thus, referring to the hole 1302, the outside perimeter 1449 of the hole as etched has a greater radius than the inside perimeter 1451 of the hole after deposition of the dielectric charge trapping layer 1402. Also, referring to the vertical channel structure 1291, the outside perimeter 1450 of the dielectric charge trapping layer 1402 has a greater radius than the radius of the vertical channel structure 1291. As result, the holes and the dielectric charge trapping material electrically isolate the vertical channel structures along a row (e.g. row 1272).

Figure 30:
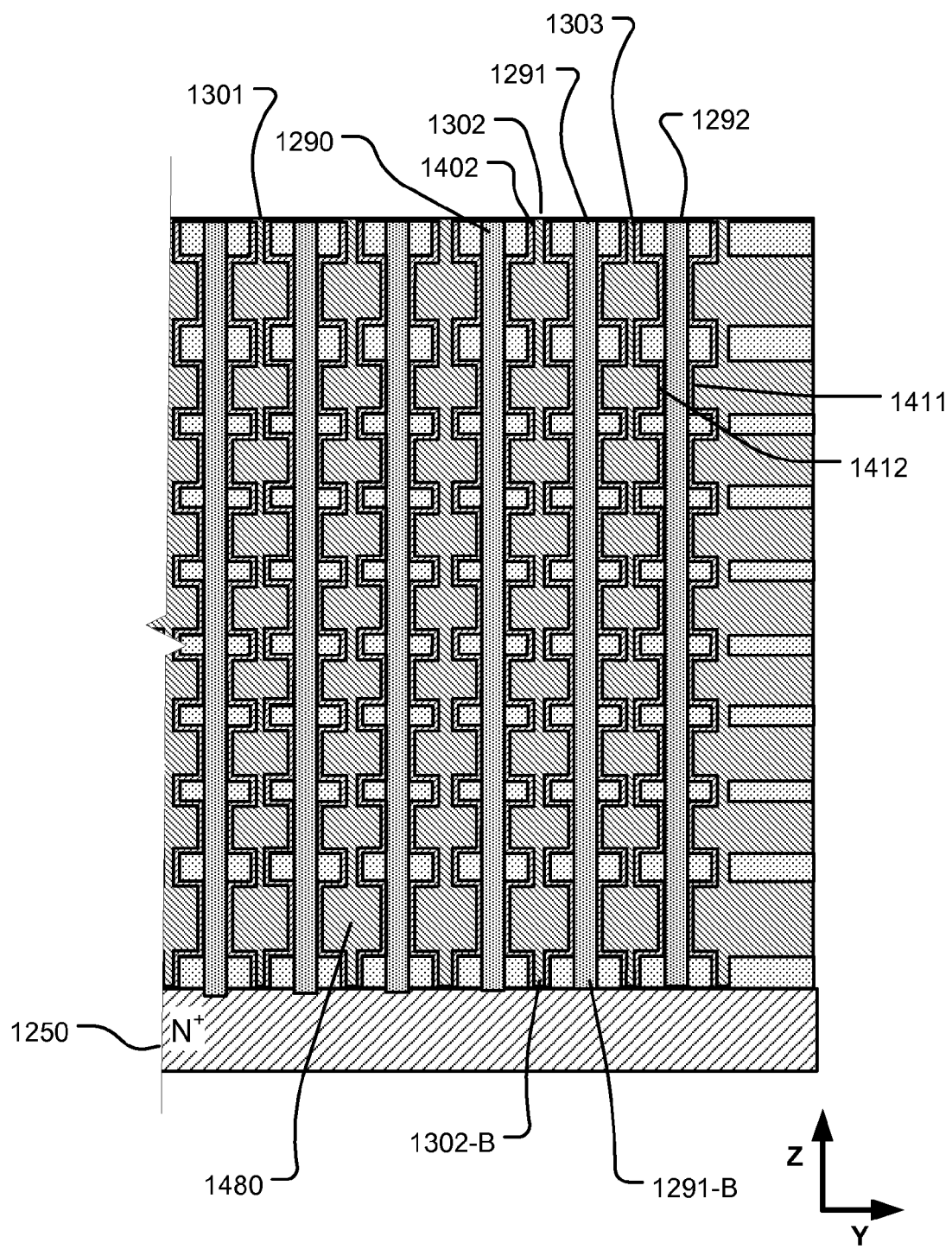

FIG. 30 illustrates the structure after a further stage, after filling the voids with a word line material 1480, such as a metal. In one example, the metal used as a word line material can comprise tungsten, which is deposited using a multilayer process including barrier layers, for example, and can conformally fill the structure over the dielectric charge trapping layer 1402.

Figure 31:
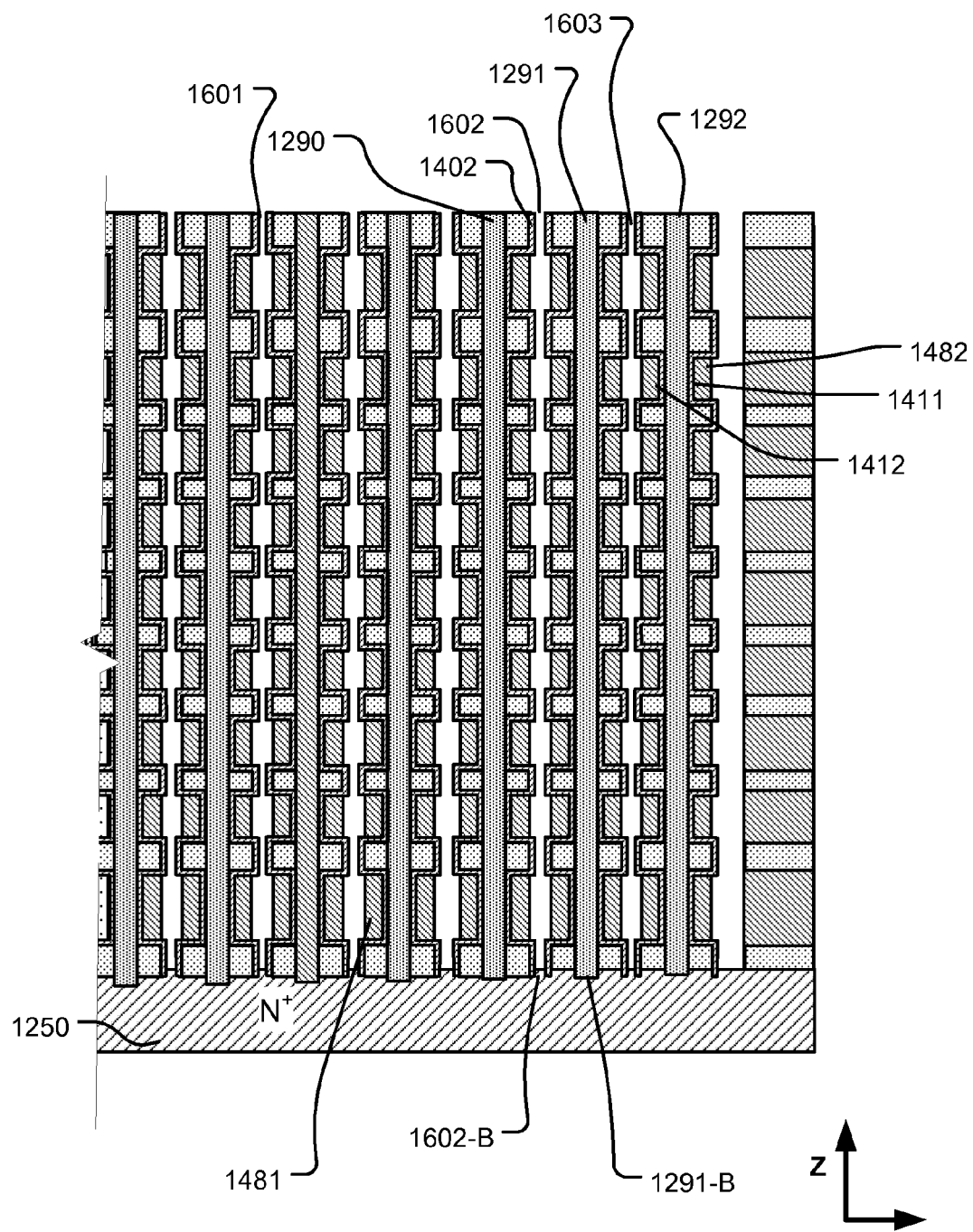

FIG. 31 illustrates a stage of the manufacturing process after a third patterned hole etch. The third patterned hole etch can be configured to form holes in the same locations as used to form holes in the second patterned hole etch. Also, a hole etching process configured for etching the word line material can be applied, using technologies like that described above. In addition, the hole etching process is continued to slightly over-etch the word line material in the sidewall direction, in order to provide margin for complete separation of the word lines on opposing sides of the vertical channel structures. As result of the third patterned hole etch, holes (e.g. 1601, 1602, 1603) are etched between the vertical channel structures (e.g. 1290, 1291, 1292). The holes 1601, 1602, 1603 extend to the underlying bounded conductor layer, so that the bottoms of the holes (e.g. 1602-B) expose the bounded conductor layer. It may be sufficient in some embodiments for the holes to extend to the first insulating layer, for example, so long as they separate the word line structures sufficiently. As a result of the etching, word line material between adjacent pillars is divided to create an independent gate (e.g. 1481, 1482) at each side of each frustum of the active pillars to be utilized as storage sites.

Figure 32A:
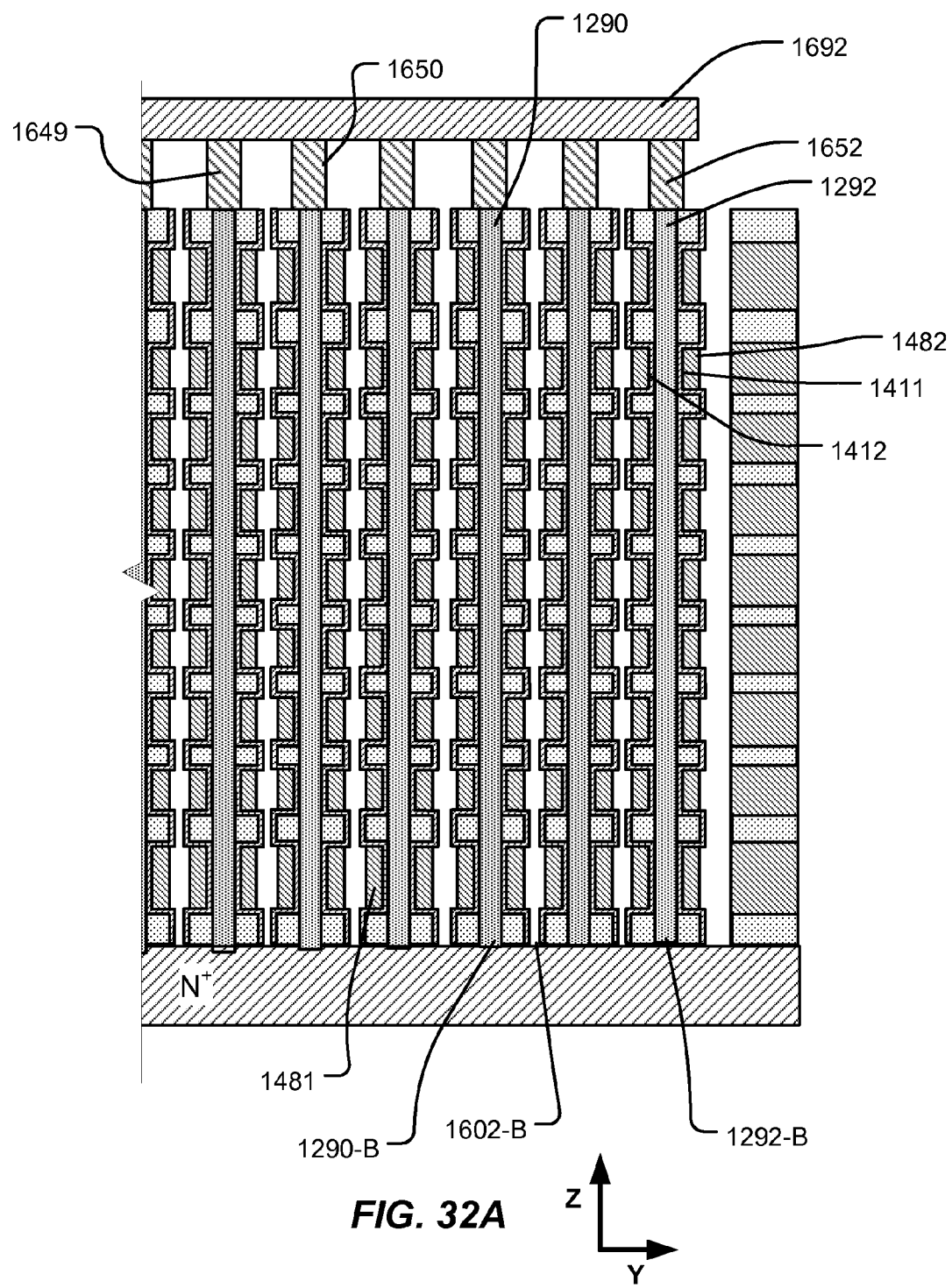
Figure 32B:
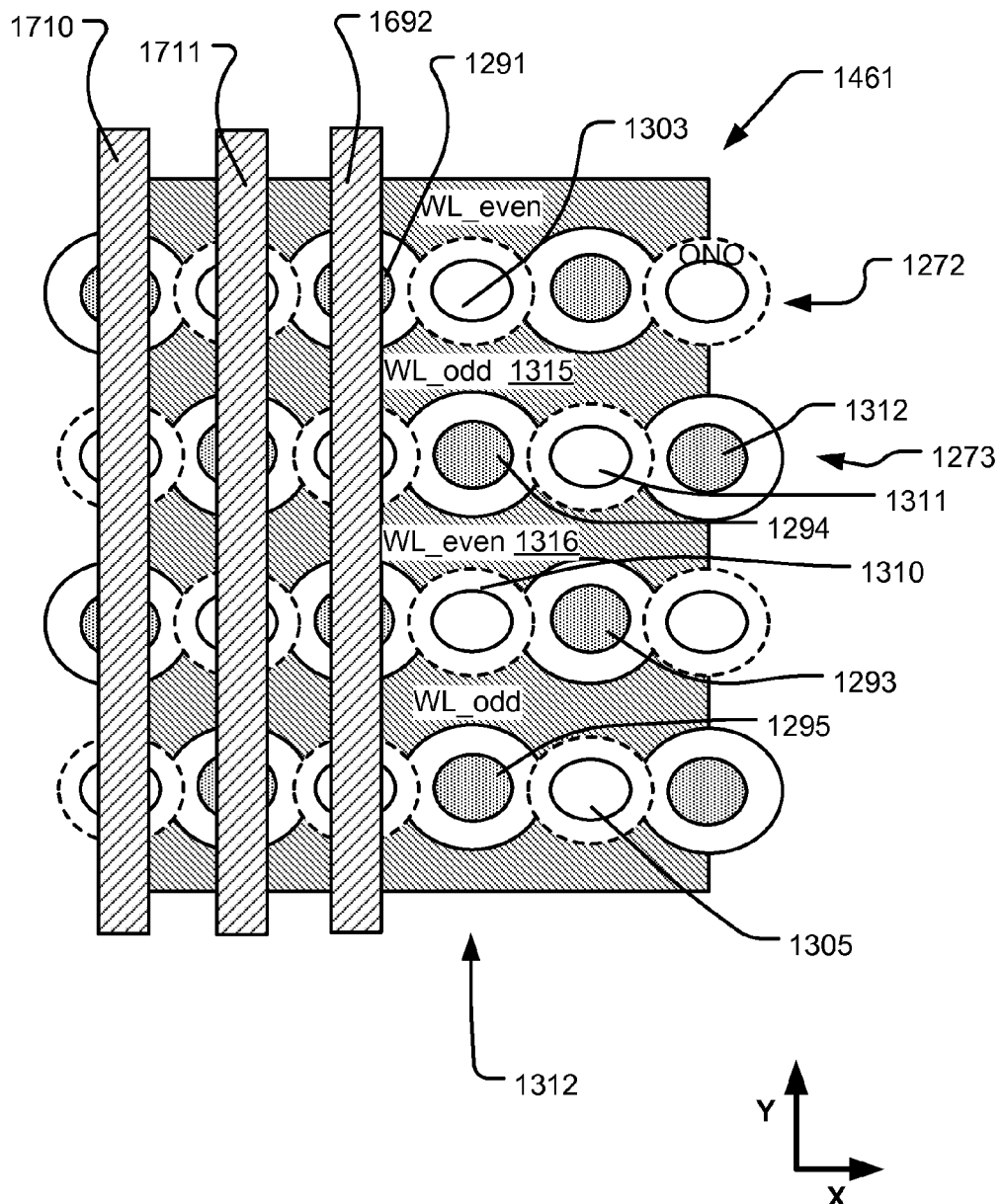

FIGS. 32A and 32B illustrate a stage in the process after formation of a patterned metal layer including bit line 1692. Optionally, the holes formed by the third patterned hole etch remain open, providing isolation between the word lines. Alternatively, a fill process can be applied to fill the holes with an insulating material. The formation of the patterned metal layer includes formation of interlayer connectors (e.g. 1649, 1650, 1652) which contact corresponding vertical channel structures (e.g. 1290, 1292). Over the interlayer connectors, patterned bit lines, including bit line 1692, can be formed in a direction (Y-direction) which crosses the direction (X-direction) of the word lines.

Referring to FIG. 32B, the layout of a given word line layer 1461 and overlying bit lines (e.g. 1692, 1710, 1711) can be seen, including the overlying bit line 1692 illustrated in FIG. 32A. The overlying patterned metal layer can include a plurality of bit lines, including the bit lines 1710, 1711, 1692, and others not illustrated. A given column (1312) of the array of active pillars can include the hole 1303, the active pillar including vertical channel structure 1294, the hole 1310, and the active pillar including vertical channel structure 1295. A given row (1273) of the array can include the active pillar including vertical channel structure 1294, the hole 1311, and the active pillar including vertical channel structure 1312. The row 1273 isolates the word line material on one side of the active pillar 1294, from the word line material on the opposing side of the active pillar including vertical channel structure 1294. As result, and odd word line 1315, and an independent even word line 1316, are formed. At the frustum of the active pillar including vertical channel structure 1294 crossed by the odd word line 1315, and the even word line 1316 in a given layer, two charge storage sites are established.

Figure 33:
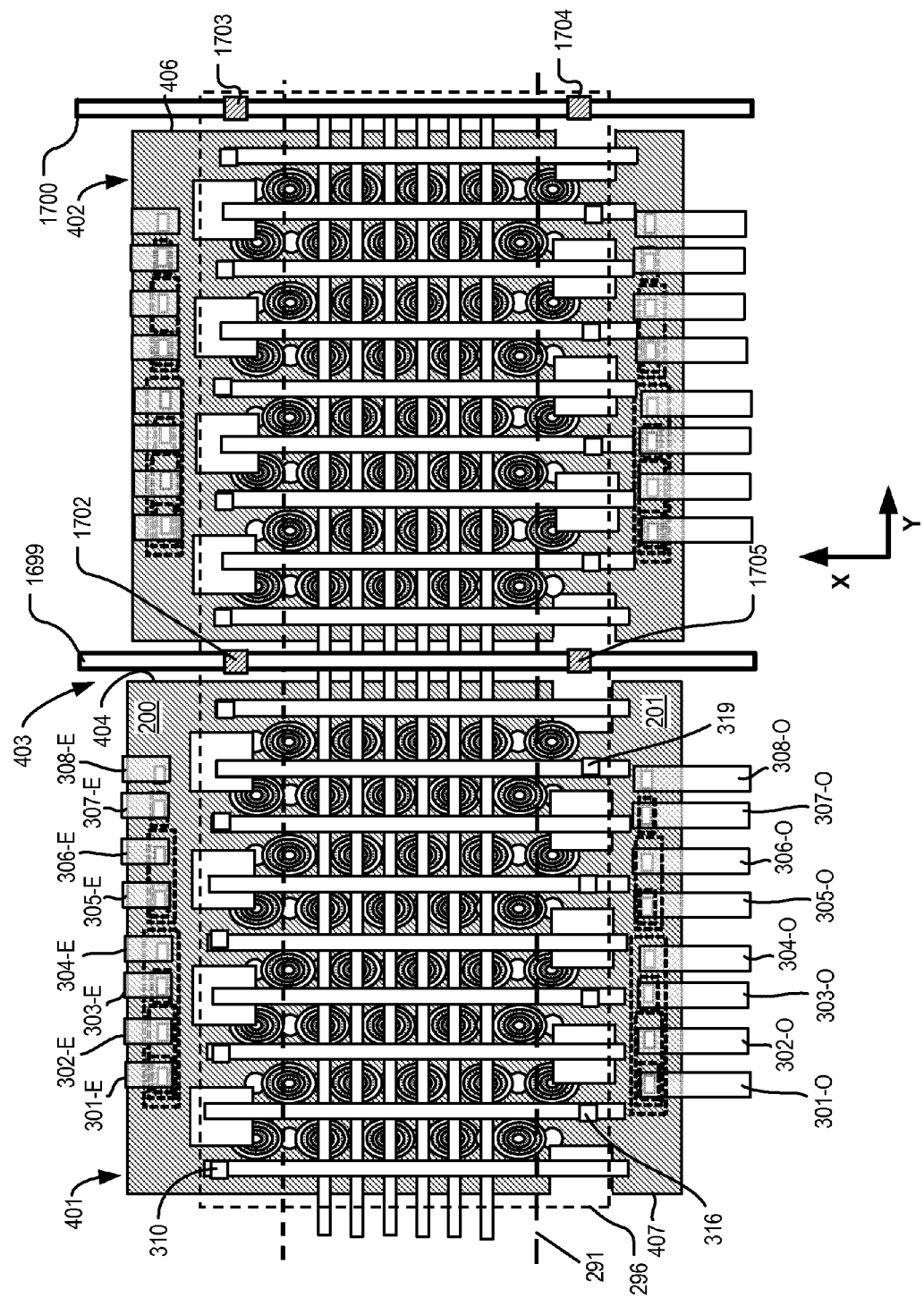
FIG. 33 is a layout view of a string select line layer, illustrating an embodiment for independent double gate SSL switches and source line conductors for connection to the bounded conductor layers.

FIG. 33 illustrates a block layout for the structure, which matches the layout of FIG. 16 using the same reference numerals where appropriate. The same effective layout is established using the gate replacement process. Also, the string select patterning can be executed in the same manner. As illustrated FIG. 33, source conductors formed by patterned metal lines 1699 and 1700 can be formed in a patterned metal layer over the blocks. Interlayer connectors 1702, 1705, 1703, 1704 can be formed between the patterned metal lines 1699 and 1700 and the underlying bounded conductor layer or layers. The underlying bounded conductor layer can be shared in common among multiple blocks, or separated for independent source biasing of each block as suits a particular implementation.

Figure 34:
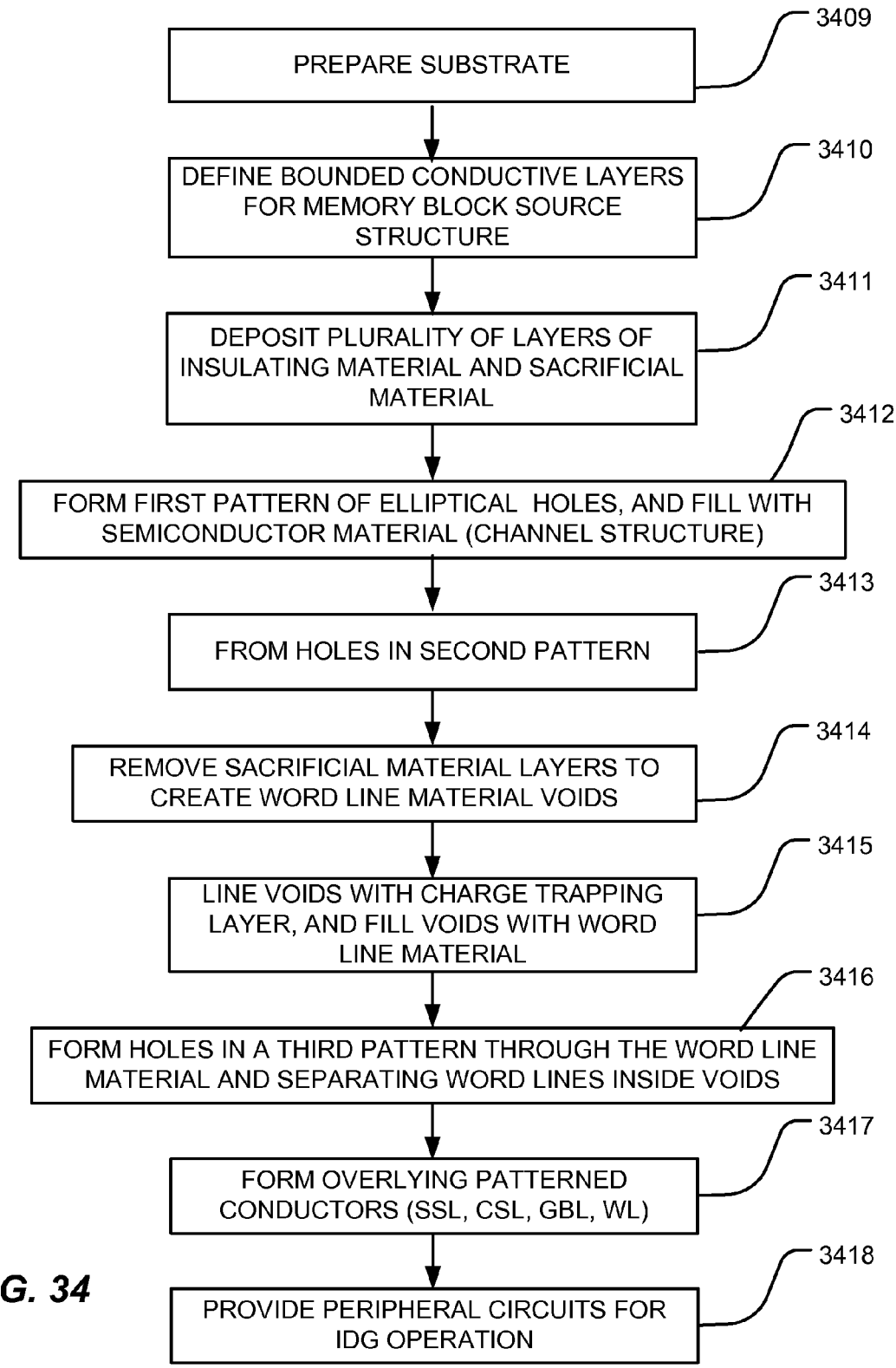
FIG. 34 is a simplified flow diagram of a manufacturing process described for a gate-replacement process.

FIG. 34 is a flow chart illustrating a method for manufacturing a memory device like that described with reference to FIGS. 23 to 33. The method includes identifying areas on a substrate for formation of 3D memory blocks having a structure like that of FIG. 15. The flowchart begins with preparing a substrate for formation of the three-dimensional vertical channel NAND array (3409). This process can include forming an insulating layer over a semiconductor substrate, or other isolation structure, in the region of the memory array. A set of bounded conductor layers is then formed on the prepared substrate to provide common source structures for blocks of the array (3410).

Alternating layers of insulating material and layers of sacrificial material are then formed over the bounded conductive layers (3411). The layers of sacrificial material are separated by layers of insulating material, and are used for formation of the voids in which word line conductor structures and string select line conductor structures can be formed.

A first pattern of holes, optionally elliptical, is etched through the stack of layers, and then the holes are filled with semiconductor material to form the vertical channel structures utilized in the array, as shown in FIGS. 26A-26B (3412). A second pattern of holes is etched through the stack of layers in the matter illustrated in FIGS. 27A-27B, which provide openings for removal of the sacrificial material layers (3413).

Then, the sacrificial material in the layers between the layers of insulating material are removed as illustrated in FIG. 28, to form word line voids (3414). The process then includes lining the voids with charge trapping layers, as described with reference to FIGS. 29A and 29B, and then filling the word line voids and the holes in the second with word line material such as tungsten or other conductive materials as illustrated in FIG. 30 (3415). The process also includes applying a third hole etch process through the word line material nominally in the same position as the holes of the second hole etch, and etching a top layer of word line conductor material according to a string select line pattern, such as the patterns illustrated in FIGS. 31 and 44, respectively (3416). Connections can be made to the ground select line structure using interlayer connectors, adjacent to each block of the memory array.

Overlying patterned conductors are formed over the memory area on the substrate, including global bit lines, common source lines, word lines, and string select lines using one or more patterned conductor layers as shown in FIG. 32 (3417). Also, peripheral circuits are provided on the substrate, typically outside of the memory area, which include bit line circuitry, source line bias circuitry, word line circuitry, page buffers, sense amplifiers and the like (3418). Back-end-of-line operations are completed to form a packaged integrated circuit.

Figure 35:
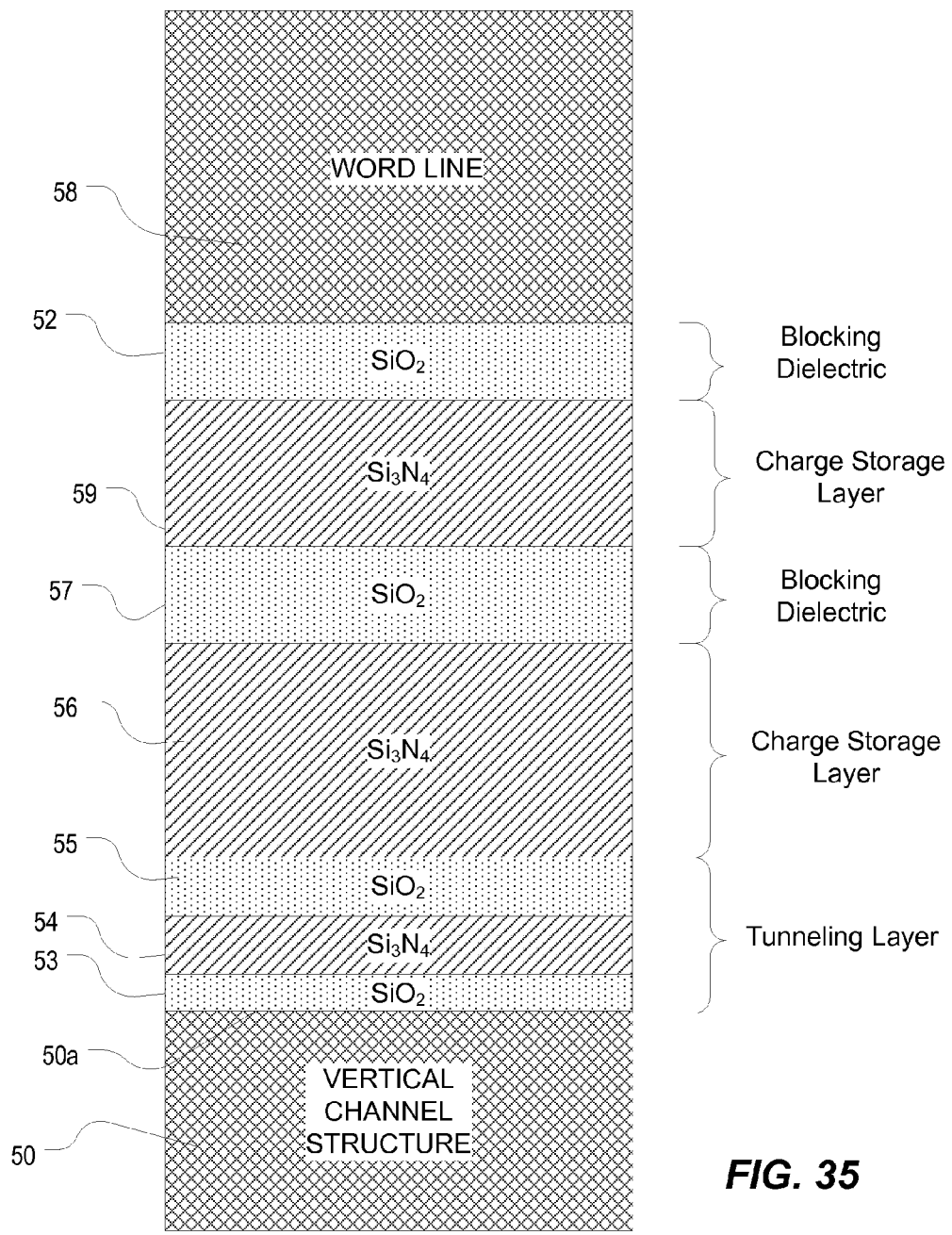
FIG. 35 illustrates a dielectric charge storage structure usable in memory devices as described herein.

FIG. 35 is a simplified diagram of an improved BE-SONOS dielectric charge storage layer that can be utilized in the structure described herein, to improve performance for independent double gate, multiple-bit-per-cell operations.

The dielectric charge trapping structure includes a tunneling layer in contact with the vertical channel structure 50, comprises a composite of materials, includes multiple layers, including a first tunneling layer 53 of silicon oxide, a tunneling layer 54 of silicon nitride, and a second tunneling layer 55 of silicon oxide.

The first tunneling layer 53 of silicon dioxide on the surface 50a of the channel structure 50 is formed for example using in-situ steam generation ISSG with optional nitridation by either a post deposition NO anneal or by addition of NO to the ambient during deposition. The thickness of the first layer 53 of silicon dioxide is less than 20 Å, and preferably 7-15 Å. The first tunneling layer 53 can be engineered with alternatives such as nitrided oxide for improved endurance, and/or fluorine treatments for improved interface state quality.

The tunneling layer of silicon nitride 54, also referred to as a tunneling nitride layer, lies on the first layer 53 of silicon oxide formed for example using low-pressure chemical vapor deposition LPCVD, using for example dichlorosilane DCS and NH$_3$ precursors at 680 degrees C. In alternative processes, the tunneling nitride layer comprises silicon oxynitride, made using a similar process with an N$_2$O precursor. The thickness of the layer 54 of silicon nitride is less than 30 Å, and preferably 10-30 Å, including for example 20 Å. Because of its thinness, layer 54 is poor at storing charge.

Layer 54 provides a low hole barrier height to facilitate hole injection for —FN erasing. However, layer 54 has a low trapping efficiency. Various materials for layer 54, along with their valence band offsets with silicon are: SiO$_2$ 4.4 eV, Si$_3$N$_4$ 1.8 eV, Ta$_2$O$_5$ 3.0 eV, BaTiO$_3$ 2.3 eV, BaZrO$_3$ 3.4 eV, ZrO$_2$ 3.3 eV, HfO$_2$ 3.4 eV, Al$_2$O$_3$ 4.9 eV, Y$_2$O$_3$ 3.6 eV, ZrSiO$_4$ 3.4 eV. Si$_3$N$_4$ has the lowest hole barrier height with 1.8 eV, although other materials are possible.

The second tunneling layer 55 of silicon dioxide lies on the tunneling layer 54 of silicon nitride and is formed for example using LPCVD high temperature oxide HTO deposition. The thickness of the second tunneling layer 55 of silicon dioxide is less than 45 Å, and preferably 15-45 Å, for example 30 Å. The second tunneling layer 55 provides sufficient barrier thickness to block charge loss for improved charge retention. The second tunneling layer 55 blocks direct tunneling leakage. Other low leakage oxides such as Al$_2$O$_3$ are possible.

A first charge storage layer 56 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride (Si$_x$O$_y$N$_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006. High charge trapping efficiency alternatives are oxynitride, silicon-rich nitride, embedded nanoparticles, and HfO2.

A first blocking layer 57 of silicon dioxide lies on the first charge storage layer 56 and is formed for example using LPCVD high temperature oxide HTO deposition. The thickness of the first blocking layer 57 of silicon dioxide is less than 70 Å, including for example a range of 35-70 Å, including for example 50 Å. The first blocking layer 57 provides sufficient barrier thickness to block charge mixing and charge transport between the charge storage layers 56 and 59. Other low leakage oxides such as Al$_2$O$_3$ are possible.

A second charge storage layer 59 in this embodiment comprises silicon nitride having a thickness greater than 30 Å, including for example a range of 30-60 Å, including for example about 40 Å in this embodiment formed for example using LPCVD. Other embodiments are similar to the first charge trapping layer. The second charge storage layer 59 traps electrons during —FN erasing to stop gate electron injection, allowing continuous erase of first charge storage layer 56 by channel hole injection. High charge trapping efficiency alternatives are oxynitride, silicon-rich nitride, embedded nanoparticles, and HfO$_2$.

A second blocking layer 52 of silicon dioxide lies on the second charge storage layer 59 and is formed for example using LPCVD high temperature oxide HTO deposition. The thickness of the second blocking layer 52 of silicon dioxide is less than 60 Å, including for example a range of 30-60 Å, including for example 35 Å.

Finally, a layer 58 of gate material is formed on the second blocking layer 52.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   first and second multilayer stacks of conductive strips;
   a plurality of active pillars between the first and second stacks, each active pillar comprising a vertical channel structure, a charge storage layer and an insulating layer, the insulating layer in a frustum of an active pillar contacting a first edge of a first conductive strip in a layer of the first stack and a second edge of a second conductive strip in a same layer of the second stack;
   isolation pillars separating adjacent active pillars between the first and second stacks, wherein the isolation pillars contact the adjacent active pillars along arcuate edges;
   a bounded conductive layer configured as a common source of reference potential, below and in electrical communication with the plurality of active pillars; and
   a source line conductor over the first and second stacks, and an interlayer connector adjacent the first and second stacks, and connecting the source line conductor to the bounded conductive layer below the first and second stacks.

2. The memory device of claim 1, wherein a cross section of the active pillar in the at least one frustum is generally elliptical with a major axis and a minor axis, the major axis being generally parallel with the first and second conductive strips.

3. The memory device of claim 2, wherein the major axis of the elliptical cross section is substantially longer than the minor axis.

4. The memory device of claim 1, including:
   linking elements over the stacks connecting respective active pillars in the plurality of active pillars to bit line circuitry.

5. The memory device of claim 1, including:
   string select switches at a top frustum of the active pillars, and source line bias circuitry coupled to the bounded conductive layer on a substrate.

6. The memory device of claim 1, wherein the conductive strips in the first and second multilayer stacks of conductive strips comprise a metal.

7. The memory device of claim 1, including circuitry to store multiple bits of data in cells at cross points of the first and second conductive strips in the same layer with the plurality of the active pillars.

8. The memory device of claim 1, further comprising:
   word line driver circuits configured for independent biasing of the conductive strips in the first and second multilayer stacks of conductive strips.

9. The memory device of claim 1, further comprising:
   a first multilayer stack of landing pad elements, the landing pad elements in the first multilayer stack connected to conductive strips in corresponding layers of the first multilayer stack of conductive strips; and
   a second multilayer stack of landing pad elements, the landing pad elements in the second multilayer stack connected to conductive strips in corresponding layers of the second multilayer stack of conductive strips; and word line driver circuits connected to the first and second conductive strips via landing pad elements in the first and second multilayer stacks of landing pad elements, wherein the plurality of active pillars is disposed between the first multilayer stack of landing pad elements and the second multilayer stack of landing pad elements.

10. The memory device of claim 1, wherein the vertical channel structure has a central seam.

11. A memory device, comprising:
a plurality of word line layers, a word line layer in the plurality including a first word line structure comprising a first landing pad element and a plurality of even word lines extending away from the first landing pad element, and a second word line structure comprising a second landing pad element and a plurality of odd word lines extending away from the second landing pad element and interdigitated with the plurality of even word lines;
a plurality of rows of active pillars and insulating pillars extending through the plurality of word line layers, the rows in the plurality disposed between corresponding even word lines and odd word lines, the active pillars in a row in the plurality of rows comprising respectively a vertical channel structure, a charge storage layer and an outside insulating layer; the insulating pillars in the row separating the even and odd word lines between the active pillars; and
a bounded conductive layer configured as a common source of reference potential for the plurality of rows of active pillars, below and in electrical communication with the active pillars in the plurality of rows of active pillars.

12. The memory device of claim 11, including:
string select switches at top frustums of the active pillars in the plurality of rows, ground select switches at bottom frustums of the active pillars in the plurality of rows, and source line bias circuitry coupled to the bounded conductive layer.

13. The memory device of claim 11, including:
a source line conductor over the plurality of word line layers, and an interlayer connector adjacent the plurality of word line layers, and connecting the source line conductor to the bounded conductive layer below the plurality of layers.

14. The memory device of claim 11, including circuitry to store multiple bits of data in cells at cross points of the even and odd word lines with the active pillars in a row of active pillars.

15. The memory device of claim 11, wherein a cross section of the active pillar in a frustum is arranged so that an average radius of curvature of on sides adjacent the word lines is greater than an average radius of curvature of the frustum adjacent the insulating pillar at the same layer.

16. The memory device of claim 11, including:
global bit lines connecting respective columns of active pillars in the plurality of rows to a page buffer.

17. The memory device of claim 11, further comprising:
word line driver circuits configured for independent biasing of the first and second word line structures in the plurality of layers.

18. The memory device of claim 11, wherein the vertical channel structure has a central seam.

* * * * *